United States Patent
Sasaki et al.

(10) Patent No.: US 11,784,245 B2
(45) Date of Patent: Oct. 10, 2023

(54) SEMICONDUCTOR DEVICE

(71) Applicant: Murata Manufacturing Co., Ltd., Kyoto-fu (JP)

(72) Inventors: Kenji Sasaki, Nagaokakyo (JP); Yasunari Umemoto, Nagaokakyo (JP); Shigeki Koya, Nagaokakyo (JP); Shinnosuke Takahashi, Nagaokakyo (JP); Masao Kondo, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 641 days.

(21) Appl. No.: 17/002,618

(22) Filed: Aug. 25, 2020

(65) Prior Publication Data

US 2021/0083080 A1    Mar. 18, 2021

(30) Foreign Application Priority Data

Sep. 18, 2019    (JP) .................. 2019-169765

(51) Int. Cl.
*H01L 29/737* (2006.01)
*H01L 29/06* (2006.01)
(Continued)

(52) U.S. Cl.
CPC ...... *H01L 29/7371* (2013.01); *H01L 23/5286* (2013.01); *H01L 24/13* (2013.01); *H01L 27/0229* (2013.01); *H01L 29/0692* (2013.01); *H01L 29/0826* (2013.01); *H01L 29/205* (2013.01); *H01L 29/41708* (2013.01); *H03K 17/602* (2013.01); *H03F 3/189* (2013.01); *H03F 2200/222* (2013.01); *H03F 2200/318* (2013.01);
(Continued)

(58) Field of Classification Search
CPC ............ H01L 29/7371; H01L 23/5286; H01L 29/41708; H01L 29/0821; H01L 29/1004; H01L 29/42304; H01L 29/0817
See application file for complete search history.

(56) References Cited

U.S. PATENT DOCUMENTS

2006/0289896 A1    12/2006   Miyamoto et al.
2010/0133586 A1*   6/2010    Min .................... H01L 29/7371
                                                               438/320
2017/0271300 A1*   9/2017    Watanabe ......... H01L 29/66318

FOREIGN PATENT DOCUMENTS

JP    H08-203914 A    8/1996
JP    2007-012644 A   1/2007
(Continued)

*Primary Examiner* — Syed I Gheyas
(74) *Attorney, Agent, or Firm* — Studebaker & Brackett PC

(57) ABSTRACT

An electrically conductive sub-collector layer is provided in a surface layer portion of a substrate. A collector layer, a base layer, and an emitter layer are located within the sub-collector layer when viewed in plan. The collector layer is connected to the sub-collector layer. An emitter electrode and a base electrode are long in a first direction when viewed in plan. The emitter electrode overlaps the emitter layer. The base electrode and the emitter electrode are discretely located away from each other in a second direction orthogonal to the first direction. A collector electrode is located on one side in the second direction with respect to the emitter electrode and is not located on the other side when viewed in plan. A base line is connected to the base electrode in a manner so as to adjoin a portion other than longitudinal ends of the base electrode.

20 Claims, 46 Drawing Sheets

(51) Int. Cl.
*H01L 29/08* (2006.01)
*H01L 29/205* (2006.01)
*H01L 29/417* (2006.01)
*H01L 27/02* (2006.01)
*H01L 23/528* (2006.01)
*H03K 17/60* (2006.01)
*H01L 23/00* (2006.01)
*H03F 3/189* (2006.01)

(52) U.S. Cl.
CPC .. *H03F 2200/387* (2013.01); *H03F 2200/451* (2013.01)

(56) References Cited

FOREIGN PATENT DOCUMENTS

| JP | 2007-242727 A | 9/2007 |
| JP | 2016-103540 A | 6/2016 |

\* cited by examiner

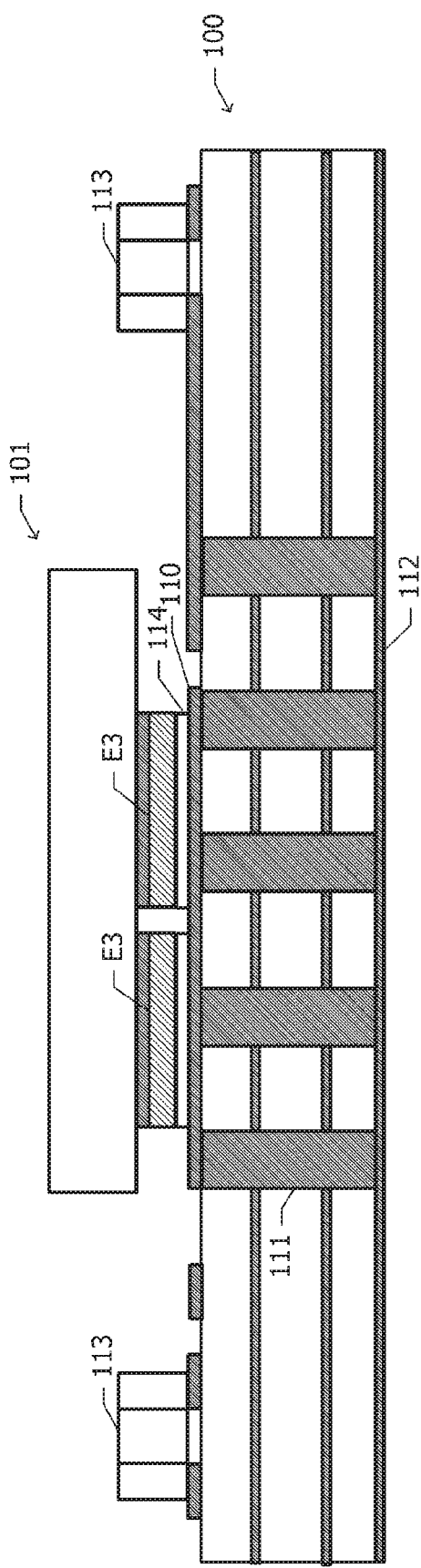

SEMICONDUCTOR DEVICE

CROSS-REFERENCE TO RELATED APPLICATION

This application claims benefit of priority to Japanese Patent Application No. 2019-169765, filed Sep. 18, 2019, the entire content of which is incorporated herein by reference.

BACKGROUND

Technical Field

The present disclosure relates to a semiconductor device including a bipolar transistor.

Background Art

As amplifying elements of transmission power amplifier circuits, heterojunction bipolar transistors (HBTs) are incorporated into mobile terminals or other apparatuses that use radio-frequency wireless communication. Japanese Unexamined Patent Application Publication No. 2007-242727 discloses a power amplifier HBT for high power output.

In the HBT disclosed in Japanese Unexamined Patent Application Publication No. 2007-242727, a collector electrode, a base electrode, an emitter electrode, a base electrode, an emitter electrode, a base electrode, and a collector electrode are arranged in the stated order in a direction orthogonal to long sides of an emitter of the HBT.

Although various techniques have been proposed to provide HBTs or other types of bipolar transistor with a large safe operating area (SOA) and high breakdown withstand voltage, there is a demand for a bipolar transistor with a larger SOA and higher breakdown withstand voltage.

SUMMARY

Accordingly, the present disclosure provides a semiconductor device that enables enlargement of an SOA and an increase in breakdown withstand voltage.

A semiconductor device according to an aspect of the present disclosure includes a sub-collector layer that is provided in a surface layer portion of a substrate and is electrically conductive, the sub-collector layer being surrounded by an insulating region when viewed in plan; and a bipolar transistor that is located within the sub-collector layer when viewed in plan, the bipolar transistor including a collector layer, a base layer, and an emitter layer that are arranged in a thickness direction in the sated order, the collector layer being connected to the sub-collector layer. The semiconductor device also includes an emitter electrode that is long in a first direction when viewed in plan, the emitter electrode overlapping the emitter layer and being electrically connected to the emitter layer; a base electrode that is long in the first direction when viewed in plan, the base electrode and the emitter electrode being discretely located away from each other in a second direction orthogonal to the first direction, the base electrode being electrically connected to the base layer; a collector electrode that is located on one side in the second direction with respect to the emitter electrode and is not located on the other side when viewed in plan, the collector electrode being electrically connected to the collector layer via the sub-collector layer; and a base line connected to the base electrode in a manner so as to adjoin a portion other than longitudinal ends of the base electrode.

Other features, elements, characteristics, and advantages of the present disclosure will become more apparent from the following detailed description of preferred embodiments of the present disclosure with reference to the attached drawings.

BRIEF DESCRIPTION OF THE DRAWINGS

FIG. 46 is a sectional view of the amplifier module according to the seventeenth example, illustrating the module substrate and the semiconductor device mounted thereon.

DETAILED DESCRIPTION

First Example

The following describes a semiconductor device according to a first example with reference to FIGS. 1 to 6.

Figure 1:
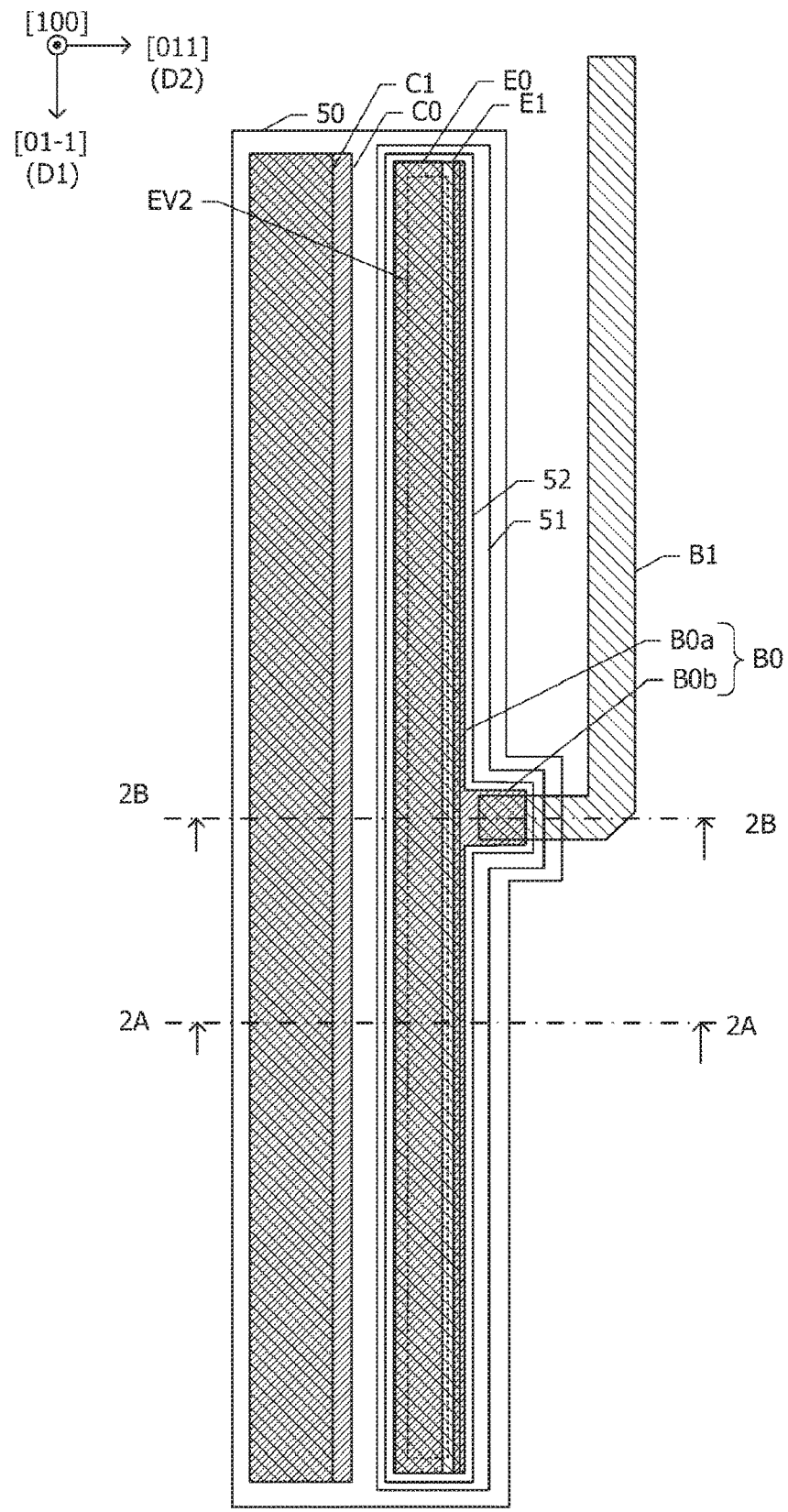
FIG. 1 illustrates a planar layout of constituent elements of a semiconductor device according to a first example.
Figure 2A:
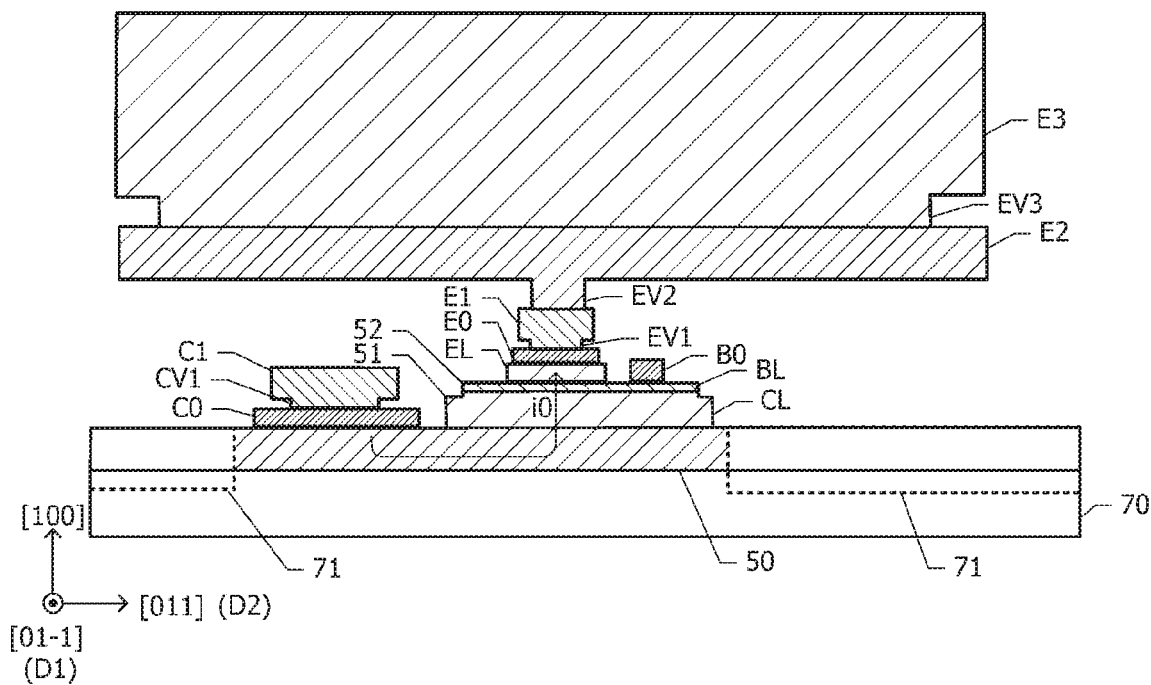
FIG. 2A is a sectional view of the semiconductor device taken along dash-dot line 2A-2A in FIG. 1.
Figure 2B:
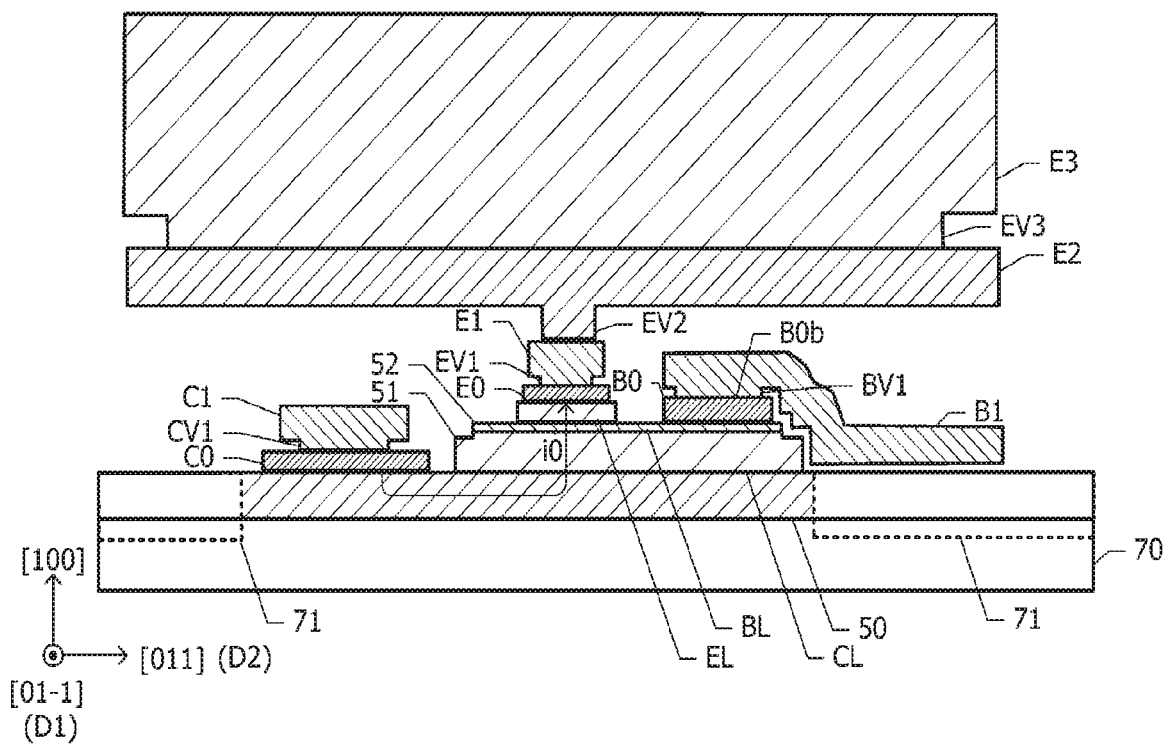
FIG. 2B is a sectional view of the semiconductor device taken along dash-dot line 2B-2B in FIG. 1.

FIG. 1 illustrates a planar layout of constituent elements of the semiconductor device according to the first example. FIGS. 2A and 2B are sectional views of the semiconductor device respectively taken along dash-dot line 2A-2A and dash-dot line 2B-2B in FIG. 1. FIGS. 2A and 2B are sectional views of the semiconductor device, illustrating constituent elements thereof with a focus on their positional relationship in the height direction. It should be noted that their positional relationship in the lateral direction does not fully correspond to the layout illustrated in FIG. 1.

The semiconductor device according to the first example includes a (100)GaAs substrate 70. A sub-collector layer 50, which is electrically conductive, is provided in a surface layer portion of the substrate 70 and is surrounded by an insulating region 71. The sub-collector layer 50 is formed from, for example, n-type GaAs epitaxially grown on the substrate 70. The insulating region 71 surrounding the sub-collector layer 50 is formed by implanting hydrogen ions (protons) into the n-type GaAs layer. A collector mesa 51, which is mesa-shaped, and a collector electrode C0 are located within the sub-collector layer 50 when viewed in plan.

When viewed in plan, the collector mesa 51 and the collector electrode C0 are long in the [01-1] direction of the substrate and are discretely located away from each other in the [011] direction. The minus sign in a Miller index is equivalent to an overbar added to a Miller index. The longitudinal direction of the collector mesa 51 and the collector electrode C0 is herein referred to as a first direction D1. A direction orthogonal to the first direction D1 in a surface of the substrate is herein referred to as a second direction D2.

A base mesa 52, which is mesa-shaped, is located within the collector mesa 51 when viewed in plan. The collector mesa 51 includes a collector layer CL, and the base mesa 52 includes a base layer BL, which is disposed on the collector layer CL. The collector mesa 51 is located within the sub-collector layer 50 and is closer to one side than to the other side of the sub-collector layer 50 in the second direction D2 when viewed in plan.

An emitter electrode E0 and a base electrode B0 are located within the base mesa 52 when viewed in plan. The emitter electrode E0 and the base electrode B0 are long in the first direction D1 when viewed in plan. The emitter electrode E0 and the base electrode B0 are discretely located away from each other in the second direction D2. An emitter layer EL is disposed between the emitter electrode E0 and the base layer BL. The emitter layer EL mostly overlaps the emitter electrode E0 when viewed in plan. The emitter layer EL is not explicitly illustrated in FIG. 1. The collector layer CL and the base layer BL are respectively formed from, for example, n-type GaAs and p-type GaAs. The emitter layer EL may include: an n-type InGaP layer; and an emitter cap layer and a contact layer that are disposed on or above the n-type InGaP layer. The emitter cap layer and the contact layer are respectively formed from, for example, n-type GaAs and n-type InGaAs, each of which is more highly concentrated than the constituent of the emitter layer EL. The collector layer CL, the base layer BL, and the emitter layer EL are arranged in the stated order from closest to the substrate 70 in the thickness direction of the substrate 70 to constitute a heterojunction bipolar transistor (HBT).

The base electrode B0 includes a main portion B0a and a connecting portion B0b (see FIG. 1). The main portion B0a extends in the first direction D1 and has a fixed width. The connecting portion B0b protrudes from a midsection of the main portion B0a toward one side in the second direction D2 (the right side in FIG. 1). The base mesa 52, the collector mesa 51, and the sub-collector layer 50 are designed to resemble the shape of the base electrode B0 viewed in plan and include protruding portions corresponding to the connecting portion B0b of the base electrode B0.

The collector electrode C0 is electrically connected to the collector layer CL via the sub-collector layer 50. The base electrode B0 is electrically connected to the base layer BL. The emitter electrode E0 is electrically connected to the emitter layer EL. The collector electrode C0, the emitter electrode E0, and the base electrode B0 are arranged in the stated order in the second direction D2. That is, the collector electrode C0 is located on one side in the second direction D2 with respect to the emitter electrode E0 and is not located on the other side when viewed in plan.

The collector electrode C0, the emitter electrode E0, and the base electrode B0 are covered with an insulating film (not illustrated). A first-layer collector line C1, a first-layer emitter line E1, and a first-layer base line B1 are disposed on the insulating film. Referring to FIG. 1, the collector electrode C0, the emitter electrode E0, and the base electrode B0 are densely hatched with lines slanting up from left to right, and the first-layer collector line C1, the first-layer emitter line E1, and the first-layer base line B1 are less densely hatched with lines slanting down from left to right.

The first-layer collector line C1 extends through a cavity CV1 in the insulating film disposed thereunder and is electrically connected to the collector electrode C0 accordingly. The first-layer emitter line E1 extends through a cavity EV1 in the insulating film disposed thereunder and is electrically connected to the emitter electrode E0 accordingly. The first-layer base line B1 extends through a cavity BV1 in the insulating film disposed thereunder and is electrically connected to the connecting portion B0b of the base electrode B0 accordingly. When viewed in plan, the first-layer base line B1 overlapping the connecting portion B0b of the base electrode B0 extends in the second direction D2 beyond an edge of the sub-collector layer 50 and then bends at a right angle to extend in the first direction D1.

The first-layer collector line C1, the base line B1, and the emitter line E1 are covered with a second-layer insulating film (not illustrated). A second-layer emitter line E2 (see FIGS. 2A and 2B) is disposed on the insulating film. The second-layer emitter line E2 extends through a cavity EV2 in the insulating film disposed thereunder and is electrically connected to the first-layer emitter line E1 accordingly. In FIG. 1, the cavity EV2 is denoted by a broken line. A protective film (not illustrated) is disposed on the second-layer emitter line E2 and has a cavity EV3, which is provided for a bump. An emitter bump E3 is disposed so as to be in contact with the second-layer emitter line E2 in the cavity EV3. The emitter bump E3 slightly extends beyond the edge of the cavity EV3 when viewed in plan.

The following describes advantageous effects of the first example with reference to FIGS. 3 to 6.

Figure 3:
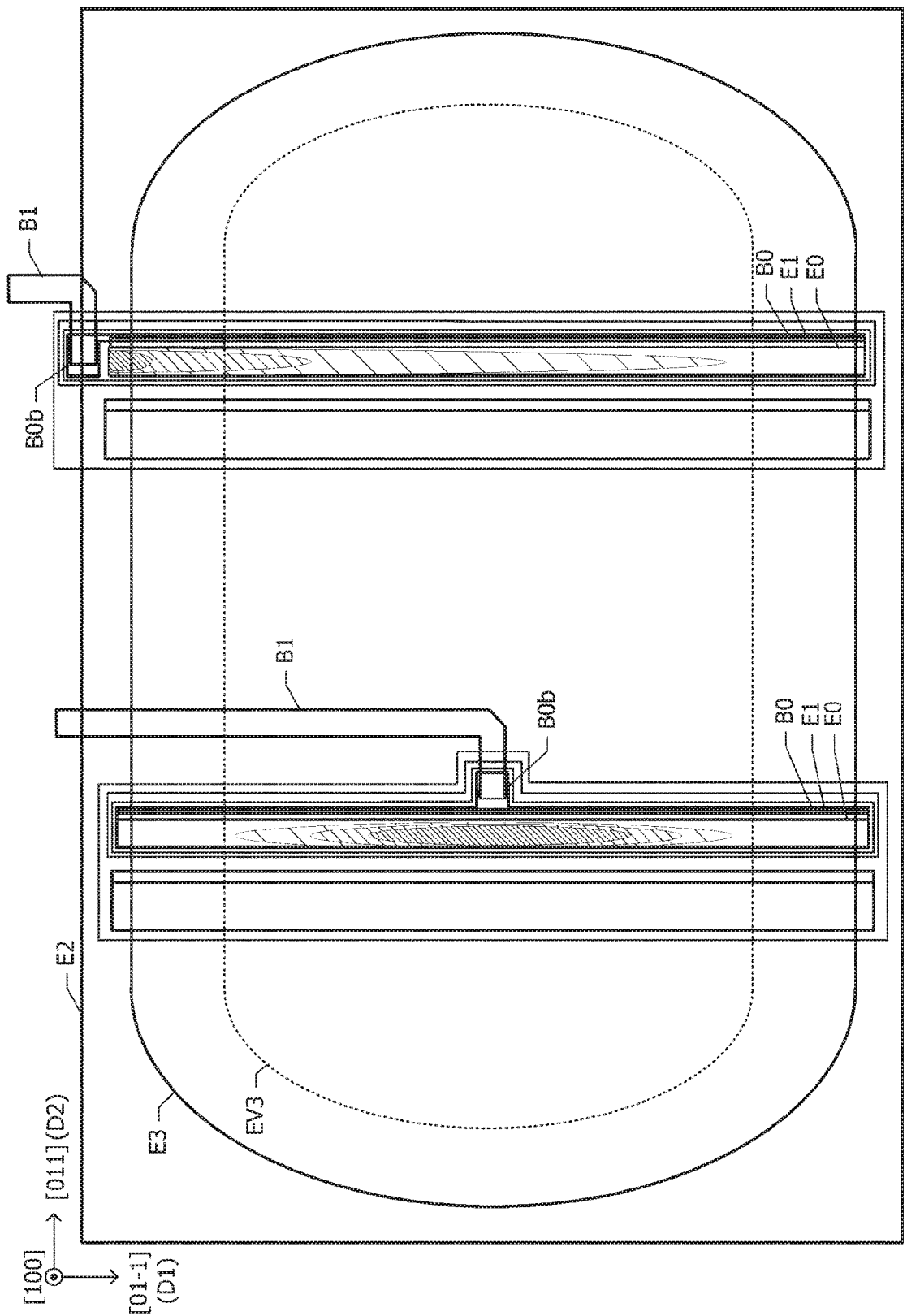
FIG. 3 illustrates a layout of the constituent elements of the semiconductor device according to the first example and a layout of constituent elements of a semiconductor device according to a comparative example, with the semiconductor devices being viewed in plan.

FIG. 3 illustrates a layout of constituent elements of the semiconductor device according to the first example and a layout of constituent elements of a semiconductor device according to a comparative example, with the semiconductor devices being viewed in plan. The semiconductor device according to the first example is illustrated on the left side of FIG. 3, and the semiconductor device according to the comparative example is illustrated on the right side of FIG. 3. As for the semiconductor device according to the first example, the connecting portion B0b is at the center of the base electrode B0 in the first direction D1. That is, the first-layer base line B1 is connected to the base electrode B0 in a manner so as to adjoin the longitudinal center of the base electrode B0. As for the semiconductor device according to the comparative example, the connecting portion B0b is provided as an end portion (at an upper end in FIG. 3) of the base electrode B0. That is, the first-layer base line B1 is connected to a longitudinal end portion of the base electrode B0.

The second-layer emitter line E2 is disposed in such a manner that the emitter electrode E0 is located within the second-layer emitter line E2 when viewed in plan. The emitter bump E3 is also located within the second-layer emitter line E2 when viewed in plan. The emitter bump E3 extends through the cavity EV3 and is connected to the second-layer emitter line E2 accordingly. The emitter electrode E0, the first-layer emitter line E1, the second-layer emitter line E2, the cavity EV3, and the emitter bump E3 are substantially symmetric with respect to the first direction D1.

When the transistor is active, operating current i0 (see FIGS. 2A and 2B) flows from the collector electrode C0 and passes through the sub-collector layer 50, the collector layer CL, the base layer BL, and the emitter layer EL. The operating current i0 then enters the emitter electrode E0. The operating current generates heat while flowing in the thickness direction through the emitter layer EL, the base layer BL, and the collector layer CL (see FIGS. 2A and 2B), which are located immediately below the emitter electrode E0. The heat is then transferred to the outside through the emitter electrode E0, the first-layer emitter line E1, the second-layer emitter line E2, and the emitter bump E3.

The operating current flowing through a joint interface between the base and the emitter is relatively great in magnitude at a point where the base resistance is relatively low. The base resistance is lower in the connecting portion B0b than in any other portion of the base electrode B0. A region farther from the connecting portion B0b in the first direction D1 has a higher base resistance. As for the semiconductor device according to the first example, the magnitude of the operating current is greater in the longitudinal center of the emitter electrode E0 than in any other region, and the same holds for the amount of heat generated. Referring to FIG. 3, regions in which a greater amount of heat is generated are more densely hatched. As for the semiconductor device according to the comparative example, the magnitude of the operating current is greater in a region including the upper end of the emitter electrode E0 than in any other region, and the same holds for the amount of heat generated.

With a heat transfer path extending from a heat generation region to an upper surface of the emitter bump E3, the thermal resistance is lower in a region including a midsection of the emitter bump E3 than in any other region in the first direction D1 and is higher in regions closer to ends of the emitter bump E3. In the first example, the thermal resistance is relatively low in a region in which the amount of heat generated is greater than the amount of heat generated in another region in the first direction D1. The temperature distribution in the first direction D1 is leveled accordingly. In the comparative example, meanwhile, the thermal resistance in a region including the upper end in which the amount of heat generated is greater than the amount of heat generated in any other region in the first direction D1 is higher than the thermal resistance in the region including the midsection. The temperature distribution thus tends to be uneven.

Figure 4A:
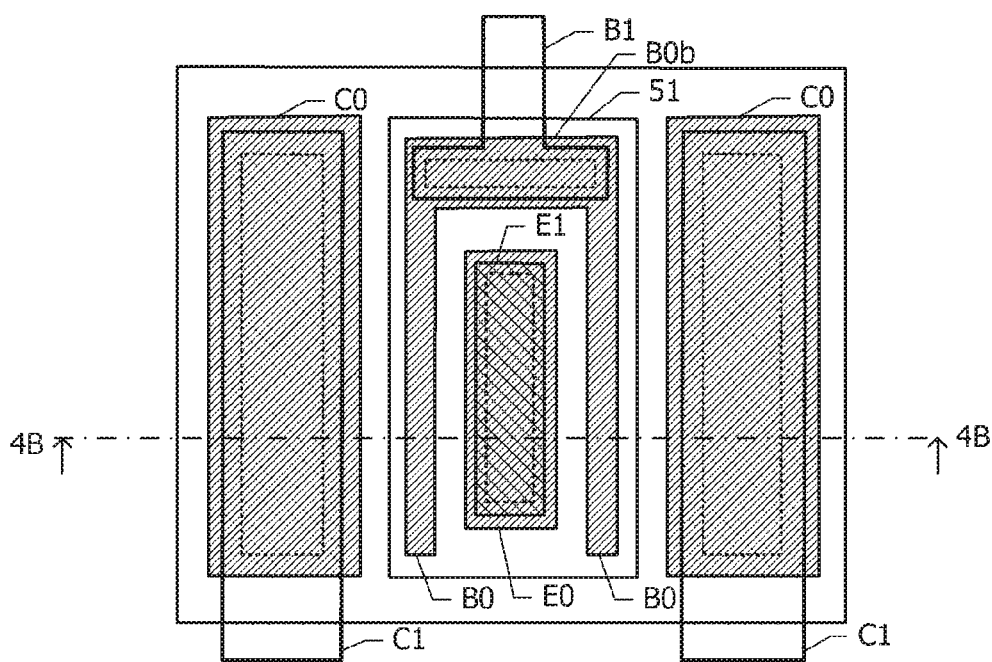
FIG. 4A illustrates a layout of constituent elements of a semiconductor device according to another comparative example for comparison with the first example, with the semiconductor device being viewed in plan.
Figure 4B:
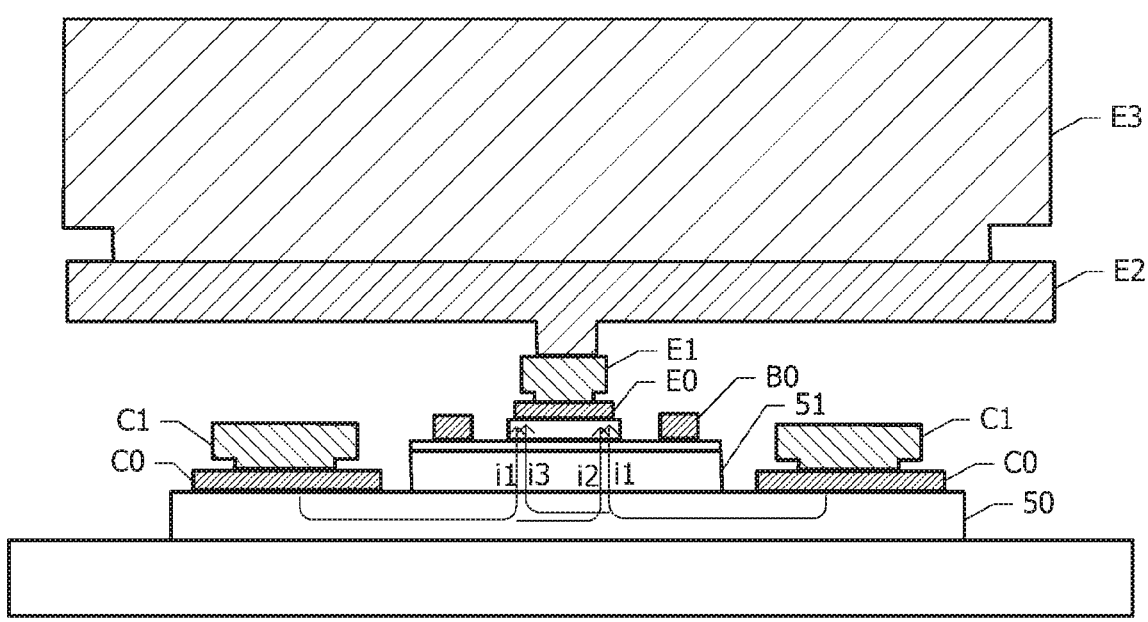
FIG. 4B is a sectional view of the semiconductor device taken along dash-dot line 4B-4B in FIG. 4A.

FIG. 4A illustrates a layout of constituent elements of a semiconductor device according to another comparative example, with the semiconductor device being viewed in plan. FIG. 4B is a sectional view of the semiconductor device taken along dash-dot line 4B-4B in FIG. 4A. In this comparative example, two base electrodes B0 are disposed on opposite sides in the second direction with respect to the emitter electrode E0. The base electrodes B0 disposed on the opposite sides with respect to the emitter electrode E0 are connected to each other in an end portion via the connecting portion B0b. The connecting portion B0b is connected with the first-layer base line B1. Two collector electrodes C0 are disposed on opposite sides in the second direction D2 with respect to the collector mesa 51.

The collector electrodes C0 are connected with corresponding first-layer collector lines C1, and the emitter electrode E0 is connected with the first-layer emitter line E1. The first-layer emitter line E1 is connected with the second-layer emitter line E2, and the emitter bump E3 is disposed on the second-layer emitter line E2.

When the transistor is active, operating current i1, which is denoted by arrows in FIG. 4B, flows from the collector electrode C0 on the left side and from the collector electrode C0 on the right side and passes through the sub-collector layer 50, the collector layer CL, the base layer BL, and the emitter layer EL. The operating current i1 then reaches a left end and a right end of the emitter electrode E0. Operating current i2 flows from the collector electrode C0 on the left side toward the right end of the emitter electrode E0, and operating current i3 flows from the collector electrode C0 on the right side toward the left end of the emitter electrode E0. The operating current i2 and the operating current i3 cancel each other if they have precise left-right symmetry in terms of electrical characteristics and thermal characteristics. If there is an imbalance between the right side and the left side, the operating current i2 and the operating current i3 do not cancel each other. In the heat generation region immediately below the emitter electrode E0, the amount of heat generated on the right side becomes out of proportion with the amount of heat generated on the left side.

Figure 5A:
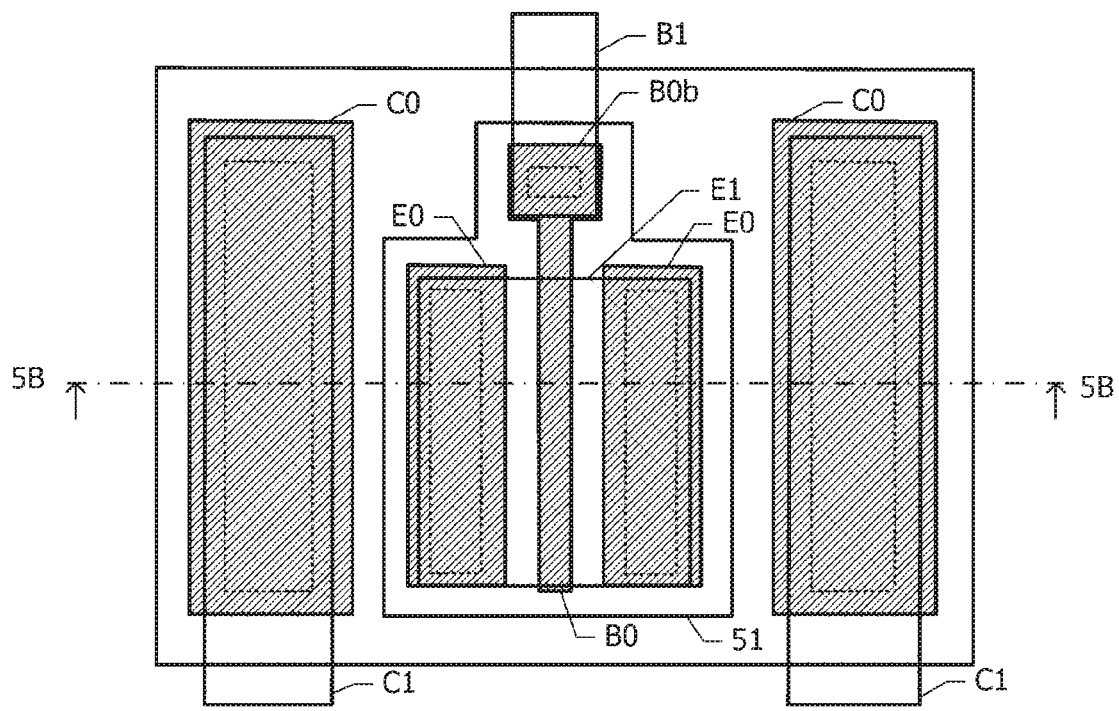
FIG. 5A illustrates a layout of constituent elements of a semiconductor device according to still another comparative example for comparison with the first example, with the semiconductor device being viewed in plan.
Figure 5B:
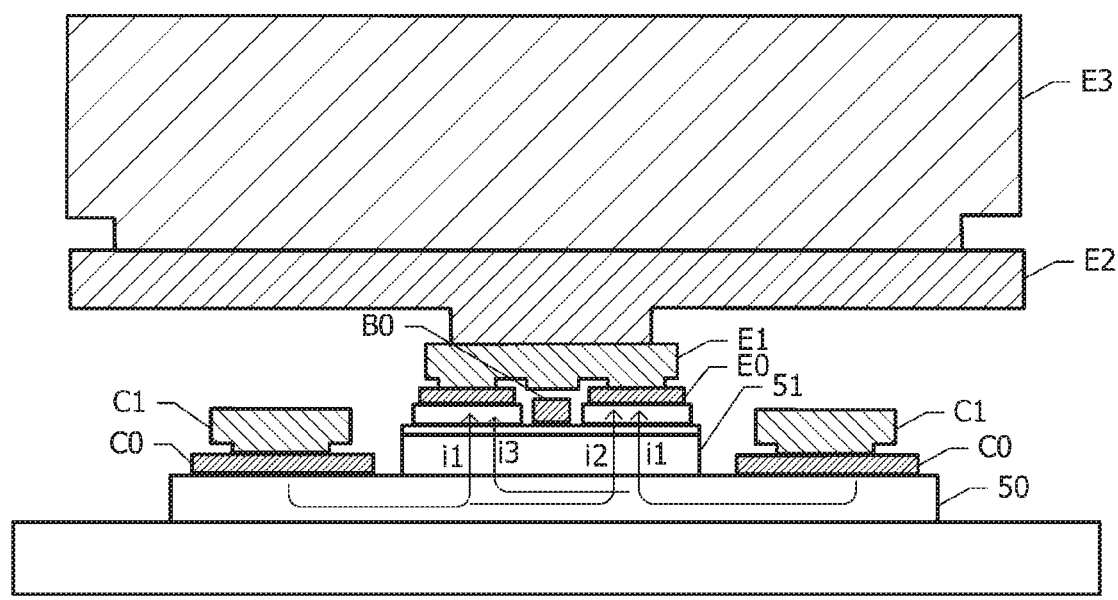
FIG. 5B is a sectional view of the semiconductor device taken along dash-dot line 5B-5B in FIG. 5A.

FIG. 5A illustrates a layout of constituent elements of a semiconductor device according to still another comparative example, with the semiconductor device being viewed in plan. FIG. 5B is a sectional view of the semiconductor device taken along dash-dot line 5B-5B in FIG. 5A. In this comparative example, two emitter electrodes E0 are discretely located away from each other in the second direction D2. The base electrode B0 is disposed between the two emitter electrodes E0. Two collector electrodes C0 are disposed on opposite sides in the second direction D2 with respect to the collector mesa 51.

When the transistor is active, the operating current i1, which is denoted by arrows in FIG. 5B, flows from the collector electrode C0 on the left side and from the collector electrode C0 on the right side and passes through the sub-collector layer 50, the collector layer CL, the base layer BL, and the emitter layer EL. The operating current i1 then reaches the emitter electrode E0 on the right side and the emitter electrode E0 on the left side. The operating current i2 flows from the collector electrode C0 on the left side toward the emitter electrode E0 on the right side, and the operating current i3 flows from the collector electrode C0 on the right side toward the emitter electrode E0 on the left side. The operating current i2 and the operating current i3 cancel each other if they have precise left-right symmetry in terms of electrical characteristics and thermal characteristics. If there is an imbalance between the right side and the left side, the operating current i2 and the operating current i3 do not cancel each other. The amount of heat generated in the heat generation region immediately below the emitter electrode E0 on the right side becomes out of proportion with the amount of heat generated in the heat generation region immediately below the emitter electrode E0 on the left side.

The imbalance between the amount of heat generated on the right side and the amount of heat generated on the left side in the transistors according to the comparative examples illustrated in FIGS. 4A to 5B causes higher concentrations of operating current in higher-temperature regions. Consequently, an increase in power consumption will eventually lead to a breakdown in some cases. Such an imbalance in the amount of heat generated is created by the operating current flowing both rightward and leftward in the second direction D2.

Unlike the semiconductor devices according to these comparative examples, the semiconductor device according to the first example (see FIGS. 2A and 2B) is configured in such a manner that the operating current i0 flowing from the collector electrode C0 toward the emitter electrode E0 is directed from only one side to the other side in the second direction D2 (from left to right in FIGS. 2A and 2B). This eliminates the need to balance the operating current flowing rightward in the second direction D2 and the operating current flowing leftward in the second direction D2. Thus, there is no cause for concern about such an imbalance in the amount of heat generated. Consequently, this configuration produces the effect of eliminating or reducing the possibility that the breakdown withstand voltage will be lowered due to concentration of generated heat in a particular spot.

The semiconductor device (a sample S0) according to the first example, the semiconductor device (a sample S4) according to the comparative example illustrated in FIGS.

4A and 4B, and the semiconductor device (a sample S5) according to the comparative example illustrated in FIGS. 5A and 5B were prepared. These samples were subjected to measurements of transition voltage at the SOA boundary and voltage at the breakdown boundary. The SOA herein refers to a collector voltage range and a collector current range in which a transistor can operate in a stable manner without self-damage. The transition voltage is defined as a collector voltage at which an SOA line, namely, an SOA boundary obtained by increasing the collector voltage, plummets in a graph that represents the relationship between the collector voltage and the collector current. The breakdown boundary herein refers to a boundary between a collector voltage range and a collector current range in which a breakdown (a short circuit or breaking of electrical contact) in a transistor is avoided.

Figure 6:
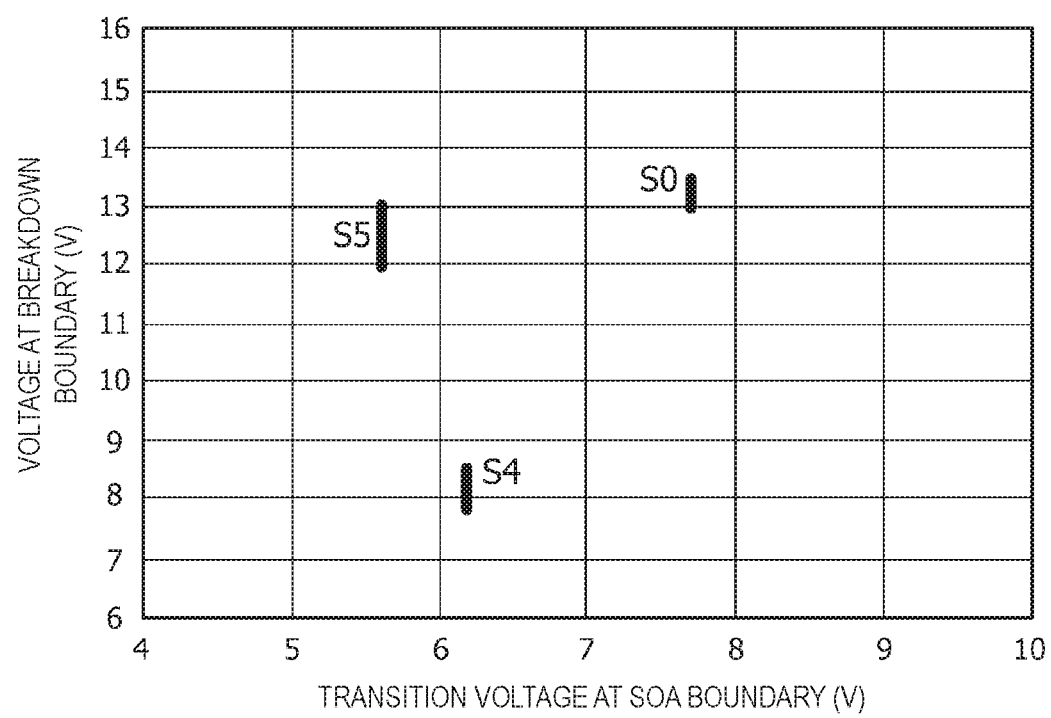
FIG. 6 is a graph obtained by measurements conducted on samples S0, S4, and S5, illustrating the relationship between transition voltage at the SOA boundary and voltage at the breakdown boundary.

FIG. 6 is a graph obtained by measurements conducted on the samples S0, S4, and S5, illustrating the relationship between transition voltage at the SOA boundary and voltage at the breakdown boundary. The horizontal axis represents the transition voltage at the SOA boundary in units of V, and the vertical axis represents the voltage at the breakdown boundary in units of V. The results show that the transition voltage at the SOA boundary and the voltage at the breakdown boundary are higher in the semiconductor device (the sample S0) according to the first example than in each of the semiconductor device (the sample S4) according to the comparative example illustrated in FIGS. 4A and 4B and the semiconductor device (the sample S5) according to the comparative example illustrated in FIGS. 5A and 5B. The semiconductor device according to the first example produces the advantageous effect of enlarging the SOA and increasing the breakdown withstand voltage to a greater extent than would be possible with the semiconductor devices according to the comparative examples illustrated in FIGS. 4A to 5B.

Figure 7:
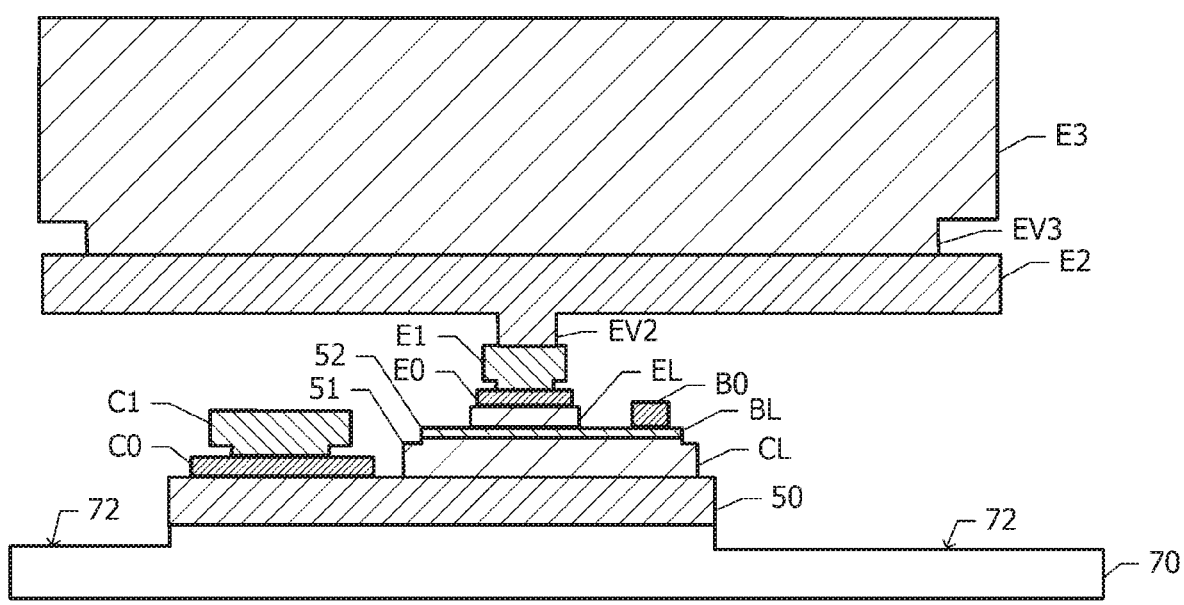
FIG. 7 is a sectional view of a semiconductor device according to a modification of the first example.

The following describes a semiconductor device according to a modification of the first example with reference to FIG. 7.

FIG. 7 is a sectional view of the semiconductor device according to the present modification of the first example. As for the semiconductor device according to the first example (see FIGS. 2A and 2B), the insulating region 71 formed by proton implantation defines the periphery of the sub-collector layer 50. In the modification illustrated in FIG. 7, both the n-type GaAs layer that is to be formed into the sub-collector layer 50 and the surface layer portion of the substrate 70 are etched to define the periphery of the sub-collector layer 50. An insulating film is disposed in a recessed portion 72, which is formed by the etching. The insulating film fitting in the recessed portion 72 formed by the etching serves as an insulating region, which surrounds the sub-collector layer 50 when viewed in plan.

Figure 8:
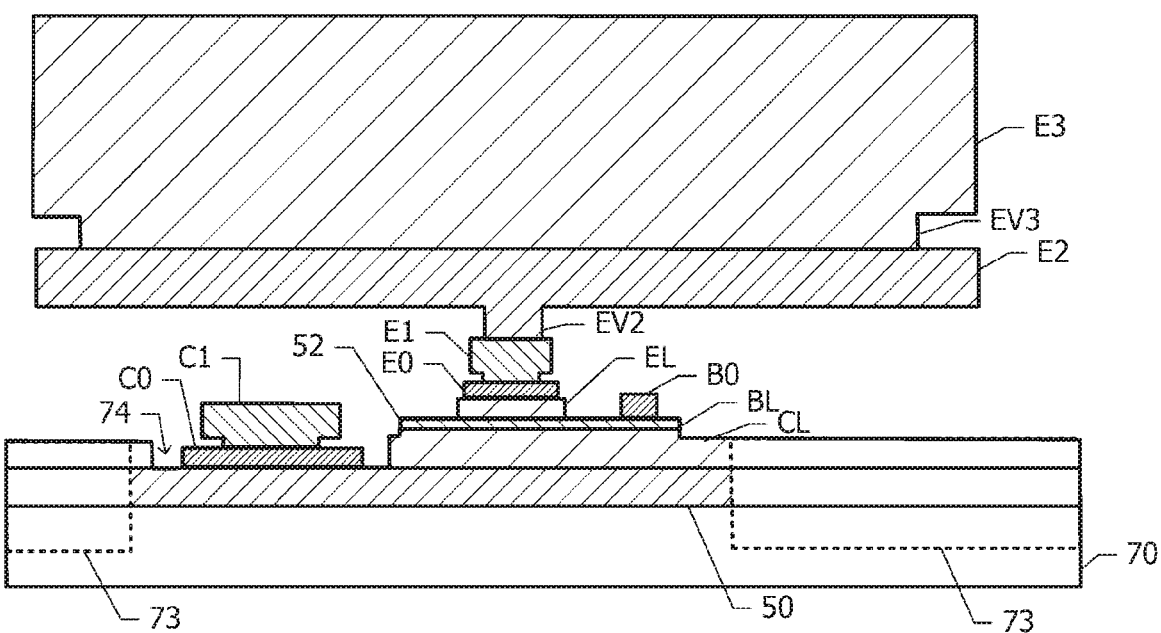
FIG. 8 is a sectional view of a semiconductor device according to another modification of the first example.

The following describes a semiconductor device according to another modification of the first example with reference to FIG. 8.

FIG. 8 is a sectional view of the semiconductor device according to the present modification of the first example. As for semiconductor device according to the first example (see FIGS. 2A and 2B), the collector mesa 51 formed by etching an n-type GaAs layer that is to be formed into the collector layer CL and by eliminating an unnecessary portion from the n-type GaAs layer defines the periphery of the collector layer CL. In the modification illustrated in FIG. 8, protons are implanted into an unnecessary portion of an n-type GaAs layer that is to be formed into the collector layer CL, and the unnecessary portion is thus formed into an insulating region 73, which defines part of the periphery of the collector layer CL. The insulating region 73 also defines the periphery of the sub-collector layer 50.

The n-type GaAs that is to be formed into the collector layer CL is etched to form a recessed portion 74 in a region in which the collector electrode C0 is to be disposed. The recessed portion 74 extends to the sub-collector layer 50. The collector electrode C0 is disposed so as to be in contact with the sub-collector layer 50 in the recessed portion 74. Part of the periphery of the collector layer CL is defined by the recessed portion 74. In the present modification, the collector layer CL whose periphery is defined by the insulating region 73 and the recessed portion 74 corresponds to the collector mesa 51 (see FIGS. 1, 2A, and 2B) in the first example.

The following describes other modifications of the first example.

It is not required that the connecting portion B0b of the base electrode B0 adjoin the midsection of the main portion B0a in the first direction D1 as in the first example (see FIG. 1). The connecting portion B0b may adjoin any portion other than end portions of the main portion B0a. That is, the base line B1 may be connected to the base electrode B0 in a manner so as to adjoin a portion other than the longitudinal ends of the base electrode B0. The temperature distribution in the heat generation region may be leveled to a greater extent than would be possible with the layout in the comparative example in FIG. 3, in which the connecting portion B0b adjoins the end portion of the main portion B0a. To ensure adequate leveling of temperature distribution, the connecting portion B0b is preferably disposed in such a manner that the distance in the first direction D1 between the center of the base electrode B0 in the first direction D1 and the connecting portion B0b (the point of connection between the base electrode B0 and the base line B1) is less than or equal to ¼ times the length of the base electrode B0.

In the first example, the collector layer CL is formed from n-type GaAs, the base layer BL is formed from p-type GaAs, and the emitter layer EL is formed mainly from n-type InGaP. Alternatively, other compound semiconductors may be used. The structure of the semiconductor device according to the first example is applicable not only to heterojunction bipolar transistors but also to other commonly-used bipolar transistors. Although one heterojunction bipolar transistor illustrated in FIGS. 1, 2A, and 2B is included in the semiconductor device described as the first example, more than one heterojunction bipolar transistor may be disposed on a substrate and may be connected in parallel to constitute an output-stage amplifier circuit. The heterojunction bipolar transistors are preferably arranged side by side in the second direction D2.

When viewed in plan (see FIG. 1), the base mesa 52 in the first example is smaller than the collector mesa 51 and is located within the collector mesa 51. As illustrated in the sectional views (FIGS. 2A and 2B), a step is formed along an edge of the base mesa 52. Alternatively, the base mesa 52 and the collector mesa 51 may fit exactly on top of each other when viewed in plan. In this case, the base layer BL and the collector layer CL are etched all at once for patterning. Consequently, each side face of the base layer BL and a corresponding side face of the collector layer CL extend in a continuous manner.

Second Example

Figure 9:
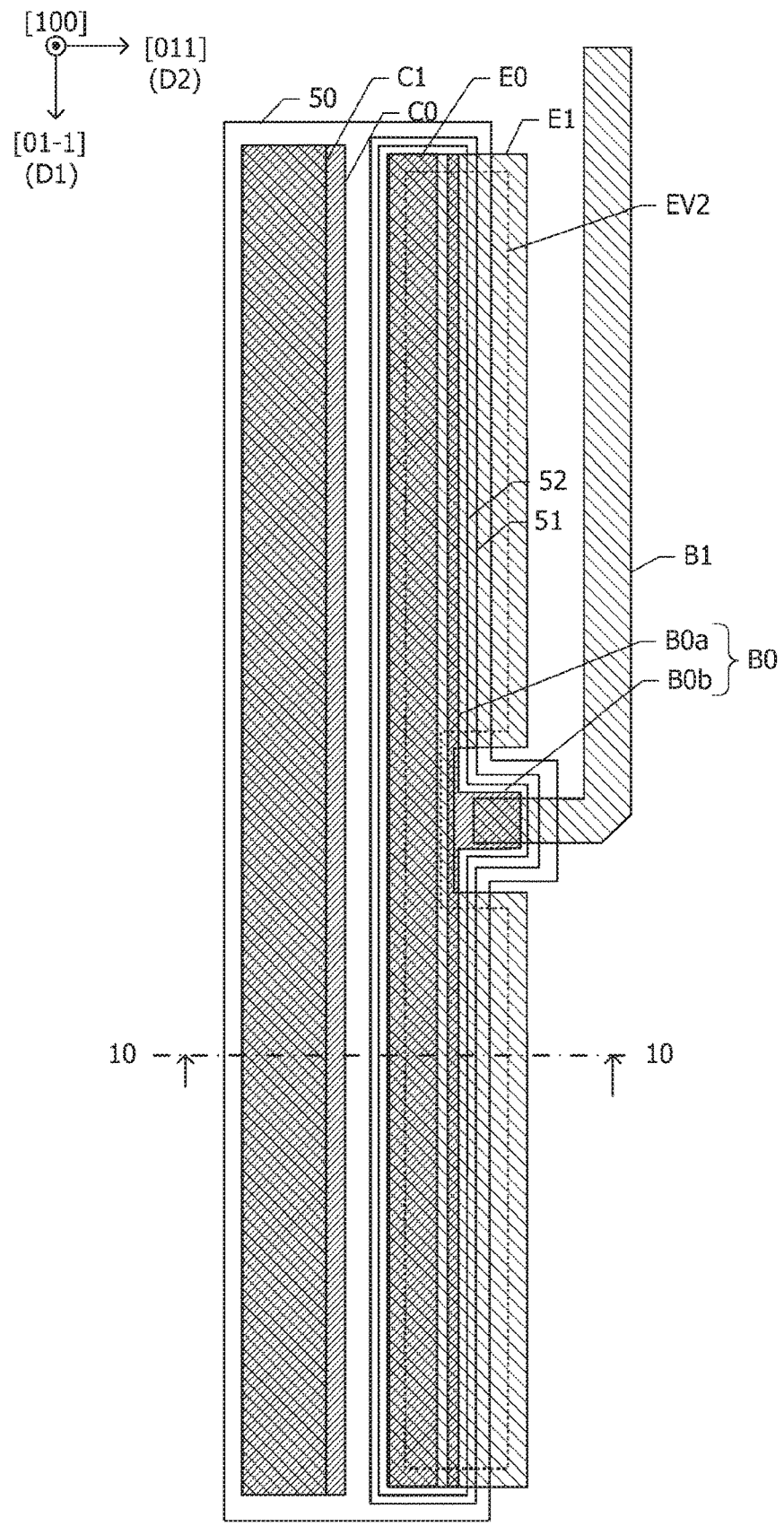
FIG. 9 illustrates a planar layout of constituent elements of a semiconductor device according to a second example.
Figure 10:
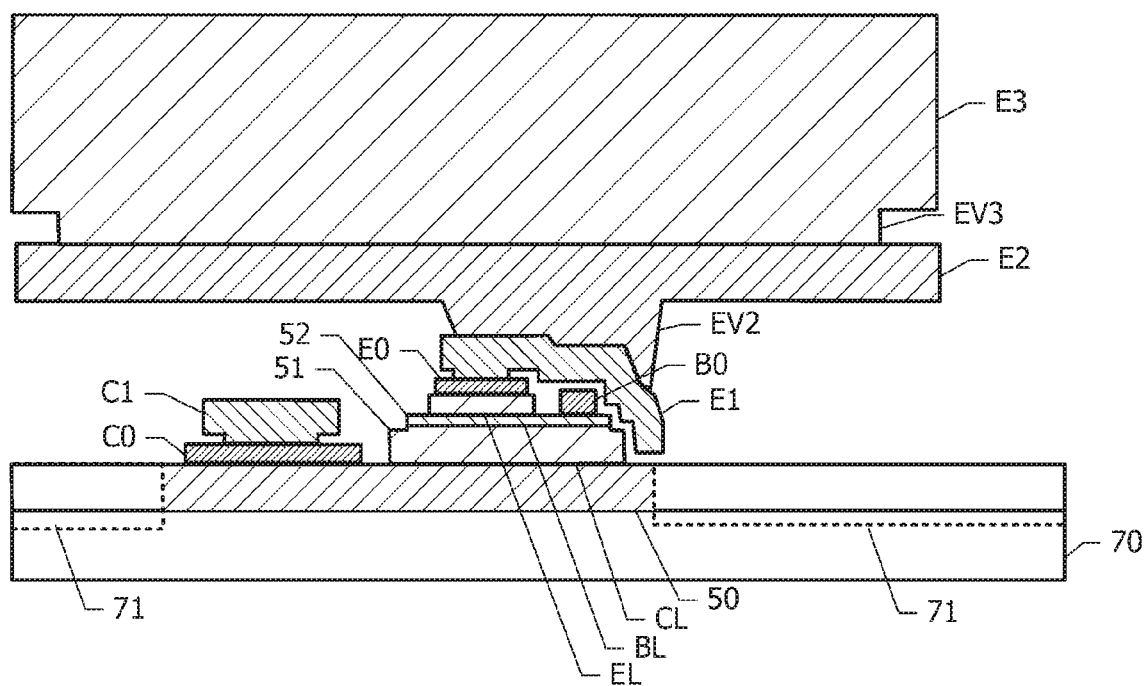
FIG. 10 is a sectional view of the semiconductor device taken along dash-dot line 10-10 in FIG. 9.

The following describes a semiconductor device according to a second example with reference to FIGS. 9 and 10.

Configurations common to the semiconductor device according to the first example (see FIGS. 1, 2A, and 2B) and the semiconductor device according to the second example will not be further elaborated here.

FIG. 9 illustrates a planar layout of constituent elements of the semiconductor device according to the second example. FIG. 10 is a sectional view of the semiconductor device taken along dash-dot line 10-10 in FIG. 9.

The first-layer emitter line E1 in the first example (see FIG. 1) is located within the base mesa 52 when viewed in plan. Meanwhile, the first-layer emitter line E1 in the second example extends from the position of the emitter electrode E0 to the side opposite to the side on which the collector electrode C0 is disposed. The first-layer emitter line E1 extends above the main portion B0a of the base electrode B0 and extends in the second direction D2 beyond the edge of the base mesa 52 and the edge of the collector mesa 51. The cavity EV2 for forming a connection between the first-layer emitter line E1 and the second-layer emitter line E2 also extends beyond the edge of the collector mesa 51 when viewed in plan. In the position of the connecting portion B0b of the base electrode B0, the first-layer emitter line E1 does not extend in the second direction D2 beyond the edge of the base mesa 52 and is located within the base mesa 52 so as not to interfere with the base line B1.

The following describes advantageous effects of the second example. As with the first example, the second example produces the advantageous effect of enlarging the SOA and increasing the breakdown withstand voltage. The cavity EV2 is provided to form a connection between the first-layer emitter line E1 and the second-layer emitter line E2. When viewed in plan, the cavity EV2 in the second example has an area greater than the area of the cavity EV2 in the first example. This configuration increases the cross-sectional area of the heat transfer path extending from the heat generation region of the bipolar transistor to the emitter bump E3 and reduces the thermal resistance in the heat transfer path accordingly. Consequently, the efficiency of heat transfer from the heat generation region may be enhanced.

Figure 11:
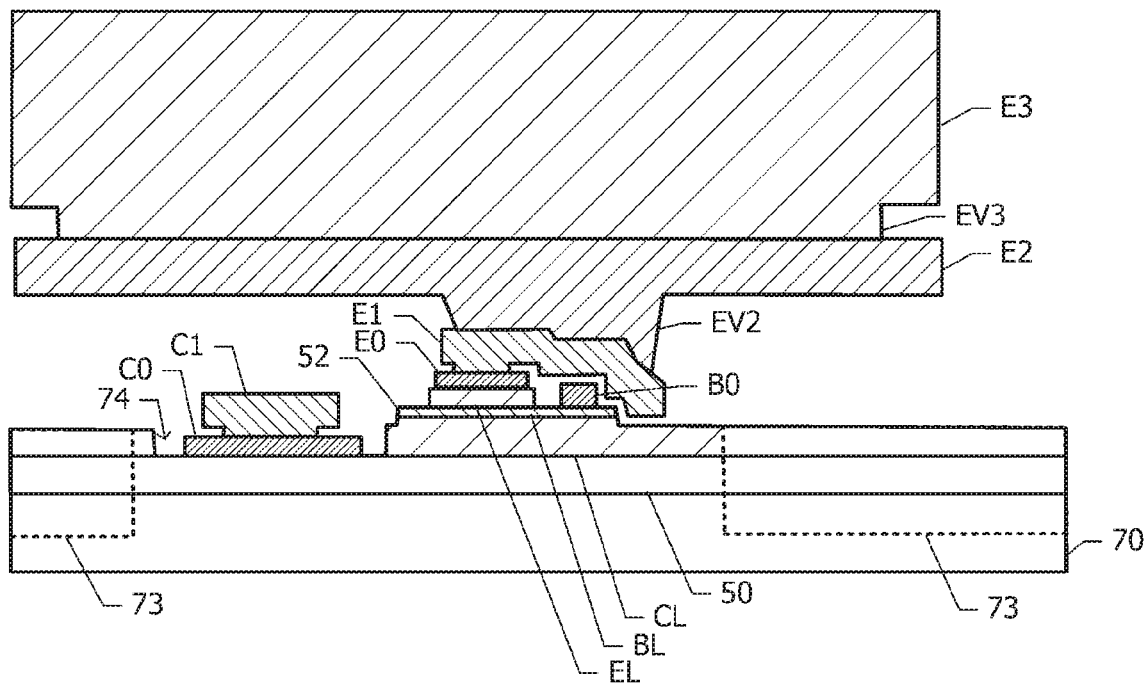
FIG. 11 is a sectional view of a semiconductor device according to a modification of the second example.

The following describes a modification of second example with reference to FIG. 11.

FIG. 11 is a sectional view of a semiconductor device according to the present modification of the second example. In the present modification, protons are implanted into an unnecessary portion of an n-type GaAs that is to be formed into the collector layer CL and the unnecessary portion is thus formed into the insulating region 73 as in the case with FIG. 8 illustrating one of the modifications of the first example. The first-layer emitter line E1 extends beyond the edge of the base mesa 52 and is located within the collector layer CL when viewed in plan. In the present modification, advantageous effects similar to those of second example may be attained. Alternatively, the insulating region 73 may be extended. With the insulating region 73 being closer to the base mesa 52, the first-layer emitter line E1 extends beyond the edge of the collector layer CL when viewed in plan.

Third Example

Figure 12:
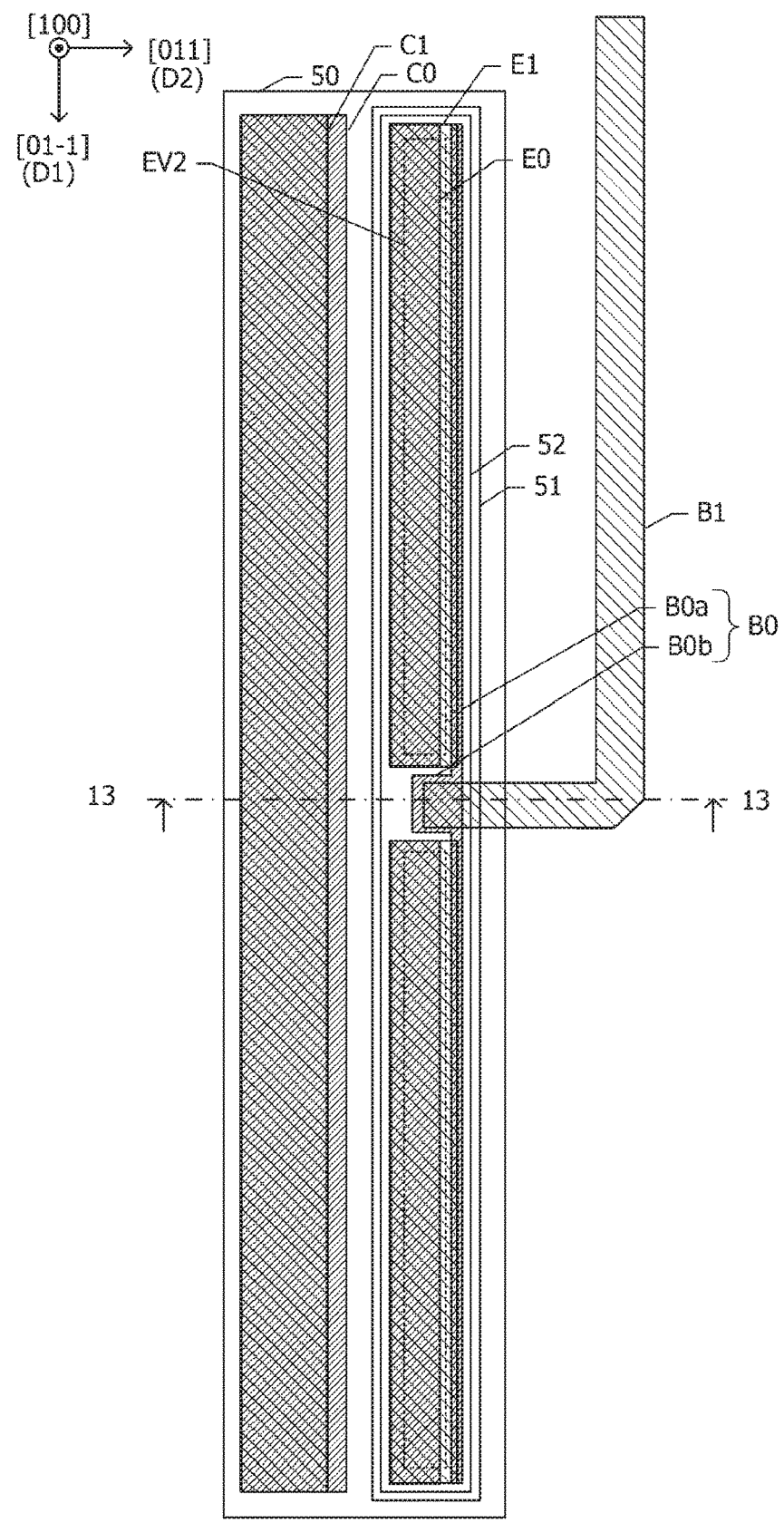
FIG. 12 illustrates a planar layout of constituent elements of a semiconductor device according to a third example.
Figure 13:
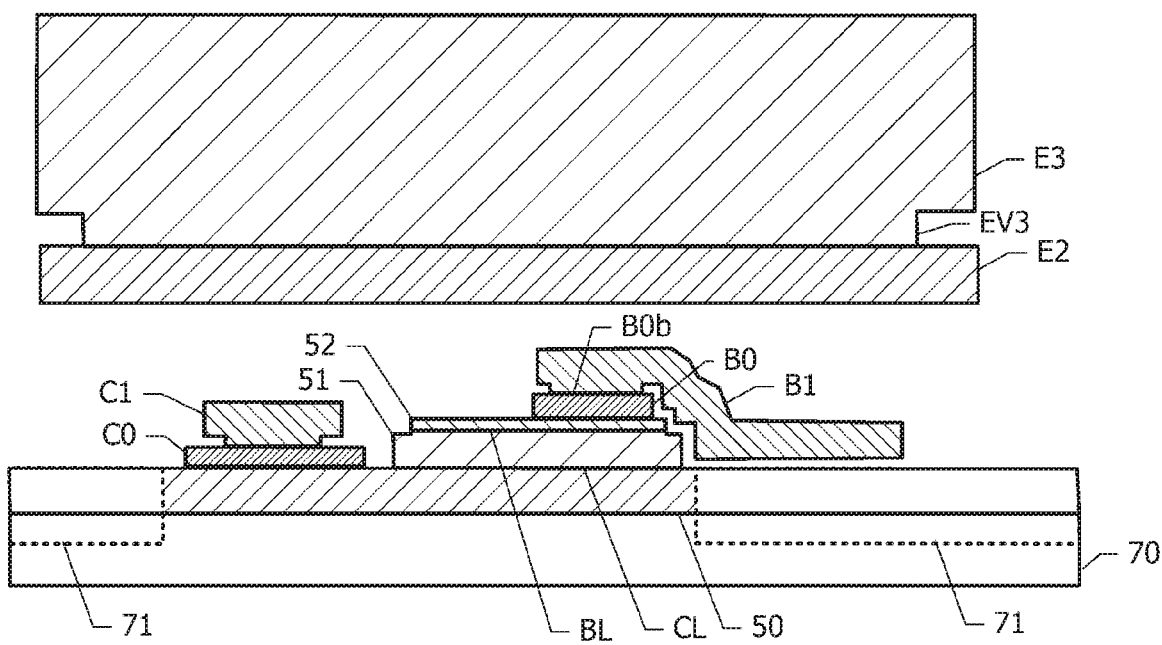
FIG. 13 is a sectional view of the semiconductor device taken along dash-dot line 13-13 in FIG. 12.

The following describes a semiconductor device according to a third example with reference to FIGS. 12 and 13. Configurations common to the semiconductor device according to the first example (see FIGS. 1, 2A, and 2B) and the semiconductor device according to the third example will not be further elaborated here.

FIG. 12 illustrates a planar layout of constituent elements of the semiconductor device according to the third example. FIG. 13 is a sectional view of the semiconductor device taken along dash-dot line 13-13 in FIG. 12.

The emitter electrode E0 in the first example (see FIG. 1) extends continuously from one end to the other end of base mesa 52 in the first direction D1. The emitter electrode E0 in the third example is divided, at about the center of the base mesa 52 in the first direction D1, into two sections. The connecting portion B0b of the base electrode B0 in the first example (see FIG. 1) protrudes from the main portion B0a toward the side opposite to the side on which the collector electrode C0 is disposed. The connecting portion B0b of the base electrode B0 in the third example protrudes from the main portion B0a toward the collector electrode C0. The connecting portion B0b is disposed between the two sections into which the emitter electrode E0 is divided. The connecting portion B0b is connected with the first-layer base line B1.

With the emitter electrode E0 being divided into two sections, the first-layer emitter line E1 is divided into two sections correspondingly. The two sections of the first-layer emitter line E1 are connected to each other via the second-layer emitter line E2 (see FIG. 13).

The following describes advantageous effects of the third example. As with the first example, the third example, in which the emitter electrode E0 is divided into two sections, produces the advantageous effect of enlarging the SOA and increasing the breakdown withstand voltage.

Fourth Example

Figure 14:
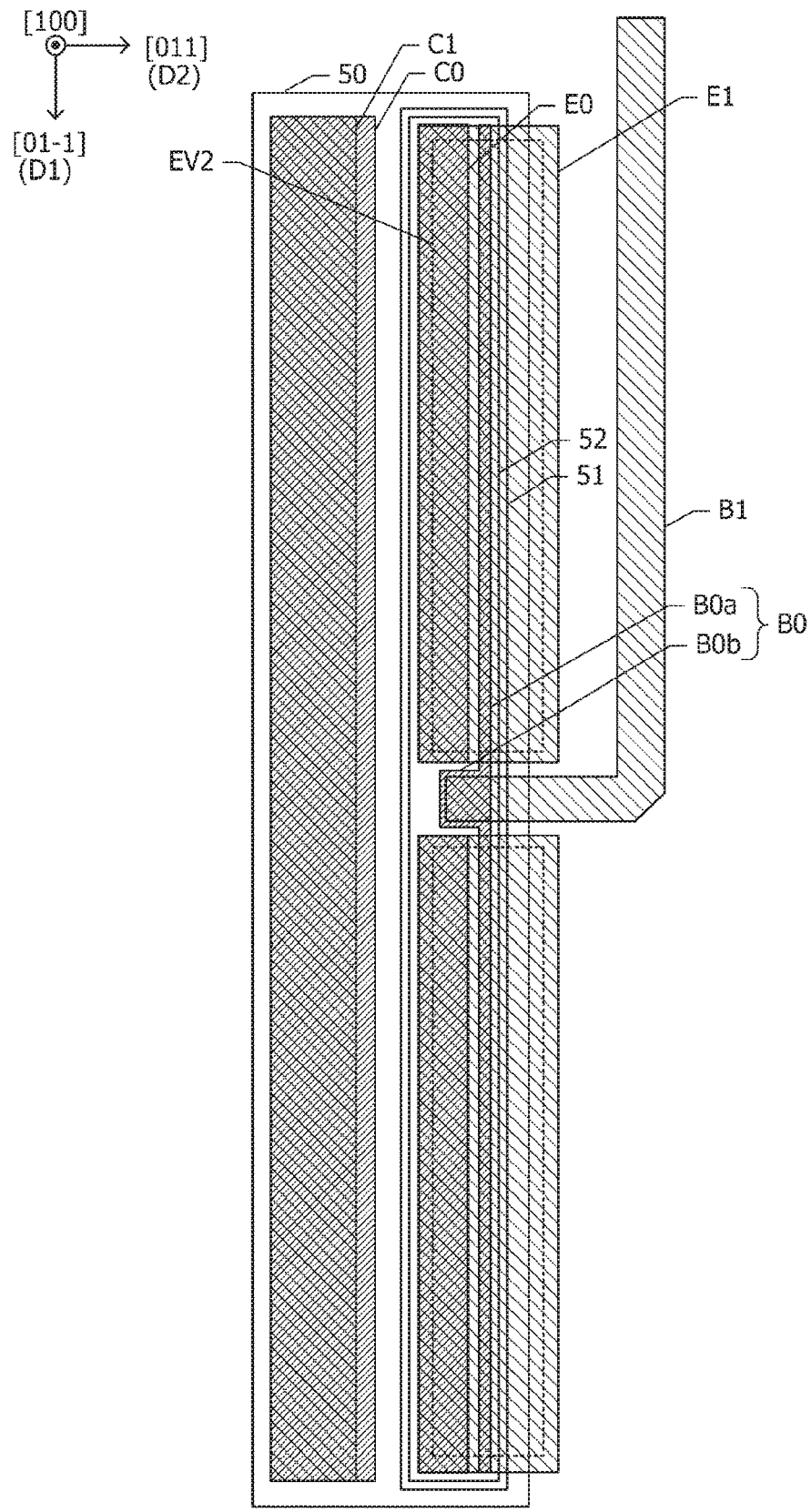
FIG. 14 illustrates a planar layout of constituent elements of a semiconductor device according to a fourth example.

The following describes a semiconductor device according to a fourth example with reference to FIG. 14. Configurations common to the semiconductor device according to the third example (see FIGS. 12 and 13) and the semiconductor device according to the fourth example will not be further elaborated here.

FIG. 14 illustrates a planar layout of constituent elements of the semiconductor device according to the fourth example. The two sections into which the first-layer emitter line E1 in the third example (see FIG. 12) is divided are located within the base mesa 52 when viewed in plan. Meanwhile, as with the first-layer emitter line E1 in the second example (see FIG. 9), two sections of the first-layer emitter line E1 in the fourth example extend from the position of the emitter electrode E0 to the side opposite to the side on which the collector electrode C0 is disposed. The two sections of the first-layer emitter line E1 extend above the main portion B0a of the base electrode B0 and extend in the second direction D2 beyond the edge of the base mesa 52 and the edge of the collector mesa 51. In the fourth example, the cavity EV2 for forming a connection between first-layer emitter line E1 and the second-layer emitter line E2 also extends beyond the edge of the collector mesa 51 when viewed in plan.

The following describes advantageous effects of the fourth example. As with the third example, the fourth example produces the advantageous effect of enlarging the SOA and increasing the breakdown withstand voltage. Furthermore, the efficiency of heat transfer from the heat generation region may be enhanced as in the second example.

Fifth Example

Figure 15:
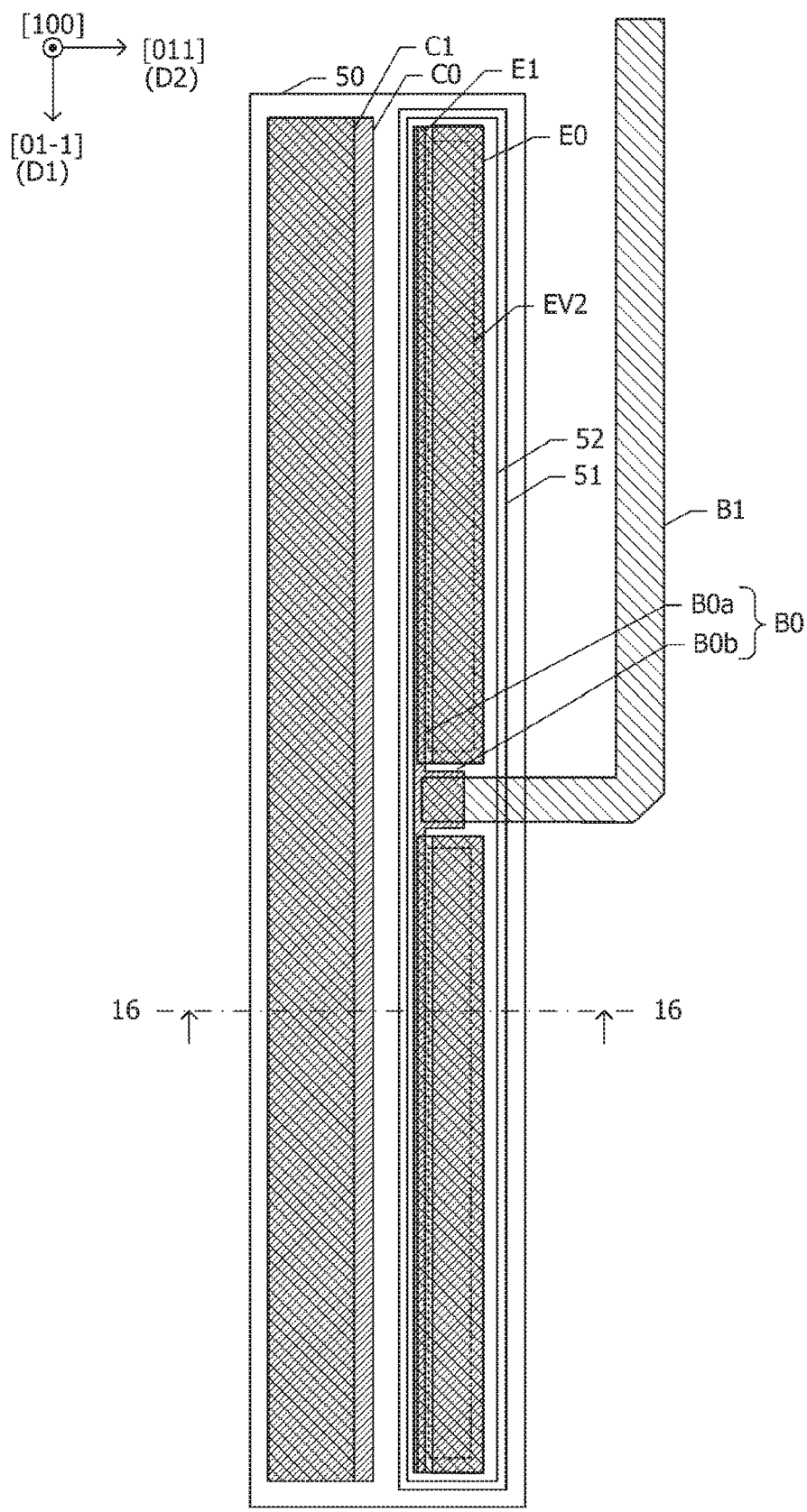
FIG. 15 illustrates a planar layout of constituent elements of a semiconductor device according to a fifth example.
Figure 16:
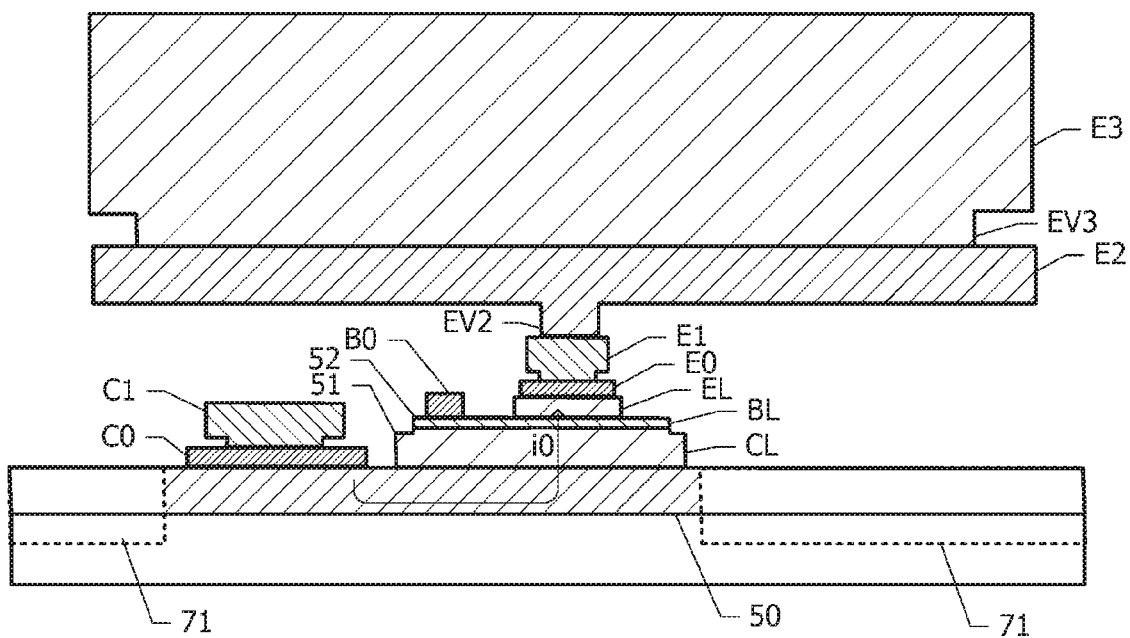
FIG. 16 is a sectional view of the semiconductor device taken along dash-dot line 16-16 in FIG. 15.

The following describes a semiconductor device according to a fifth example with reference to FIGS. 15 and 16.

Configurations common to the semiconductor device according to the third example (see FIGS. 12 and 13) and the semiconductor device according to the fifth example will not be further elaborated here.

FIG. 15 illustrates a planar layout of constituent elements of the semiconductor device according to the fifth example. FIG. 16 is a sectional view of the semiconductor device taken along dash-dot line 16-16 in FIG. 15. The base electrode B0 in the third example (see FIG. 12) is disposed so as to be opposite to the collector electrode C0 in the second direction D2 with the emitter electrode E0 therebetween. Meanwhile, the main portion B0a of the base electrode B0 in the fifth example is disposed between the emitter electrode E0 and the collector electrode C0 in the second direction D2.

The connecting portion B0b of the base electrode B0 adjoins the midsection of the main portion B0a of the base electrode B0 in the first direction D1. The connecting portion B0b protrudes from the main portion B0a toward the side opposite to the side on which the collector electrode C0 is disposed. The emitter electrode E0 is divided, at the position of the connecting portion B0b of the base electrode B0, into two sections. Similarly, the first-layer emitter line E1 is divided into two sections. One end of the first-layer base line B1 is disposed between the two sections of the first-layer emitter line E1 and is connected to the connecting portion B0b of the base electrode B0 accordingly.

The following describes advantageous effects of the fifth example. As with the collector electrode C0 in the first example, the collector electrode C0 in the fifth example is located on one side in the second direction D2 with respect to the emitter electrode E0 and is not located on the other side. Consequently, the operating current i0 flowing from the collector electrode C0 toward the emitter electrode E0 is directed from only one side to the other side in the second direction D2. As with the first example, the fifth example thus produces the advantageous effect of enlarging the SOA and increasing the breakdown withstand voltage.

The first example (see FIG. 1) necessitates, in the second direction D2, the space for the connecting portion B0b of the base electrode B0 in addition to the space for the collector electrode C0, the emitter electrode E0, and the main portion B0a of the base electrode B0. In the fifth example, meanwhile, the connecting portion B0b of the base electrode B0 and the emitter electrode E0 are in the same position in the second direction D2. This layout enables a reduction in the dimension of the bipolar transistor in the second direction D2.

Sixth Example

Figure 17:
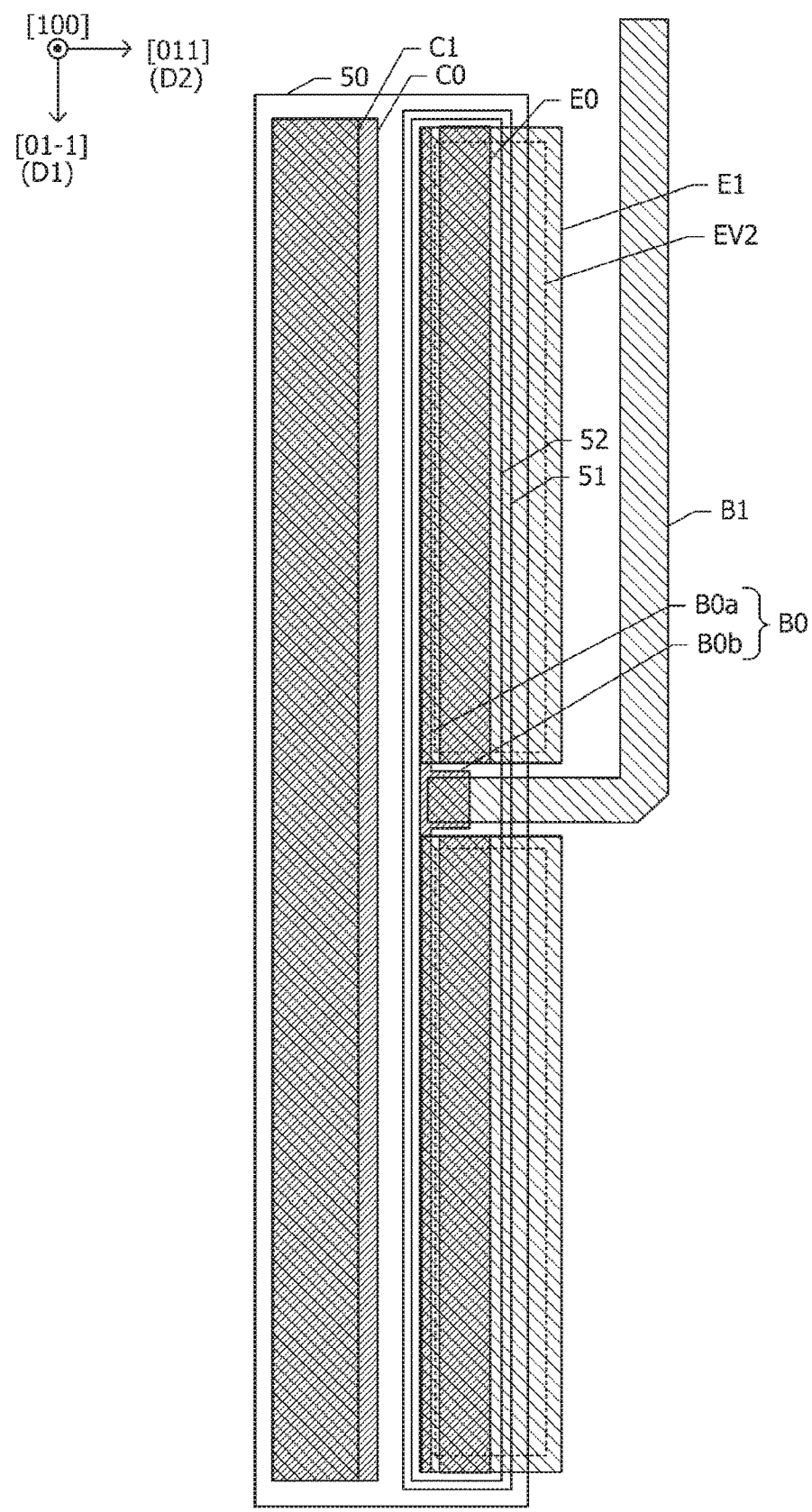
FIG. 17 illustrates a planar layout of constituent elements of a semiconductor device according to a sixth example.

The following describes a semiconductor device according to a sixth example with reference to FIG. 17. Configurations common to the semiconductor device according to the fifth example (see FIGS. 15 and 16) and the semiconductor device according to the sixth example will not be further elaborated here.

FIG. 17 illustrates a planar layout of constituent elements of the semiconductor device according to the sixth example. The first-layer emitter line E1 in the fifth example (see FIG. 15) is located within the base mesa 52 when viewed in plan. Meanwhile, as with the first-layer emitter line E1 in the fourth example (see FIG. 14), the first-layer emitter line E1 in the sixth example extends beyond the edge of the collector mesa 51 when viewed in plan. With the first-layer emitter line E1 extending beyond the edge of the collector mesa 51, the cavity EV2 extends beyond the edge of the collector mesa 51 correspondingly.

The following describes advantageous effects of the sixth example.

As with the fifth example, the sixth example produces the advantageous effect of enlarging the SOA and increasing the breakdown withstand voltage. Furthermore, the efficiency of heat transfer from the heat generation region may be enhanced as in the fourth example.

Seventh Example

Figure 18:
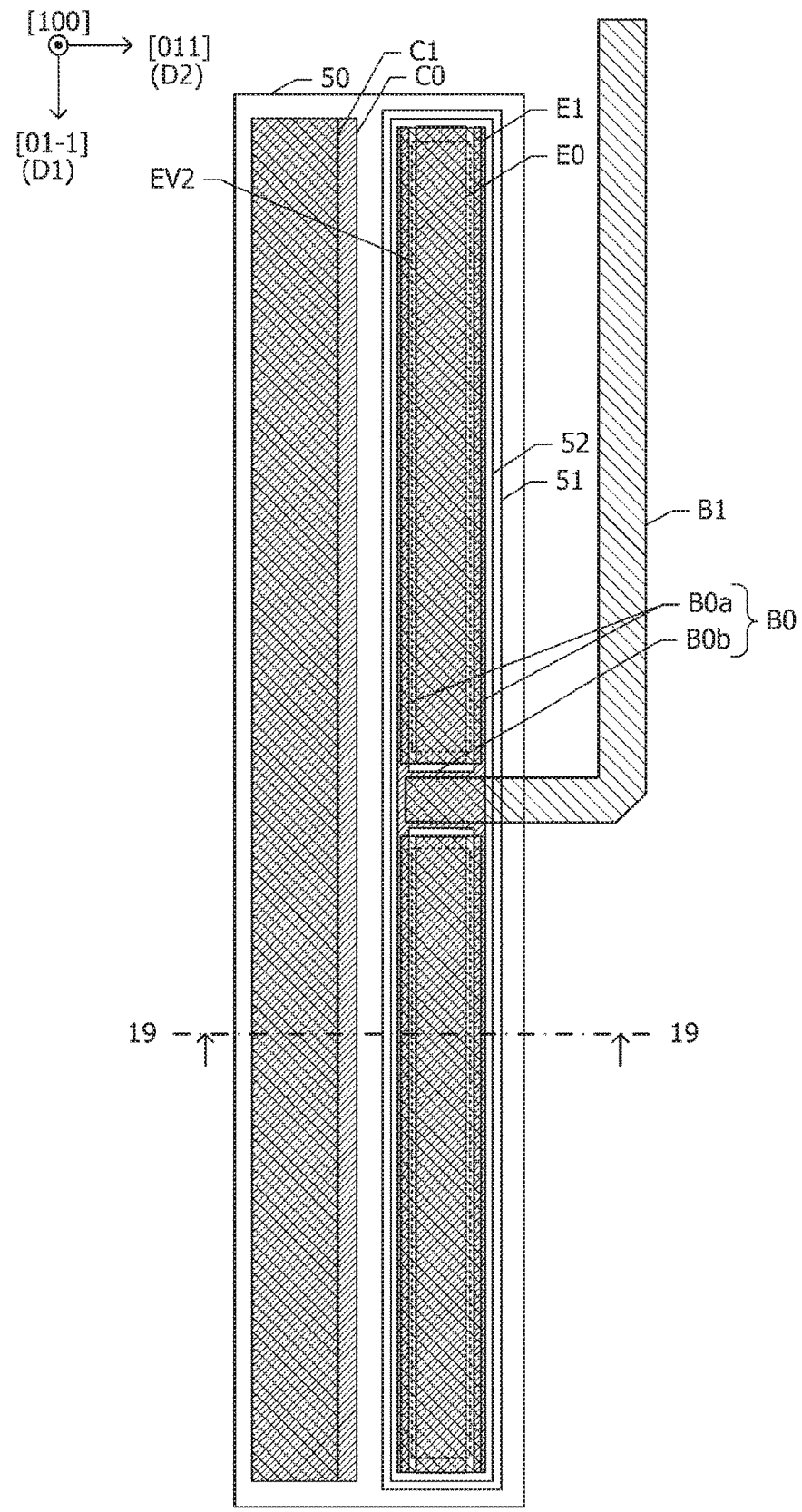
FIG. 18 illustrates a planar layout of constituent elements of a semiconductor device according to a seventh example.
Figure 19:
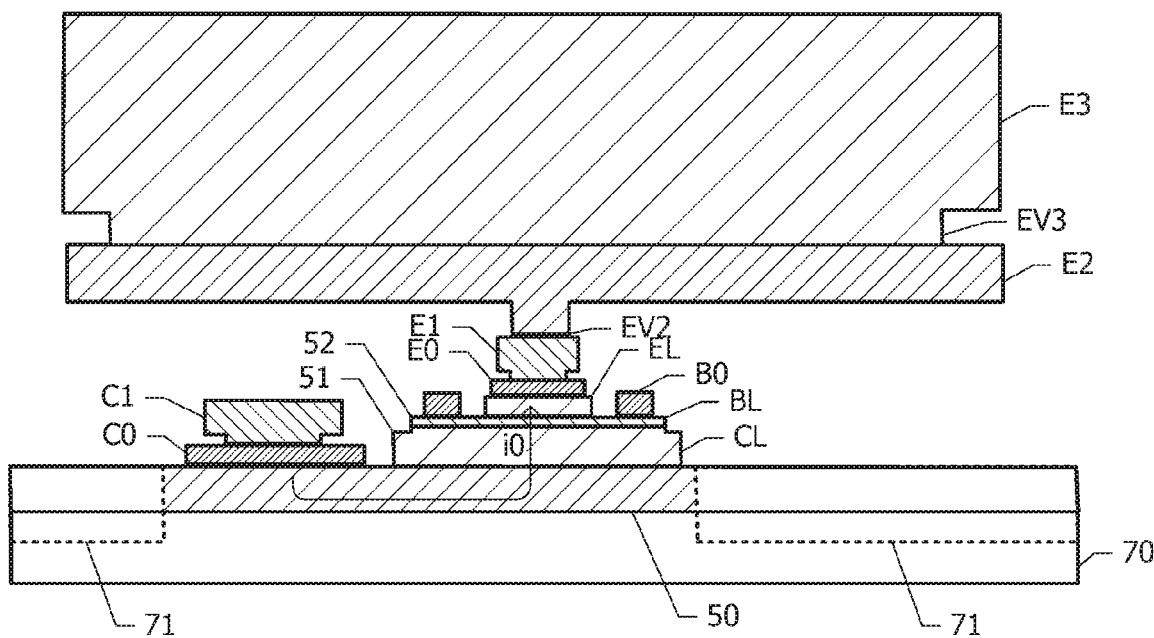
FIG. 19 is a sectional view of the semiconductor device taken along dash-dot line 19-19 in FIG. 18.

The following describes a semiconductor device according to a seventh example with reference to FIGS. 18 and 19. Configurations common to the semiconductor device according to the third example (see FIGS. 12 and 13) and the semiconductor device according to the seventh example will not be further elaborated here.

FIG. 18 illustrates a planar layout of constituent elements of the semiconductor device according to the seventh example. FIG. 19 is a sectional view of the semiconductor device taken along dash-dot line 19-19 in FIG. 18.

The main portion B0a of the base electrode B0 in the third example (see FIG. 12) is disposed on only one side in the second direction D2 with respect to the emitter electrode E0. In the seventh example, meanwhile, two main portions B0a of the base electrode B0 are disposed on opposite sides with respect to the emitter electrode E0. The connecting portion B0b of the base electrode B0 is disposed between two sections into which the emitter electrode E0 is divided. The connecting portion B0b forms a connection between the two main portions B0a. The base electrode B0 is thus H-shaped when viewed in plan.

The following describes advantageous effects of the seventh example.

In the seventh example, the main portions B0a of the base electrode B0 are disposed on opposite sides in the second direction with respect to the emitter electrode E0, whereas the collector electrode C0 is disposed on only one side as in the third example (see FIG. 12). Consequently, the operating current i0 (see FIG. 19) flowing from the collector electrode C0 toward the emitter electrode E0 is directed from only one side to the other side in the second direction D2. As with the third example, the seventh example produces the advantageous effect of enlarging the SOA and increasing the breakdown withstand voltage.

Furthermore, the main portions B0a of the base electrode B0 in the seventh example are disposed on the opposite sides with respect to the emitter electrode E0, and the base resistance is thus reduced to a greater extent than would be possible with the layout in the third example.

Eighth Example

Figure 20:
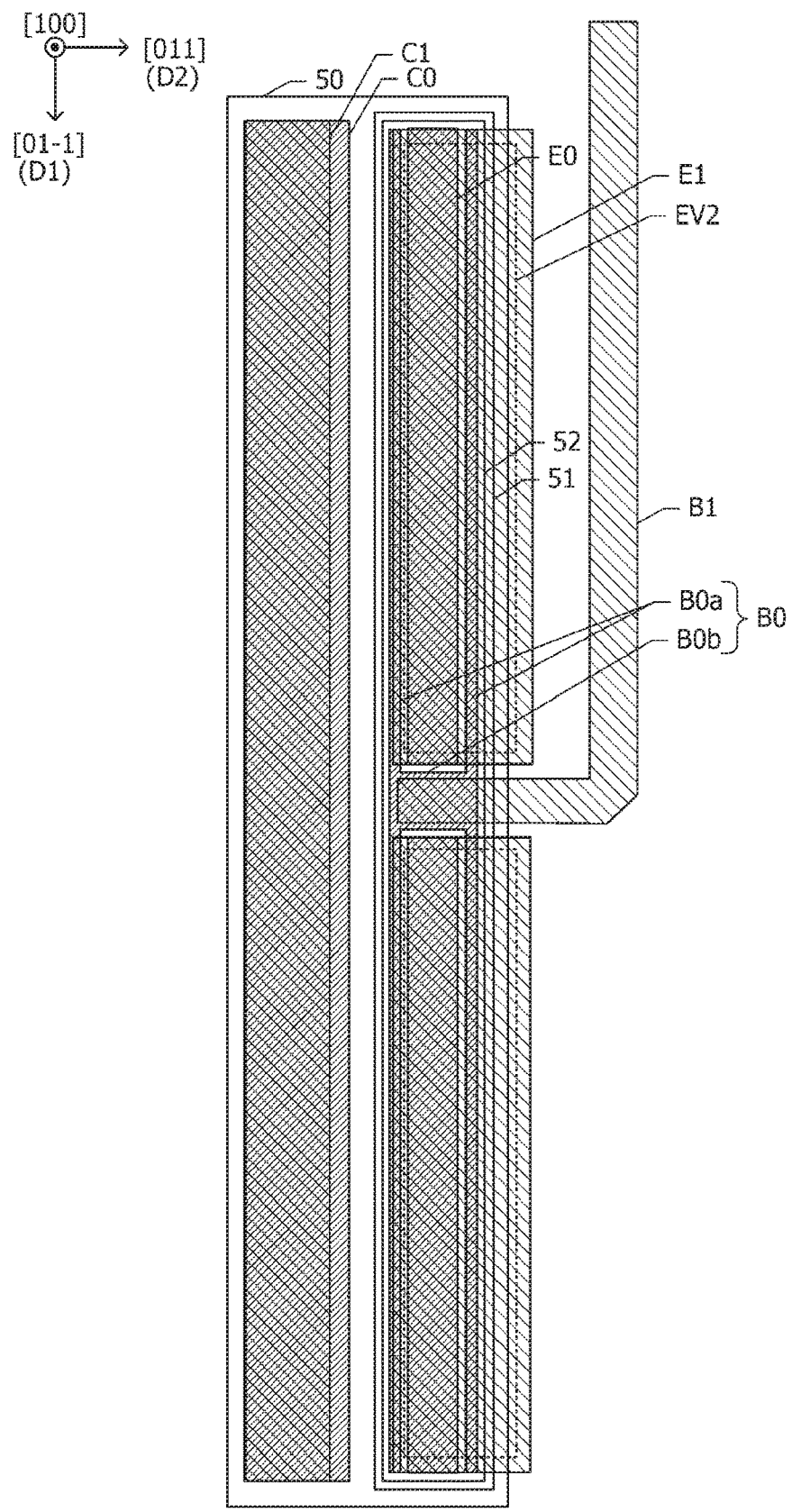
FIG. 20 illustrates a planar layout of constituent elements of a semiconductor device according to an eighth example.

The following describes a semiconductor device according to an eighth example with reference to FIG. 20. Configurations common to the semiconductor device according to the seventh example (see FIGS. 18 and 19) and the semiconductor device according to the eighth example will not be further elaborated here.

FIG. 20 illustrates a planar layout of constituent elements of the semiconductor device according to the eighth example. The first-layer emitter line E1 in the seventh example (see FIG. 18) is located within the base mesa 52 when viewed in plan. Meanwhile, as with the first-layer emitter line E1 in the fourth example (see FIG. 14), the first-layer emitter line E1 in the eighth example extends beyond the edge of the base mesa 52 and the edge of the collector mesa 51 when viewed in plan.

The following describes advantageous effects of the eighth example.

As with the seventh example, the eighth example produces the advantageous effect of enlarging the SOA and increasing the breakdown withstand voltage. Furthermore, the efficiency of heat transfer from the heat generation region may be enhanced in the eighth example as in the fourth example.

Ninth Example

Figure 21:
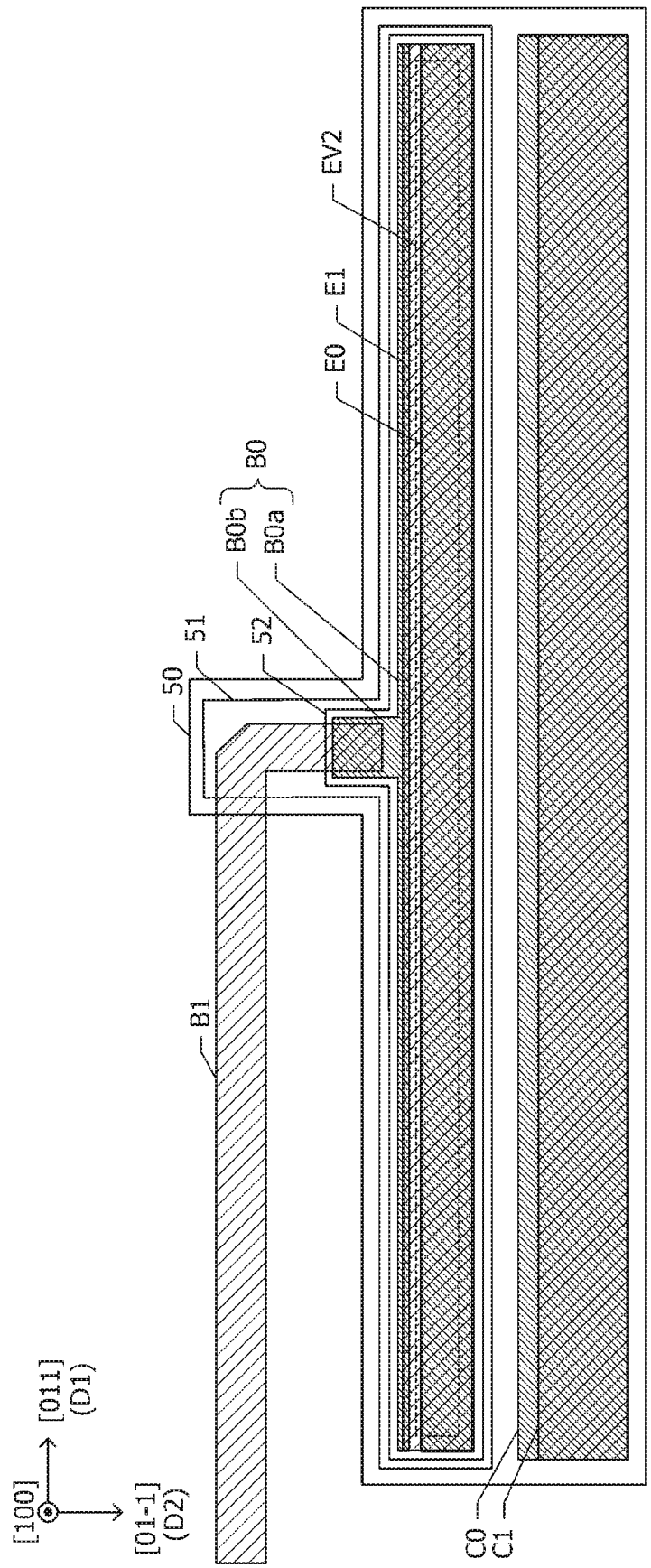
FIG. 21 illustrates a planar layout of constituent elements of a semiconductor device according to a ninth example.

The following describes a semiconductor device according to a ninth example with reference to FIG. 21. Configurations common to the semiconductor device according to the first example and the semiconductor device according to the ninth example will not be further elaborated here.

FIG. 21 illustrates a planar layout of constituent elements of the semiconductor device according to the ninth example. The collector electrode C0, the emitter electrode E0, the base electrode B0, the first-layer collector line C1, the first-layer emitter line E1, and the first-layer base line B1 have shapes and relative positional relationship identical to the shape and the relative positional relationship of the corresponding constituent elements in the first example (see FIG. 1) when viewed in plan. The difference between the first and ninth examples is in the first direction D1, namely, the longitudinal direction of the emitter electrode E0. Specifically, the first direction D1 in the first example (see FIG. 1) coincides with the [01-1] direction of the substrate 70 formed from single-crystal GaAs, whereas the first direction D1 in the ninth example coincides with the [011] direction of the substrate 70.

In the first example (see FIG. 1), a portion being part of the first-layer base line B1 and extending out from the connecting portion B0b in the second direction D2 intersects the edge of the collector mesa 51 parallel to the first direction D1. In the ninth example, meanwhile, the portion extending out from the connecting portion B0b in the second direction D2 is located within the collector mesa 51 when viewed in plan. The portion being part of the base line B1 and located within the collector mesa 51 is bent at a right angle, and the remaining portion of the base line B1 extends in the first direction D1. The portion being part of the base line B1 and extending in the first direction D1 intersects the edge of the collector mesa 51 parallel to the second direction D2. That is, both the first-layer base line B1 in the first example (see FIG. 1) and the first-layer base line B1 in the ninth example intersect the edge of the collector mesa 51 parallel to the [01-1] direction when viewed in plan.

The following describes advantageous effects of the ninth example. As with the first example, the ninth example produces the advantageous effect of enlarging the SOA and increasing the breakdown withstand voltage.

Side faces of the collector mesa 51 formed by wet etching of the GaAs layer that is to be formed into the collector layer CL (see FIG. 2A) are inclined and are not perpendicular to an upper surface of the substrate 70 due to the anisotropy of etching speed. The side faces of the collector mesa 51 viewed in section as in FIG. 2A, that is, the side faces extending in the [01-1] direction are inclined at an angle of less than 90°. The shape defined with side faces inclined at angle of less than 90° is herein referred to as a normal mesa shape. The other side faces of collector mesa 51 extend in the [011] direction and are inclined at an angle of greater than 90°. The shape defined with side faces inclined at an angle of greater than 90° is referred to as an inverted mesa shape.

The first-layer base line B1 disposed in a manner so as to intersect one of side faces defining an inverted mesa shape is liable to break. To avoid breakage, the first-layer base line B1 is preferably disposed in a manner so as to intersect one of side faces of the collector mesa 51 that define a normal mesa shape. In the first example (see FIG. 2B), the first-layer base line B1 intersects one of the side faces of the collector mesa 51 that extend in the [01-1] direction and define a normal mesa shape. In the ninth example (see FIG. 21), the portion being part of the first-layer base line B1 and located within the collector mesa 51 when viewed in plan is bent at a right angle. The first-layer base line B1 thus intersects one of the side faces of the collector mesa 51 that extend in the [01-1] direction and define a normal mesa shape. The ninth example thus eliminates or reduces the occurrence of breakage of the first-layer base line B1.

When viewed in plan, the first-layer base line B1 intersects one of side faces of the base mesa 52 that define an inverted mesa shape. The height of the side face of the base mesa 52 is sufficiently smaller than the height of the corresponding side face of the collector mesa 51. Thus, the first-layer base line B1 intersecting one of the side faces of the base mesa 52 that define an inverted mesa shape is not liable to break.

The following describes semiconductor devices according to modifications of the ninth example with reference to FIGS. 22 to 28. In the modifications respectively illustrated in FIGS. 22 to 28, the first direction D1, namely the longitudinal direction of the emitter electrode E0 coincides with the [011] direction of the substrate 70 as in the ninth example (see FIG. 21). As with the first-layer base line B1 in the ninth example, the first-layer base line B1 in each of the modifications intersects one of the side faces of the collector mesa 51 that extend in the second direction D2 ([01-1] direction).

Figure 22:
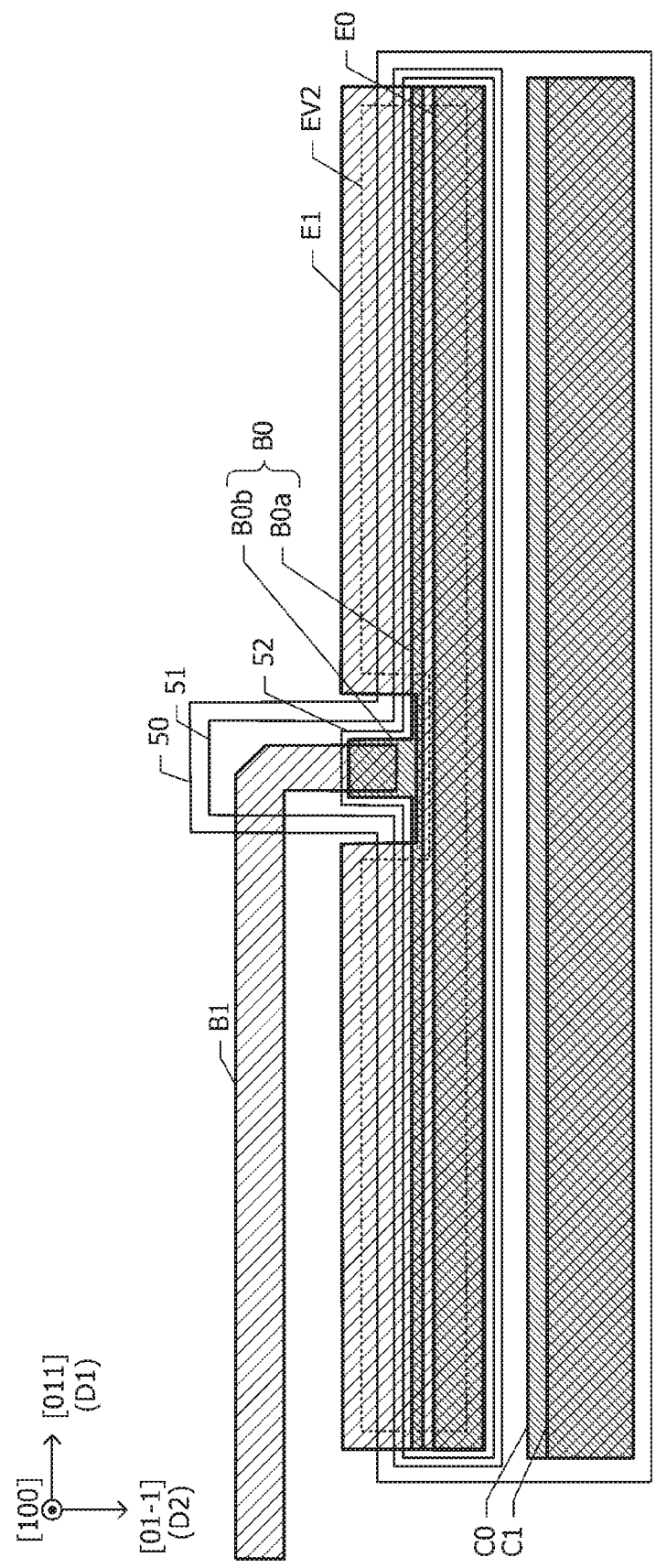
FIG. 22 illustrates a planar layout of constituent elements of a semiconductor device according to a modification of the ninth example.
Figure 23:
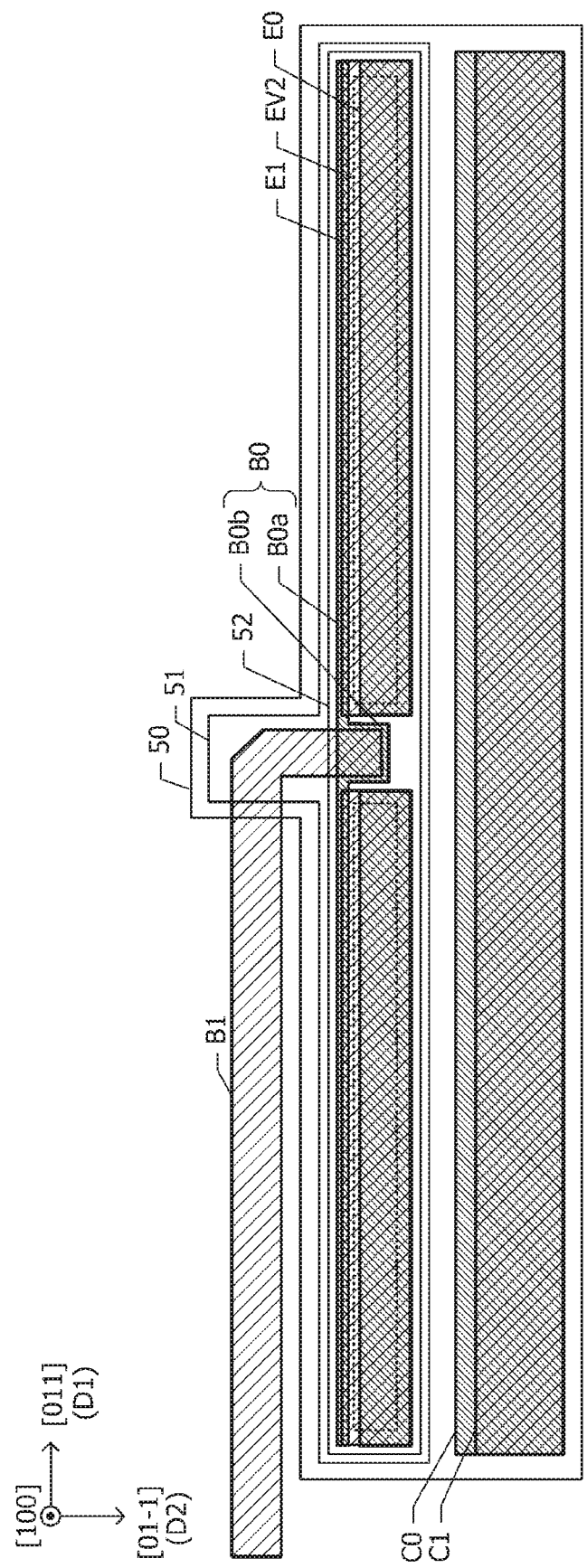
FIG. 23 illustrates a planar layout of constituent elements of a semiconductor device according to another modification of the ninth example.
Figure 24:
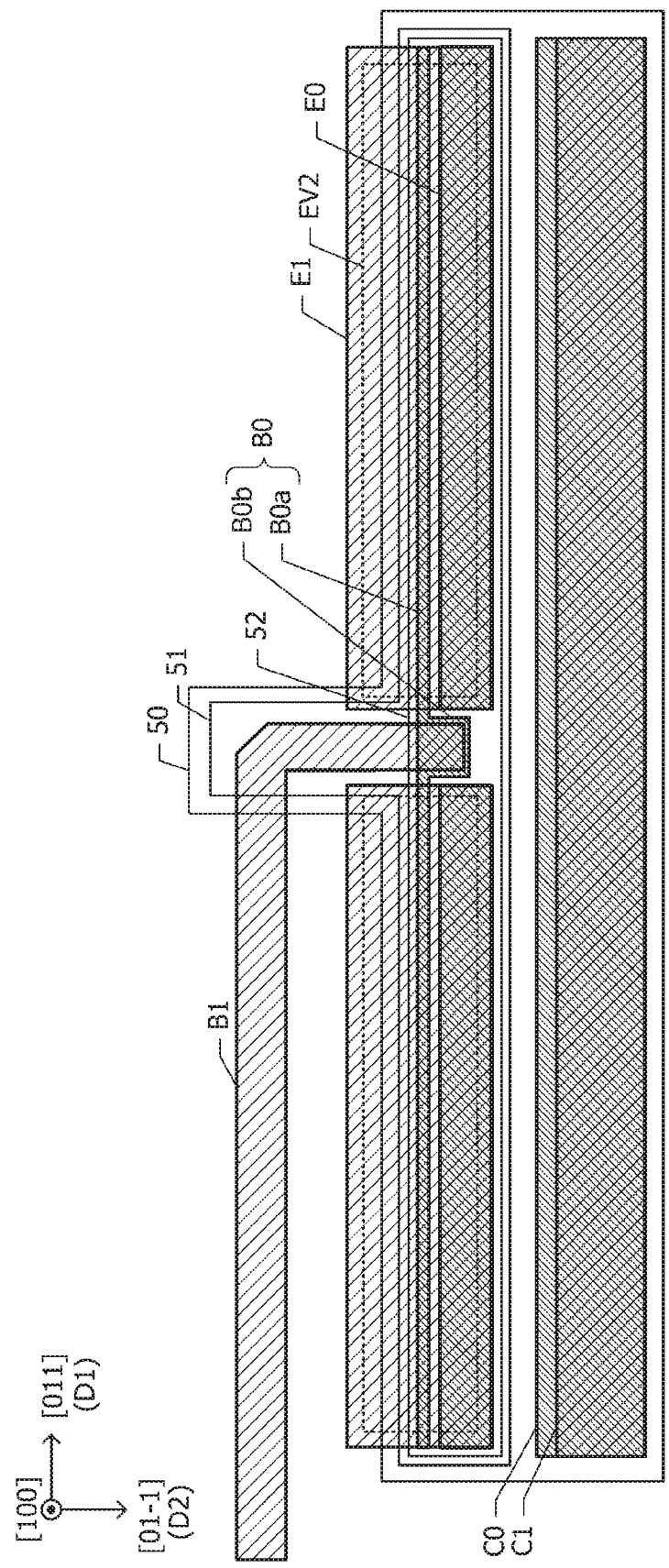
FIG. 24 illustrates a planar layout of constituent elements of a semiconductor device according to still another modification of the ninth example.
Figure 25:
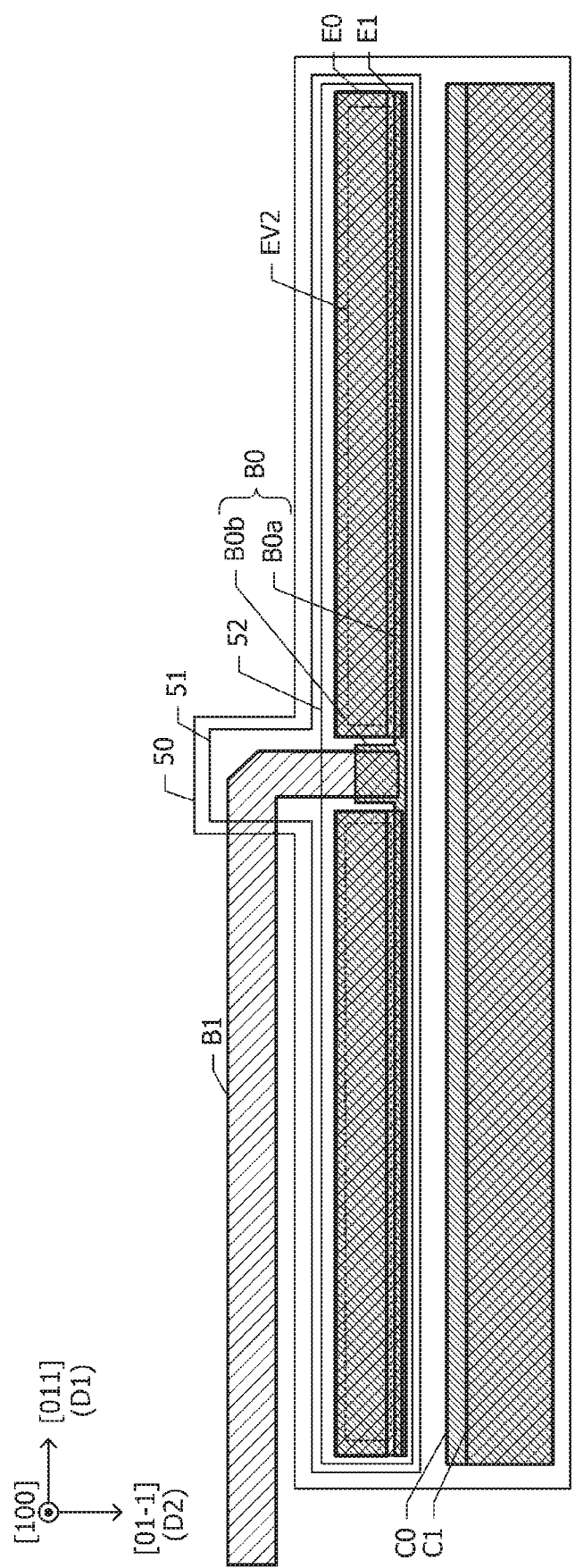
FIG. 25 illustrates a planar layout of constituent elements of a semiconductor device according to still another modification of the ninth example.
Figure 26:
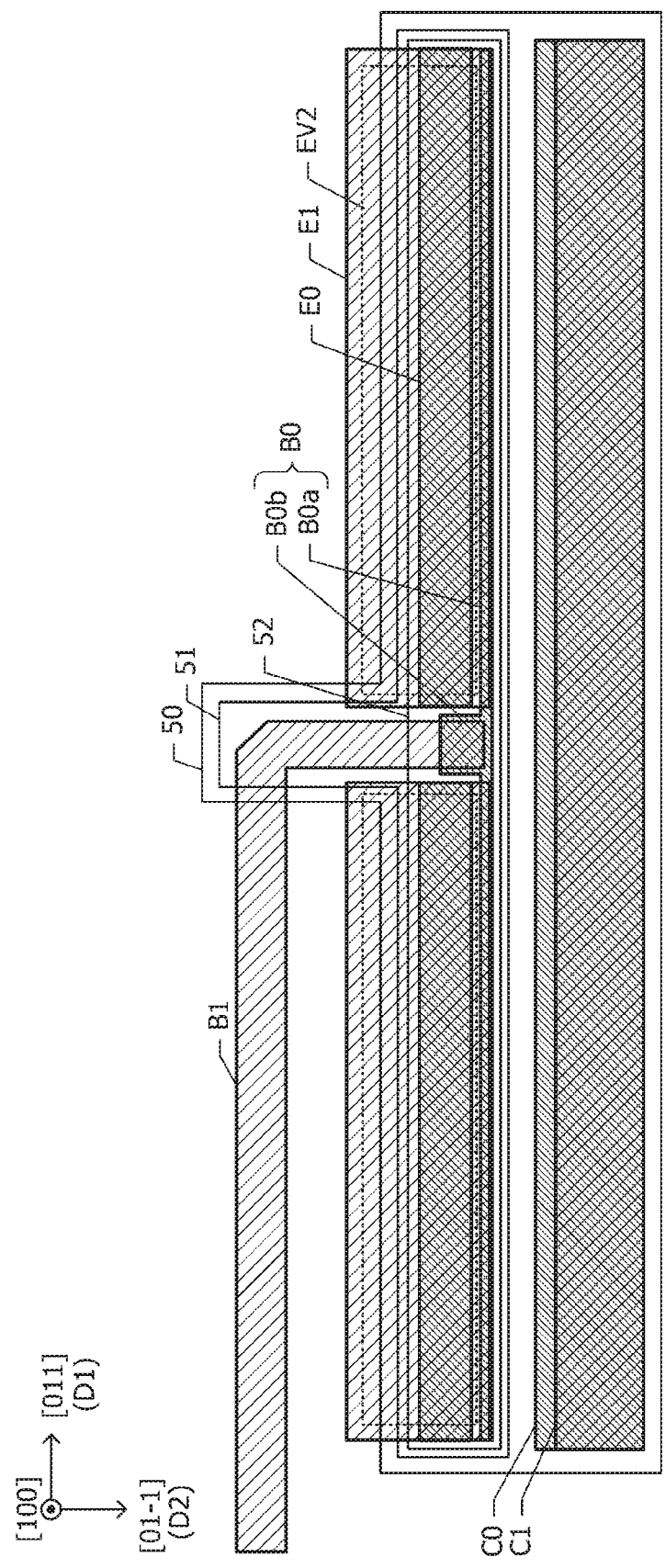
FIG. 26 illustrates a planar layout of constituent elements of a semiconductor device according to still another modification of the ninth example.
Figure 27:
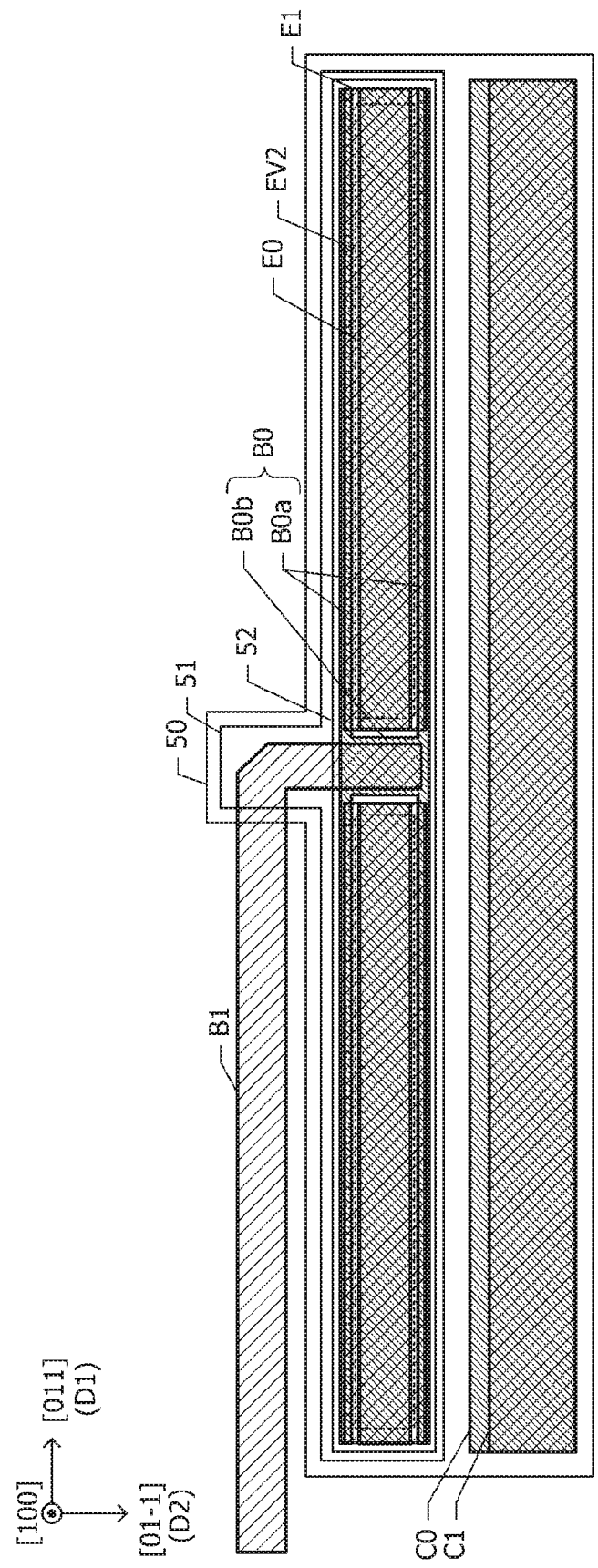
FIG. 27 illustrates a planar layout of constituent elements of a semiconductor device according to still another modification of the ninth example.
Figure 28:
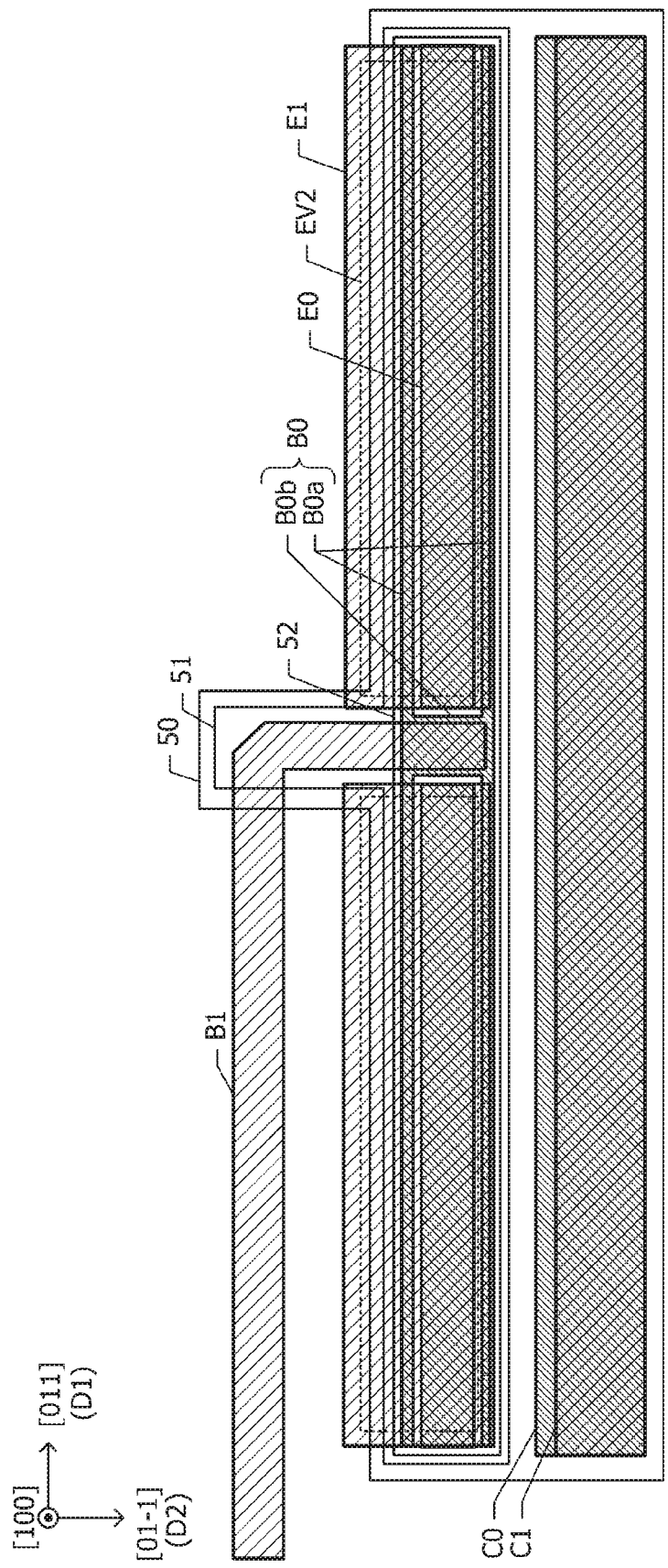
FIG. 28 illustrates a planar layout of constituent elements of a semiconductor device according to still another modification of the ninth example.

The collector electrode C0, the emitter electrode E0, the base electrode B0, the first-layer collector line C1, the first-layer emitter line E1, and the first-layer base line B1 in the modification illustrated in FIG. 22 have shapes and positional relationship identical to the shapes and the positional relationship of the corresponding constituent elements in the second example (see FIG. 9) when viewed in plan. The constituent elements in the modification illustrated in FIG. 23 have shapes and positional relationship identical to the shapes and the positional relationship of the corresponding constituent elements in the third example (see FIG. 12) when viewed in plan. The constituent elements in the modification illustrated in FIG. 24 have shapes and positional relationship identical to the shapes and the positional relationship of the corresponding constituent elements in the fourth example (see FIG. 14) when viewed in plan. The constituent elements in the modification illustrated in FIG. 25 have shapes and positional relationship identical to the shapes and the positional relationship of the corresponding constituent elements in the fifth example (see FIG. 15) when viewed in plan. The constituent elements in the modification illustrated in FIG. 26 have shapes and positional relationship identical to the shapes and the positional relationship of the corresponding constituent elements in the sixth example (see FIG. 17) when viewed in plan. The constituent elements in the modification illustrated in FIG. 27 have shapes and positional relationship identical to the shapes and the positional relationship of the corresponding constituent elements in the seventh example (see FIG. 18) when viewed in plan. The constituent elements in the modification illustrated in FIG. 28 have shapes and positional relationship identical to the shapes and the positional relationship of the corresponding constituent elements in the eighth example (see FIG. 20) when viewed in plan.

As with the ninth example, these modifications produce the advantageous effect of enlarging the SOA and increasing the higher breakdown withstand voltage and the effect of eliminating or reducing the occurrence of breakage of the first-layer base line B1. Furthermore, these modifications also produce effects similar to those of the corresponding ones of the second to eighth examples.

Tenth Example

Figure 29:
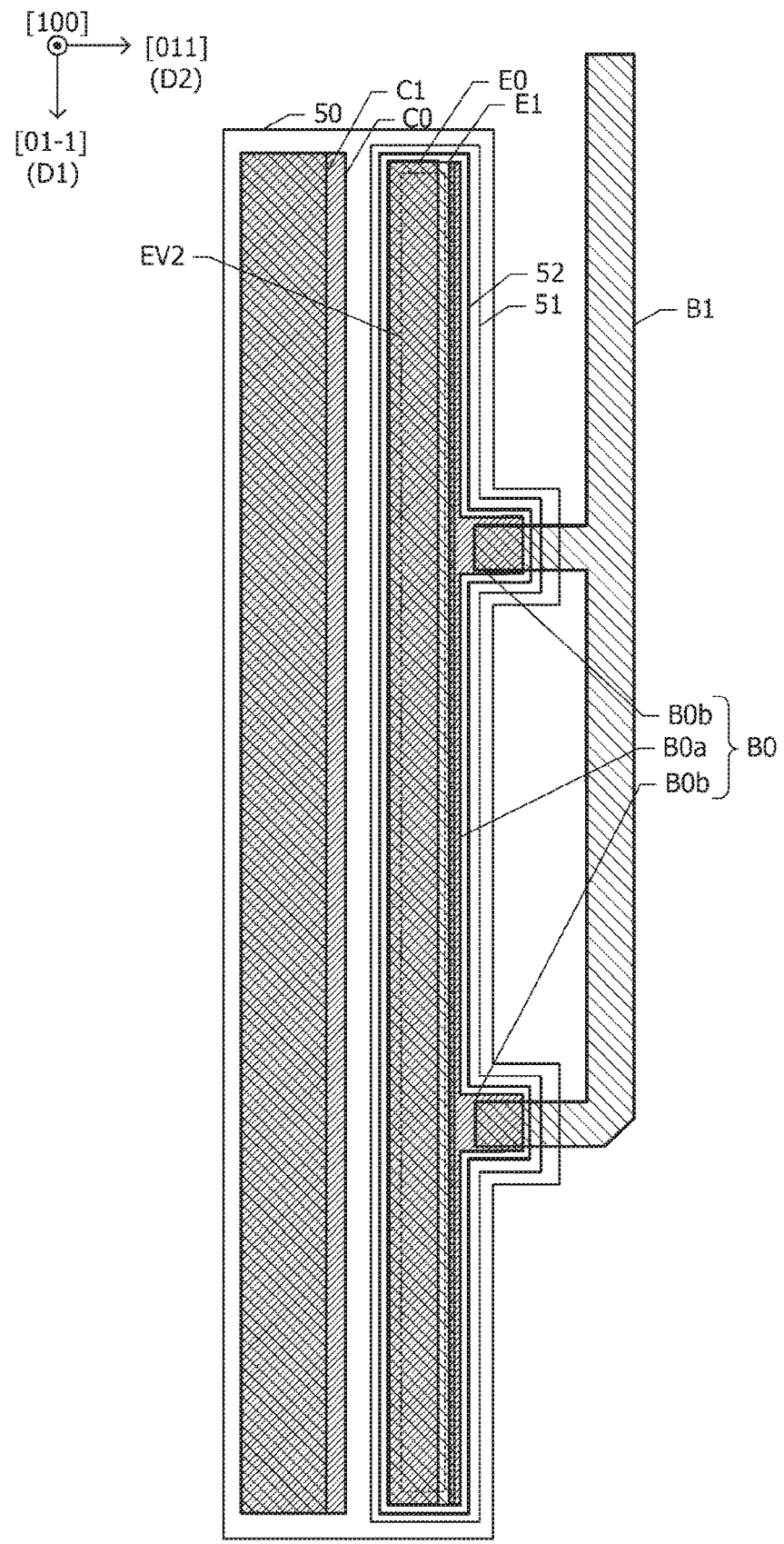
FIG. 29 illustrates a planar layout of constituent elements of a semiconductor device according to a tenth example.
Figure 30:
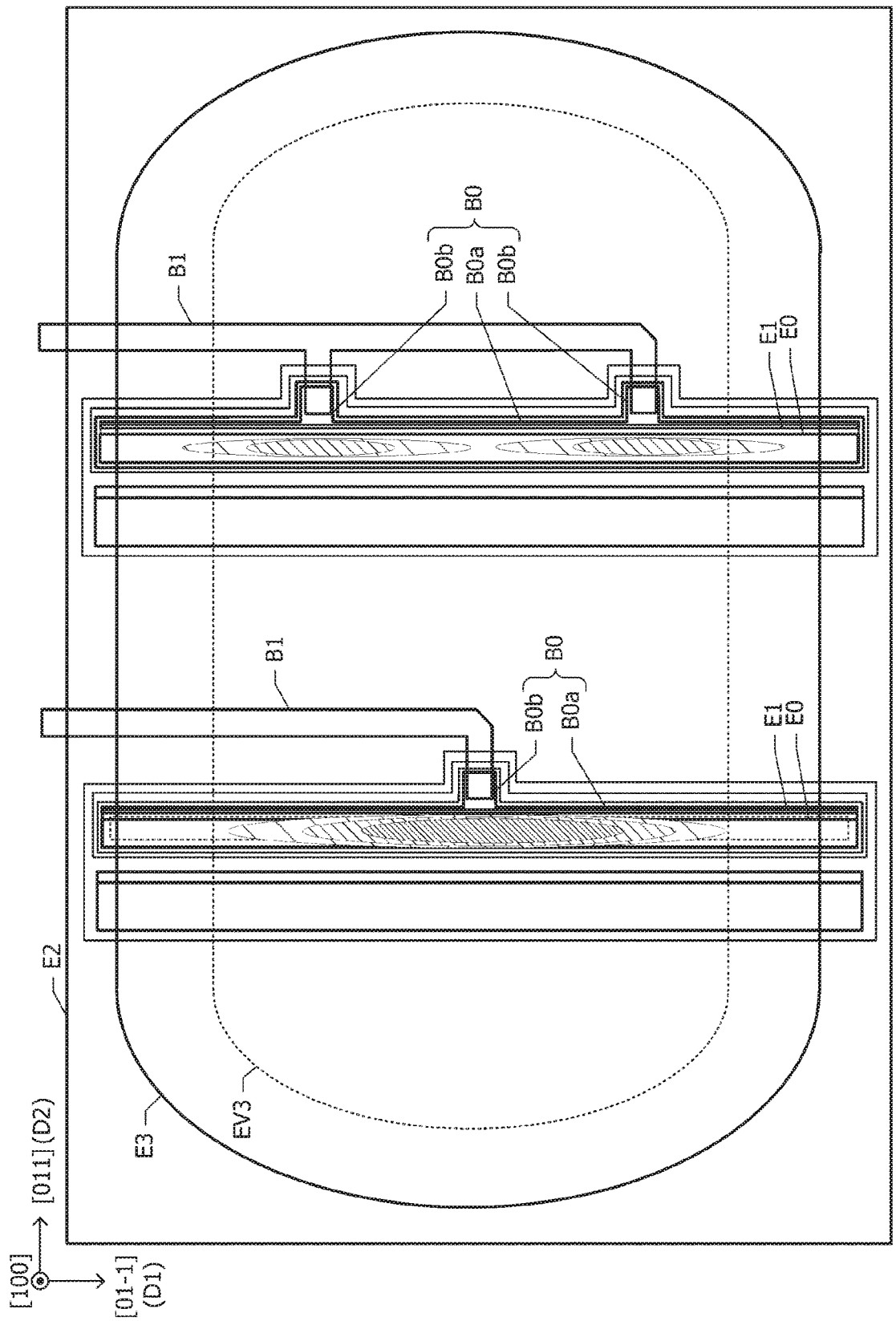
FIG. 30 illustrates a layout of the constituent elements of the semiconductor device according to the first example and a layout of the constituent elements of the semiconductor device according to the tenth example, with the semiconductor devices being viewed in plan.

The following describes a semiconductor device according to a tenth example with reference to FIGS. 29 and 30. Configurations common to the semiconductor device according to the second example (see FIG. 9) and the semiconductor device according to the tenth example will not be further elaborated here.

FIG. 29 illustrates a planar layout of constituent elements of the semiconductor device according to the tenth example. In the second example (see FIG. 9), the base electrode B0 includes one connecting portion B0$b$, and the first-layer base line B1 and the base electrode B0 are connected to each other in one position. In the tenth example, meanwhile, the base electrode B0 includes two connecting portions B0$b$, and the first-layer base line B1 and the base electrode B0 are connected to each other in two different positions in the first direction D1. The two connecting portions B0$b$ are in positions other than the both ends of the base electrode B0 and are located at equal distances from the center of the base electrode B0 in the first direction D1.

The following describes advantageous effects of the tenth example.

In the tenth example, the base resistance distribution in the first direction D1 is leveled to a greater extent than would be possible in the first example. Consequently, the base current distribution in the first direction D1 is also leveled, and the distribution of the amount of heat generated in the heat generation region of the bipolar transistor is leveled accordingly.

FIG. 30 illustrates a layout of the constituent elements of the semiconductor device according to the first example and a layout of the constituent elements of the semiconductor device according to the tenth example, with the semiconductor devices being viewed in plan. The semiconductor device according to the first example is illustrated on the left side of FIG. 30, and the semiconductor device according to the tenth example is illustrated on the right side of FIG. 30. The relative positional relationship in the first direction D1 between the emitter electrode E0, the first-layer emitter line E1, the second-layer emitter line E2, the emitter bump E3, and the cavity EV3 is as described above with reference to FIG. 3. Referring to FIG. 30, regions in which a greater amount of heat is generated are more densely hatched.

In both the first example and the tenth example, the amount of heat generated is greater in the position of the connecting portion B0$b$ of the base electrode B0 is greater than the amount of heat generated in any other region in the first direction D1. It should be noted that the degree of concentration of the amount of heat generated is lower in the tenth example than in the first example.

The thermal resistance in the heat transfer path extending from the heat generation region to the upper surface of the emitter bump E3 varies in the first direction D1. The configuration in the first example or the configuration in the tenth example, whichever is better suited to the thermal resistance distribution concerned, may be adopted. For example, a decision on which configuration to adopt may be made in accordance with the difference in thermal resistance between each end and the center of the emitter electrode E0 in the first direction D1.

The emitter layer EL and the emitter electrode E0 are preferably extended in the first direction D1 in view of, for example, the radio-frequency performance (e.g., the performance at 2.5 GHz) and the breakdown withstand voltage. In some cases, the length of each of the emitter layer EL and the emitter electrode E0 in the first direction D1 is greater than 100 μm. With the length of the emitter layer EL and the length of the emitter electrode E0 being increased, the base electrode B0 is extended in the first direction D1 correspondingly. As the base electrode B0 is extended, unevenness in the base electrode resistance in the first direction D1 tends to increase. In this case, the base electrode B0 and the base line B1 are preferably connected to each other in more than one position as in the tenth example so that unevenness in base electrode resistance is reduced. In a case where the length of the base electrode B0 in the first direction D1 is less than or equal to 100 μm, the base electrode B0 and the base line B1 may be connected to each other in one position.

The two connecting portions B0$b$ of the base electrode B0 in the tenth example may be arranged in a manner so as to adjust the distribution of the amount of heat generated. For example, as the space between the two connecting portions B0$b$ is reduced, the degree of concentration of the amount of heat generated increases. The positions of the connecting portions B0$b$ in the first direction D1 may be determined in accordance with the thermal resistance distribution. The temperature distribution in the heat generation region may be leveled to a greater extent accordingly.

The following describes modifications of the tenth example.

It is not required that the base electrode B0 include two connecting portions B0$b$ as in the tenth example. The base electrode B0 may include three or more connecting portions B0$b$. The configuration with a larger number of connecting portions B0$b$ offers a higher degree of flexibility in the control of distribution of the amount of heat generated.

It is not required that the two connecting portions B0$b$ be located at equal distances from the center of the base electrode B0 in the first direction D1 as in the tenth example. When the thermal resistance distribution in the first direction D1 is asymmetrical, the connecting portions B0$b$ may be arranged asymmetrically in accordance with the thermal resistance distribution and may be located at different distances from the center of the base electrode B0.

Eleventh Example

Figure 31:
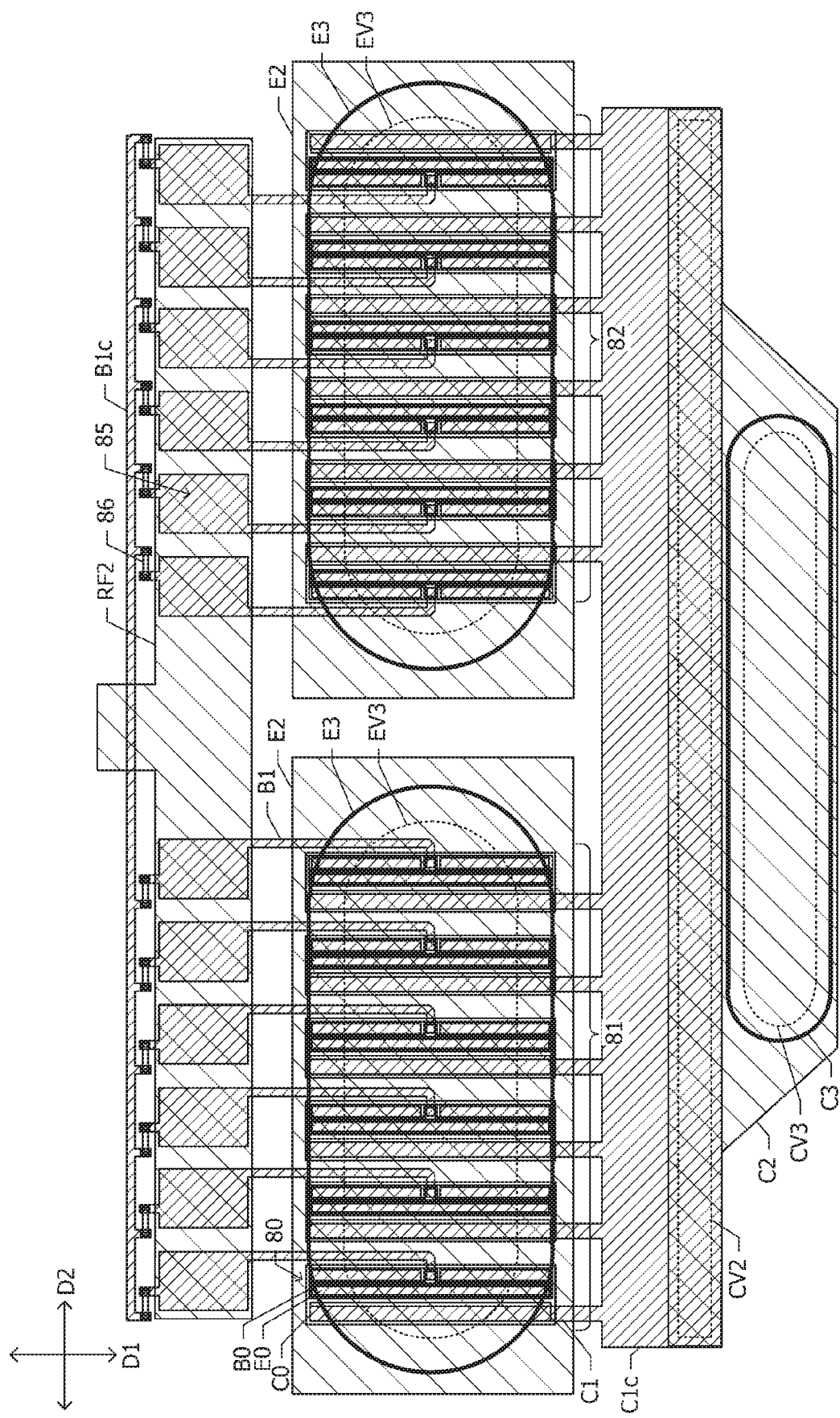
FIG. 31 illustrates a layout of constituent elements of a semiconductor device according to an eleventh example, with the semiconductor device being viewed in plan.
Figure 32:
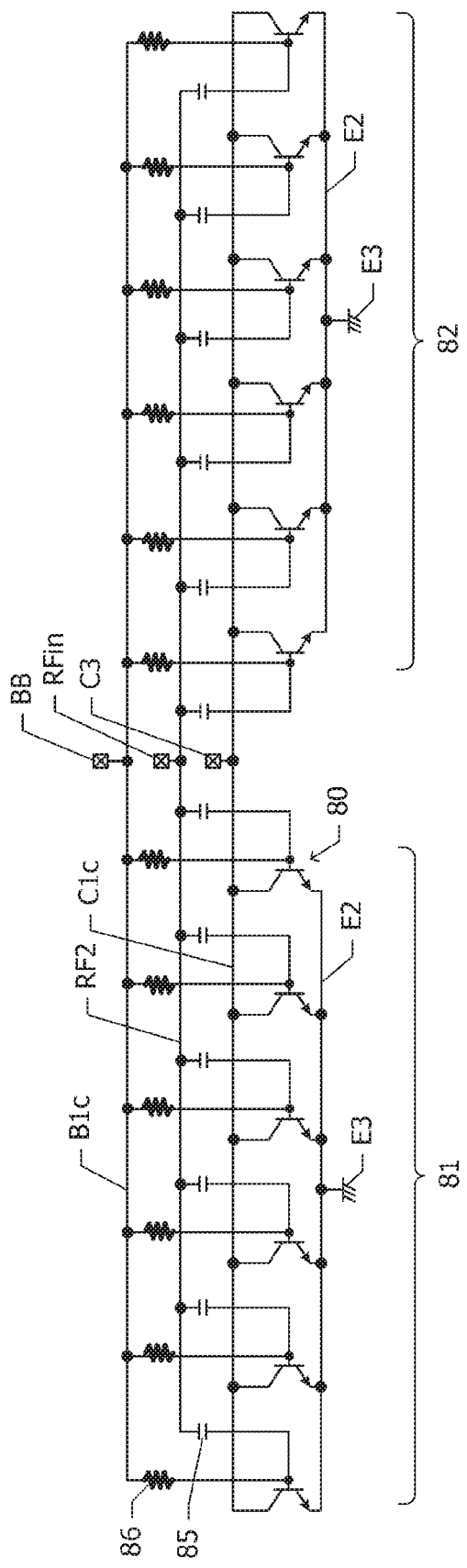
FIG. 32 is an equivalent circuit diagram of the semiconductor device according to the eleventh example.

The following describes a semiconductor device according to an eleventh example with reference to FIGS. 31 and 32.

FIG. 31 illustrates a layout of constituent elements of the semiconductor device according to the eleventh example, with the semiconductor device being viewed in plan. The first to tenth examples describe the configuration of the semiconductor devices each including one bipolar transistor. Meanwhile, the semiconductor device according to the eleventh example includes a plurality of bipolar transistors provided on a common substrate. Configuration of each bipolar transistor is similar to the configuration of the bipolar transistor included in the semiconductor device (see FIG. 9) according to the second example. Together with each bipolar transistor, the collector electrode C0, the base electrode B0, and the emitter electrode E0 that are connected the bipolar transistor (see FIG. 9) are herein collectively referred to as a cell.

A plurality of cells 80 are arranged side by side in the second direction D2 orthogonal to the longitudinal direction of the emitter electrode E0. The cells 80 are provided with their respective sub-collector layers 50. Two sub-collector layers 50 adjacent to each other in the second direction D2 are separated from each other by the insulating region 71 (see FIG. 10).

The cells 80 are divided into a first group 81 and a second group 82. The first group 81 and the second group 82 each include, for example, six cells 80. The order in which the collector electrode C0, the emitter electrode E0, and the base electrode B0 of one of the cells 80 in a group are arranged in the second direction D2 and the order in which the corresponding electrodes of any other cell 80 in the group are arranged in the second direction D2 are the same. The cells 80 belonging to the same group are spaced uniformly. The cells 80 belonging to the first group 81 and the cells 80 belonging to the second group 82 are arranged in mirror-image form in the second direction D2.

A second-layer emitter line E2 overlaps the first-layer emitter lines E1 of the cells 80 in the first group 81 when viewed in plan. Similarly, another second-layer emitter line E2 overlaps the first-layer emitter lines E1 of the cells 80 in the second group 82 when viewed in plan. Each of the second-layer emitter line E2 is connected to the first-layer emitter lines E1 of the cells 80 belonging to the corresponding one of the groups.

Emitter bumps E3 are located within the two respective second-layer emitter lines E2 when viewed in plan. The emitter bumps E3 are long in the second direction D2 when viewed in plan. The emitter bump E3 extend through corresponding cavities EV3 in the protective film disposed thereunder and are connected to the corresponding second-layer emitter lines E2 accordingly. Each emitter bump E3 overlaps the emitter electrodes E0 of the cells 80 when viewed in plan. Each emitter electrode E0 may partially extends beyond the edge of the emitter bump E3 when viewed in plan.

First-layer collector lines C1 extend out from the collector electrodes C0 of the cells 80 in the first direction D1. The collector lines C1 are linked to a first-layer collector common line C1c, which is long in the second direction D2. The collector common line C1c and the collector lines C1 linked thereto form a comb shape when viewed in plan.

A second-layer collector line C2 partially overlaps the collector common line C1c when viewed in plan. The second-layer collector line C2 extends through a cavity CV2 in an insulating film disposed thereunder and is connected to the first-layer collector common line C1c accordingly. A collector bump C3 is located within the second-layer collector line C2 and is located outside the first-layer collector common line C1c when viewed in plan. The collector bump C3 is long in the second direction D2 when viewed in plan. The longitudinal direction of the collector bump C3 coincides with the longitudinal direction of the emitter bumps E3. Each emitter bump E3 is larger than the collector bump C3 when viewed in plan. The collector bump C3 extends through a cavity CV3 in a protective film disposed thereunder and is connected to the second-layer collector line C2 accordingly.

First-layer base lines B1 extend out from the base electrodes B0 of the cells 80 in the first direction D1. The direction in which the base lines B1 extend out from the corresponding electrodes is opposite to the direction in which the collector lines C1 extend out from the corresponding electrodes. A radio-frequency signal input line RF2 extends in the second direction D2 and intersects the base lines B1 when viewed in plan. The radio-frequency signal input line RF2 is disposed in a second wiring layer. An overlap between each first-layer base line B1 and the radio-frequency signal input line RF2 functions as an input capacitive element 85, with the base line B1 and the radio-frequency signal input line RF2 constituting a pair of electrodes. The portion being part of the base line B1 and overlapping the radio-frequency signal input line RF2 is wider than the other portion of the base line B1, and required capacitance is provided accordingly. The cells 80 are provided with their respective input capacitive elements 85, which are arranged side by side in the second direction D2. The base lines B1 extending out from the corresponding cells 80 intersect the radio-frequency signal input line RF2 and are connected to a base common line B1c via corresponding ballast resistance elements 86.

FIG. 32 is an equivalent circuit diagram of the semiconductor device according to the eleventh example. The emitters of the bipolar transistors of the cells 80 belonging to the first group 81 are connected to one of the emitter bumps E3 via one of the second-layer emitter lines E2. Similarly, emitters of the bipolar transistors of the cells 80 belonging to the second group 82 are connected to the other emitter bump E3 via the other second-layer emitter line E2. The emitter bumps E3 are connected to, for example, ground of a mounting substrate.

Collectors of the bipolar transistors of the cells 80 are connected to the collector bump C3 via one collector common line C1c. Bases of the bipolar transistors of the cells 80 are connected to one radio-frequency signal input line RF2 via the corresponding input capacitive elements 85. Radio-frequency signals input through a radio-frequency signal input terminal RFin flow through the radio-frequency signal input line RF2 and then enter the bases of the bipolar transistors of the cells 80. The bases of the bipolar transistors of the cells 80 are also connected to the base common line B1c via the corresponding ballast resistance elements 86. Base bias is provided from a base bias terminal BB to the bipolar transistors of the cells 80, through the base common line B1c.

As illustrated in FIGS. 31 and 32, the cells 80 in the eleventh example are connected in parallel to constitute a power amplifier circuit. The semiconductor device according to the eleventh example is mounted face-down on the mounting substrate by flip-chip mounting.

The following describes advantageous effects of the eleventh example.

Each of the cells 80 in the eleventh example is the semiconductor device according to the second example. As with the second example, the eleventh example enables enlargement of the SOA and an increase in breakdown withstand voltage. Each of the emitter bumps E3 is larger than the collector bump C3. The eleventh example thus produces the advantageous effect of reducing the thermal resistance in the heat transfer paths of the bipolar transistors.

The following describes modifications of the eleventh example. Each of the cells 80 of the semiconductor device according to the eleventh example has a configuration identical to the configuration of the semiconductor device according to the second example. Alternatively, each of the cells 80 may have a configuration identical to the configuration of the semiconductor device according to any one of the first and third to tenth examples.

Twelfth Example

Figure 33:
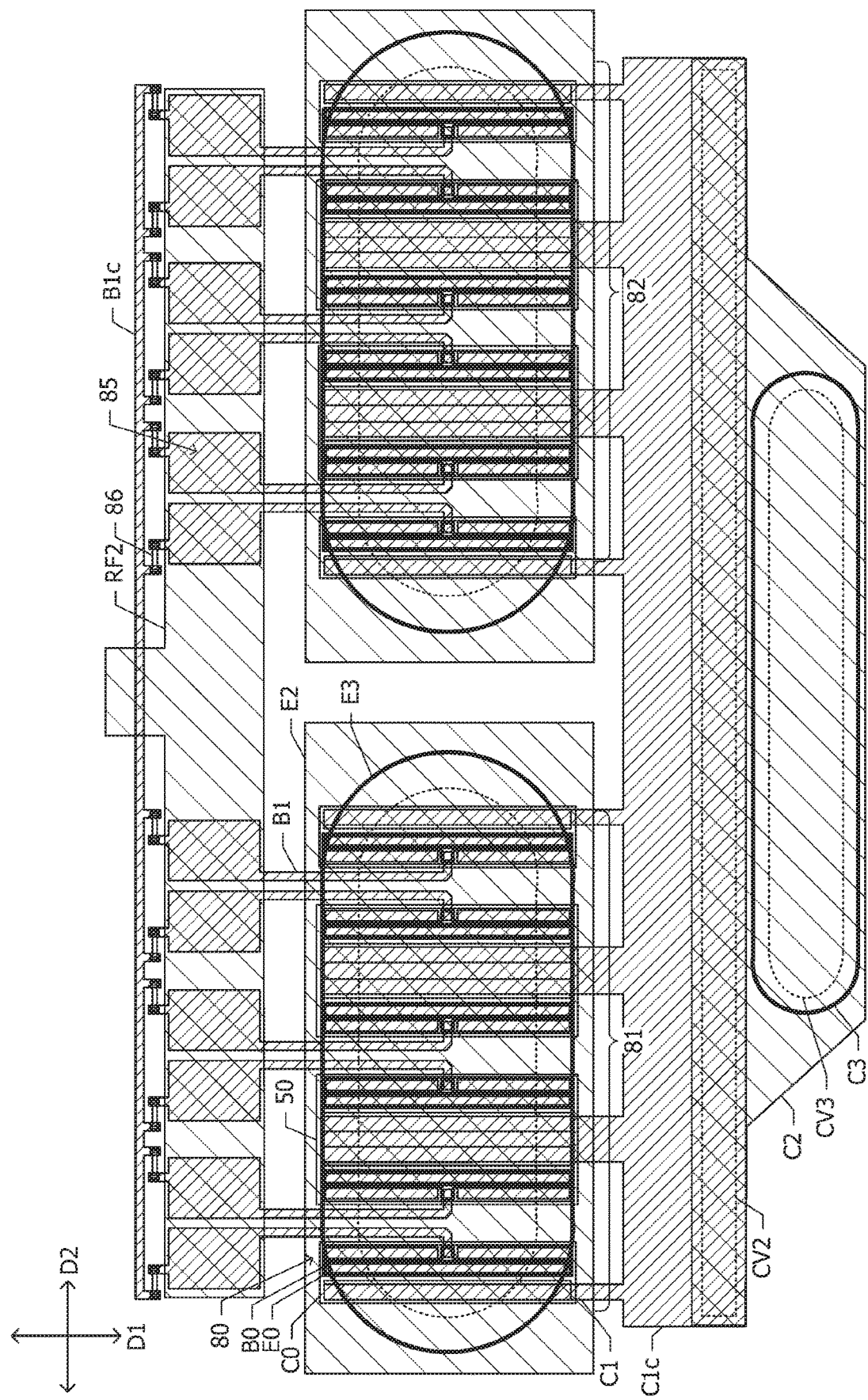
FIG. 33 illustrates a layout of constituent elements of a semiconductor device according to a twelfth example, with the semiconductor device being viewed in plan.

The following describes a semiconductor device according to a twelfth example with reference to FIG. 33. Configurations common to the semiconductor device according to the eleventh example (see FIGS. 31 and 32) and the semiconductor device according to the twelfth example will not be further elaborated here.

FIG. 33 illustrates a layout of constituent elements of the semiconductor device according to the twelfth example, with the semiconductor device being viewed in plan. In the eleventh example (see FIG. 31), the order in which the collector electrode C0, the emitter electrode E0, and the base electrode B0 of one of the cells 80 in a group are arranged in the second direction D2 and the order in which the corresponding electrodes of any other cell 80 in the group are the same. In the twelfth example, meanwhile, the collector electrode C0, the emitter electrode E0, and the base electrode B0 of one of two adjacent ones of the cells 80 are arranged in the second direction D2 in inverse order to those of the other cell. That is, the cells 80 adjacent to each other in the second direction D2 are arranged in mirror-image form in the second direction D2. For example, the collector electrode C0, the emitter electrode E0, and the base electrode B0 of each of the odd-numbered cells 80 counting from the left side of FIG. 33 are arranged in the stated order in the direction from left to right, and the collector electrode C0, the emitter electrode E0, and the base electrode B0 of each of the even-numbered cells 80 are arranged in the stated order in the direction from right to left.

The base electrode B0 of each of the odd-numbered cells 80 counting from the left side and the base electrode B0 of the cell 80 to the right are adjacent to each other. The collector electrode C0 of each of the even-numbered cells 80 counting from the left side and the collector electrode C0 of the cell 80 to the right are adjacent to each other. Two cells 80 whose collector electrodes C0 are adjacent to each other in the second direction D2 share the first-layer collector line C1 connected to the two adjacent collector electrodes C0.

In the eleventh example (see FIG. 31), two sub-collector layers 50 corresponding to two cells 80 adjacent to each other in the second direction D2 are separated from each other by the insulating region 71 (see FIGS. 2A and 2B). In the twelfth example, meanwhile, two cells 80 whose collector electrodes C0 are adjacent to each other in the second direction D2 are located within the sub-collector layer 50 common to the two cells 80 when viewed in plan. That is, two cells 80 whose collector electrodes C0 are adjacent to each other in the second direction D2 share one sub-collector layer 50. The sub-collector layer 50 shared by two cells satisfies the following condition: on the sub-collector layer 50, the collector electrode C0 is disposed on only one side in the second direction D2 with respect to the emitter electrode E0. Two sub-collector layers 50 corresponding to two cells 80 whose base electrodes B0 are adjacent to each other in the second direction D2 are separated from each other by insulating region 71 (see FIGS. 2A and 2B).

The following describes advantageous effects of the twelfth example.

As with the eleventh example, the twelfth example enables enlargement of the SOA and an increase in breakdown withstand voltage. One of the features of the twelfth example is that two cells 80 whose collector electrodes C0 are adjacent to each other in the second direction D2 share one sub-collector layer 50 and one collector line C1. This feature enables a reduction in the dimension of the semiconductor device in the second direction D2.

In each of the cells 80 in the twelfth example, the emitter line E1 is disposed between the first-layer base line B1 and the first-layer collector line C1. The emitter line E1 is connected to the ground. This configuration eliminates or reduces the possibility that the interference of radio-frequency signals will occur between the base line B1 and the collector line C1.

The following describes a modification of the twelfth example. In the twelfth example, two cells 80 whose collector electrodes C0 are adjacent to each other in the second direction D2 share one sub-collector layer 50 and one collector line C1. In the present modification, the two cells 80 may also share one collector electrode C0.

Thirteenth Example

Figure 34:
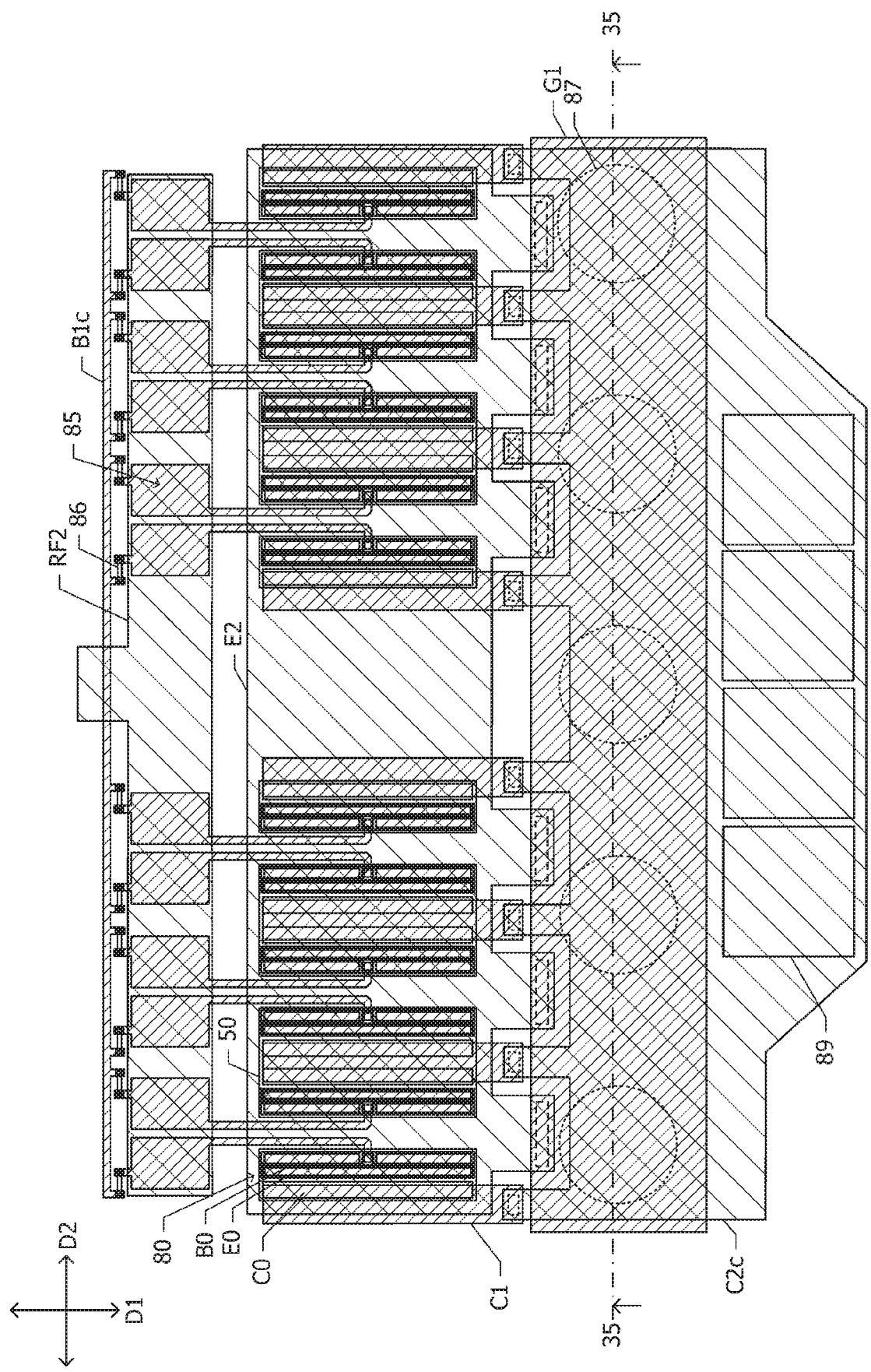
FIG. 34 illustrates a layout of constituent elements of a semiconductor device according to a thirteenth example, with the semiconductor device being viewed in plan.
Figure 35:
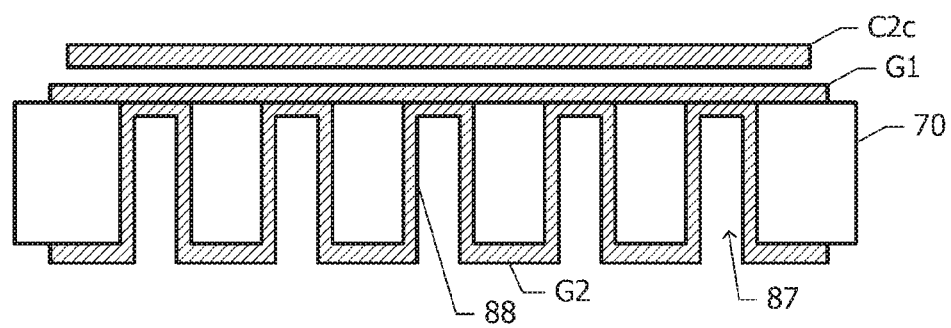
FIG. 35 is a sectional view of the semiconductor device taken along dash-dot line 35-35 in FIG. 34.
Figure 36:
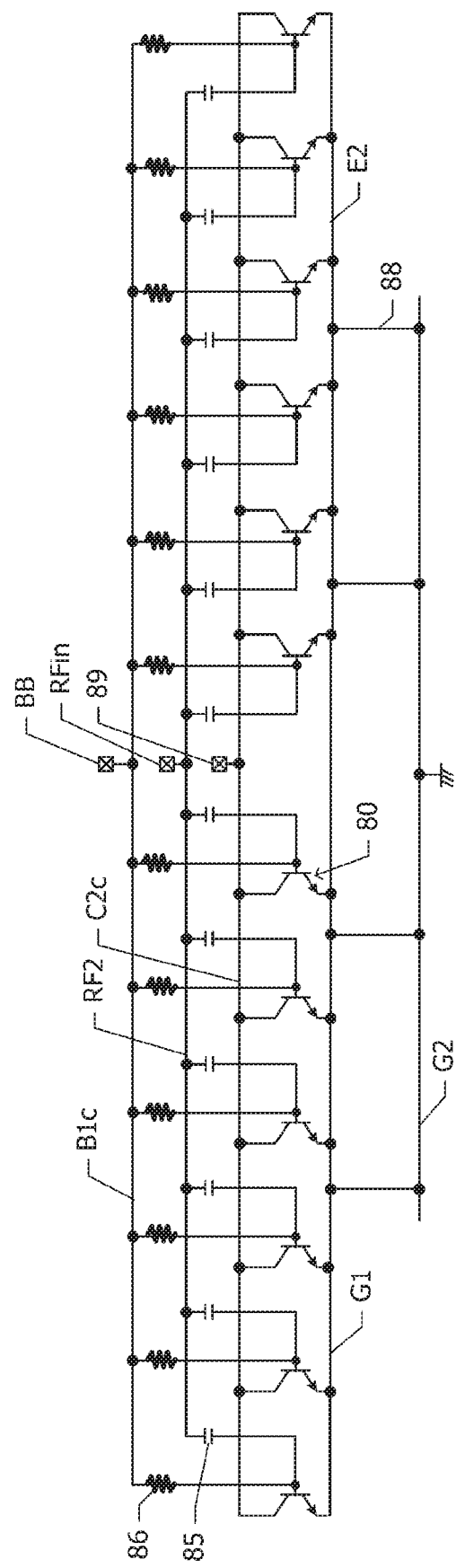
FIG. 36 is an equivalent circuit diagram of the semiconductor device according to the thirteenth example.

The following describes a semiconductor device according to a thirteenth example with reference to FIGS. 34, 35, and 36. Configurations common to the semiconductor device according to the twelfth example (see FIG. 33) and the semiconductor device according to the thirteenth example will not be further elaborated here.

FIG. 34 illustrates a layout of constituent elements of the semiconductor device according to the thirteenth example, with the semiconductor device being viewed in plan. FIG. 35 is a sectional view of the semiconductor device taken along dash-dot line 35-35 in FIG. 34. In the twelfth example (FIG. 33), the emitter bumps E3 and the collector bump C3 are used as terminals for external connection. In the semiconductor device according to the thirteenth example, meanwhile, a pad for wire bonding or the like is used as a terminal for external connection.

The following specifically describes the structure of the semiconductor device according to the thirteenth example. The second-layer emitter line E2 is disposed in such a manner that the emitter electrodes E0 of the cells 80 are located within the second-layer emitter line E2 when viewed in plan. A first-layer ground line G1 is disposed on one side in the first direction D1 with respect to a row of the cells 80. The first-layer ground line G1 and the second-layer emitter line E2 partially overlap each other when viewed in plan. In the overlapping regions, the first-layer ground line G1 and the second-layer emitter line E2 are connected to each other.

A second-layer collector common line C2c partially overlaps the first-layer ground line G1 when viewed in plan. The second-layer collector common line C2c partially overlaps each of the first-layer collector lines C1 when viewed in plan. In the overlapping regions, the second-layer collector common line C2c is connected to the collector lines C1.

A plurality of via holes 87 are located within the first-layer ground line G1 when viewed in plan. The via holes 87 extend from the ground line G1 to a back surface of the substrate 70 (see FIG. 35). The ground line G1 is exposed at bottom faces of the via hole 87. A conductor film is formed on the back surface of the substrate 70 and on side faces and the bottom faces of the via holes 87 by means of the plating method. The conductor film includes: a ground conductor G2, which covers the back surface of the substrate 70; and conductor portions 88, which cover the side faces and the bottom faces of the via holes 87. The ground conductor G2 is electrically connected to the ground line G1 via the conductor portions 88 in the via holes 87. The ground conductor G2 on the back surface is soldered to a ground terminal of the mounting substrate, and the semiconductor device is fixed to the mounting substrate accordingly.

The second-layer collector common line C2c is covered with a protective film (not illustrated). The protective film has cavities, in which the collector common line C2c is exposed and is used as a collector terminal (collector pad) 89 for external connection.

FIG. 36 is an equivalent circuit diagram of the semiconductor device according to the thirteenth example. Emitters of bipolar transistors of the cells 80 are connected to the ground line G1. The ground line G1 is connected to the ground conductor G2 on the back surface via the conductor portions 88 in the via holes 87. The ground conductor G2 is connected to the ground of the mounting substrate. Collectors of the bipolar transistors of the cells 80 are connected to the collector terminal 89 via the collector common line C2c. Connections associated with bases of the bipolar transistors of the cells 80 are as described in the eleventh example (see FIG. 32).

The following describes advantageous effects of the thirteenth example. In the thirteenth example, the collector electrode C0 is disposed on only one side in the second direction with respect to the emitter electrode E0, and the operating current is thus directed from only one side to the other side in the second direction, as in the twelfth example. The thirteenth example thus produces the advantageous effect of increasing the breakdown withstand voltage.

The following describes a modification of the thirteenth example. As with the cells 80 in the twelfth example, the cells 80 in the thirteenth example are arranged in such a manner that the adjacent cells 80 in the midsection of a row of cells are spaced further apart than the rest of the adjacent cells 80 are. Alternatively, the spacing between the adjacent cells 80 in the midsection may be equal to the spacing between the rest of the adjacent cells 80.

Fourteenth Example

Figure 37:
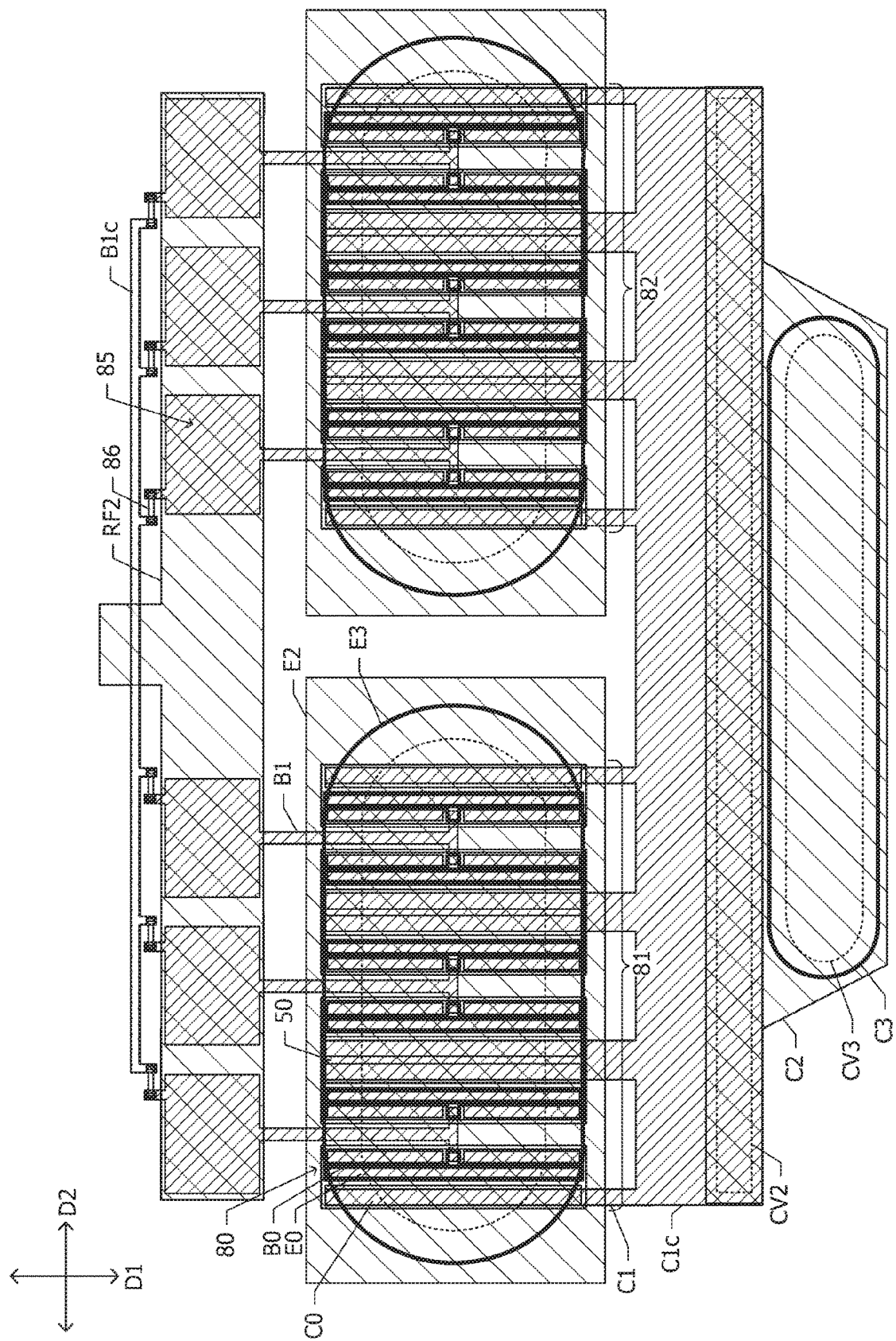
FIG. 37 illustrates a layout of constituent elements of a semiconductor device according to a fourteenth example, with the semiconductor device being viewed in plan.
Figure 38:
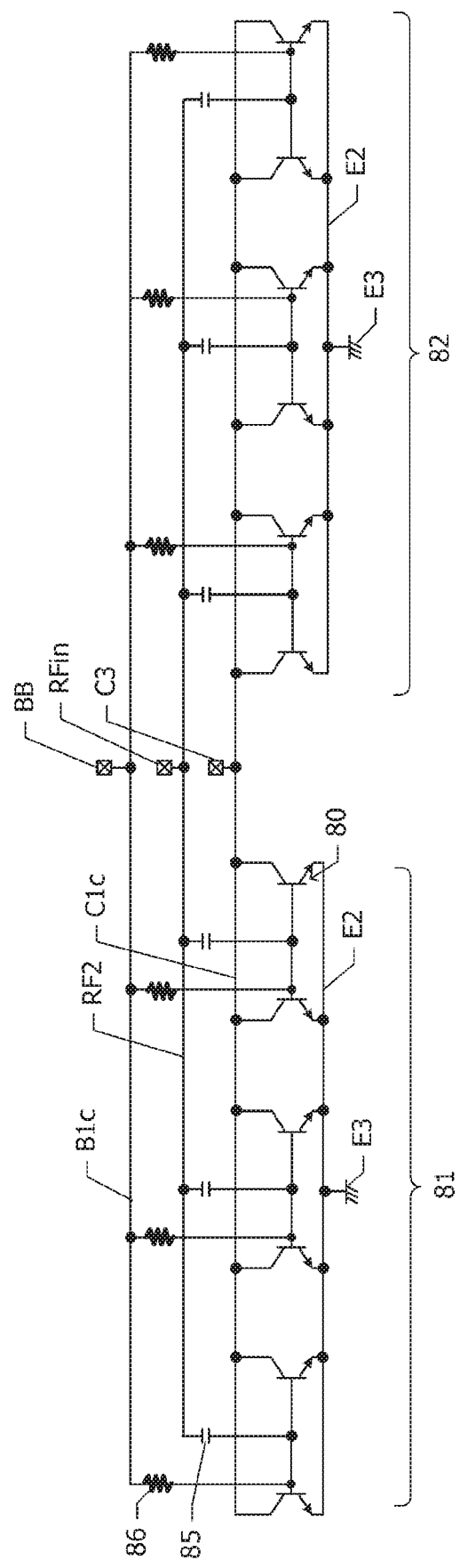
FIG. 38 is an equivalent circuit diagram of the semiconductor device according to the fourteenth example.

The following describes a semiconductor device according to a fourteenth example with reference to FIGS. 37 and 38. Configurations common to the semiconductor device according to the twelfth example (see FIG. 33) and the semiconductor device according to the twelfth example will not be further elaborated here.

FIG. 37 illustrates a layout of constituent elements of the semiconductor device according to the fourteenth example, with the semiconductor device being viewed in plan. In the twelfth example (see FIG. 33), two cells 80 whose base electrodes B0 are adjacent to each other are provided with their respective first-layer base lines B1. In the fourteenth example, meanwhile, two adjacent ones of the cells 80 share part of one first-layer base line B1. More specifically, two cells 80 whose collector electrodes C0 are located on outer sides with respect to their respective base electrodes B0 share part of one base line B1.

The following describes a configuration of the first-layer base line B1. The base line B1 includes portions extending out from two corresponding cells 80 whose collector electrodes C0 are located on outer sides with respect to their respective base electrodes B0. The portions respectively extend toward one side and the other side in the second direction D2 in a manner so as to come close to each other. The portions of the base line B1 that extend out in the second direction D2 are referred to as first portions. The first portions of the base line B1 that respectively extend out from the two corresponding cells 80 are linked to each other. Another portion of the base line B1 extends in the first direction D1 from the midsection of the part composed of the first portions linked to each other. The portion extending in the first direction D1 is herein referred to as a second portion. The second portion included in the base line B1 and extending in the first direction D1 is shared by the cells 80 located on opposite sides with respect to the base line B1.

With each of the base lines B1 being shared by two cells 80, each of the input capacitive elements 85 and each of the ballast resistance elements 86 are shared by two cells 80 correspondingly.

FIG. 38 is an equivalent circuit diagram of the semiconductor device according to the fourteenth example. Bases of adjacent ones of the cells 80 are connected to each other, and two cells 80 are connected with one input capacitive element 85 and one ballast resistance element 86.

The following describes advantageous effects of the fourteenth example. As with the twelfth example, the fourteenth example enables enlargement of the SOA and an increase in breakdown withstand voltage and eliminates or reduces the possibility that the interference of radio-frequency signals will occur between the base line B1 and the collector line C1. One of the features of the fourteenth example is that two cells 80 share the second portion of one first-layer base line B1. This feature enables a reduction in the dimension of the semiconductor device in the second direction D2.

Fifteenth Example

Figure 39:
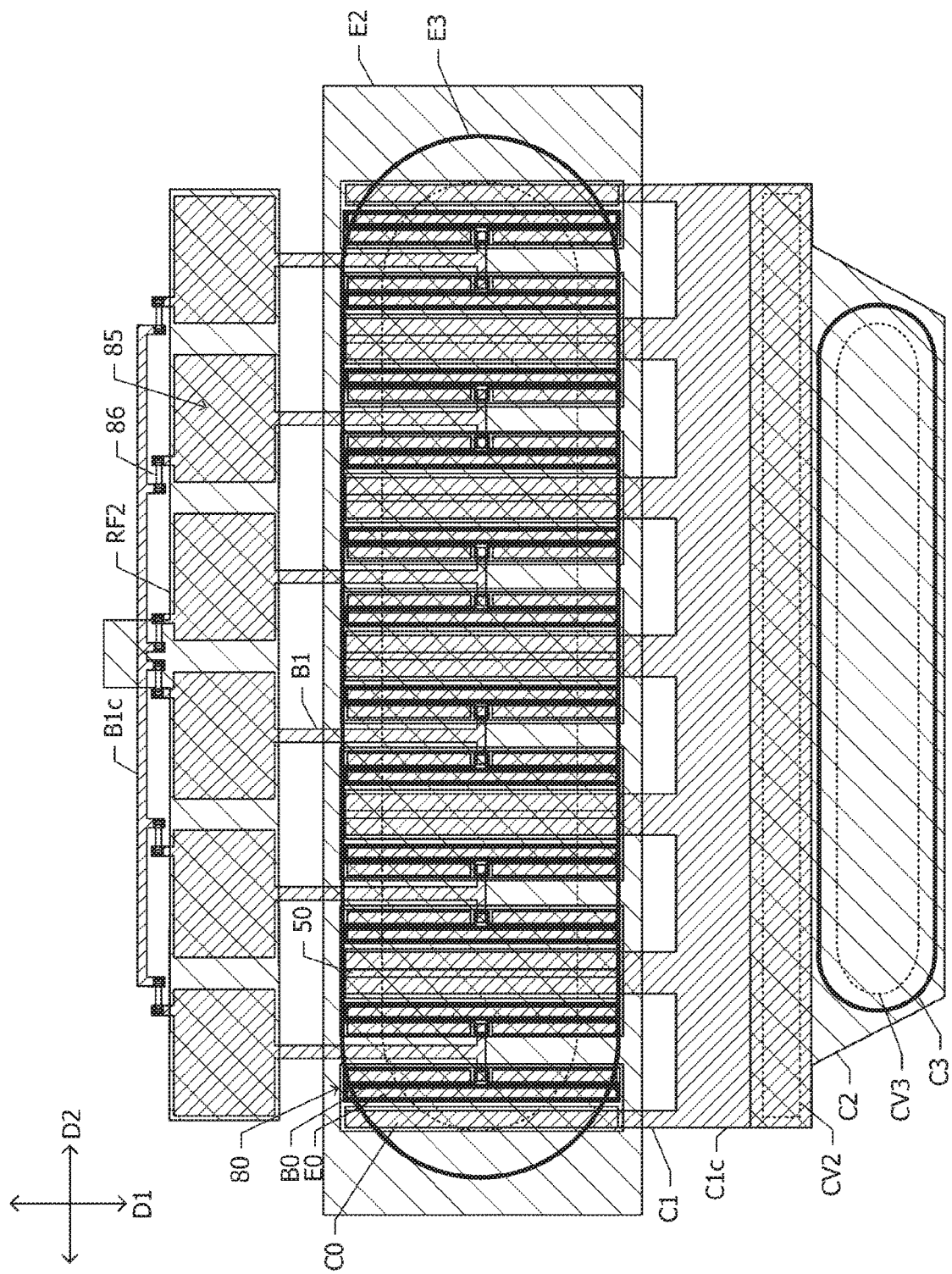
FIG. 39 illustrates a layout of constituent elements of a semiconductor device according to a fifteenth example, with the semiconductor device being viewed in plan.
Figure 40:
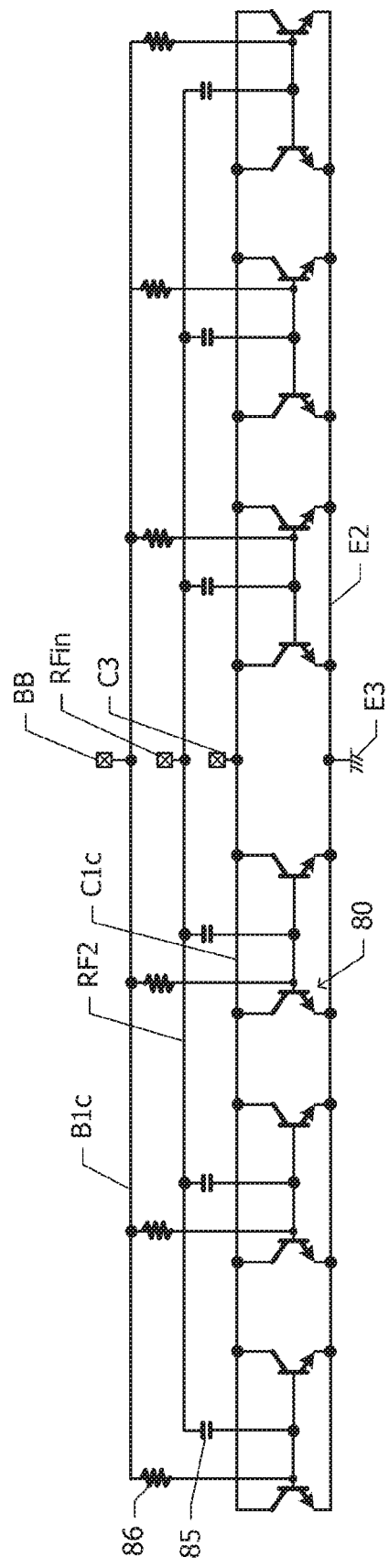
FIG. 40 is an equivalent circuit diagram of the semiconductor device according to the fifteenth example.

The following describes a semiconductor device according to a fifteenth example with reference to FIGS. 39 and 40. Configurations common to the semiconductor device according to the fourteenth example (see FIGS. 37 and 38) and the semiconductor device according to the fifteenth example will not be further elaborated here.

FIG. 39 illustrates a layout of constituent elements of the semiconductor device according to the fifteenth example, with the semiconductor device being viewed in plan. In the fourteenth example (see FIG. 37), one of the second-layer emitter lines E2 and one of the emitter bumps E3 are provided for the cells 80 belonging to the first group 81, and the other second-layer emitter line E2 and the other emitter bump E3 are provided for the cells 80 belonging to the second group 82. Meanwhile, one second-layer emitter line E2 and one emitter bump E3 in the fifteenth example are shared by all of the cells 80. The spacing between two cells 80 whose collector electrodes C0 are adjacent to each other in the midsection is equal to the spacing between two cells 80 whose collector electrodes C0 are adjacent to each other in a region other than the midsection.

FIG. 40 is an equivalent circuit diagram of the semiconductor device according to the fifteenth example. Emitters of bipolar transistors of the cells 80 are connected to the emitter line E2 shared by all of the cells 80. The emitter line E2 is connected with one emitter bump E3.

The following describes advantageous effects of the fifteenth example. As with the fourteenth example, the fifteenth example enables enlargement of the SOA and an increase in breakdown withstand voltage and eliminates or reduces the possibility that the interference of radio-frequency signals will occur between the base line B1 and the collector line C1. One of the features of the fifteenth example is that all of the cells 80 are connected to one emitter bump E3. This feature enables a reduction in the dimension of the semiconductor device in the second direction D2. It may be difficult to planarize the upper surface of the emitter bump E3 whose dimension in the second direction D2 is too large. There is a concern about the possibility that the yields in the process of mounting the semiconductor device will decline due to the reduction in the planarity of the upper surface of the emitter bump E3. As for cases where the planarity may be reduced to a significant degree, the emitter bump E3 is preferably divided as in the fourteenth example (see FIG. 37).

Sixteenth Example

Figure 41:
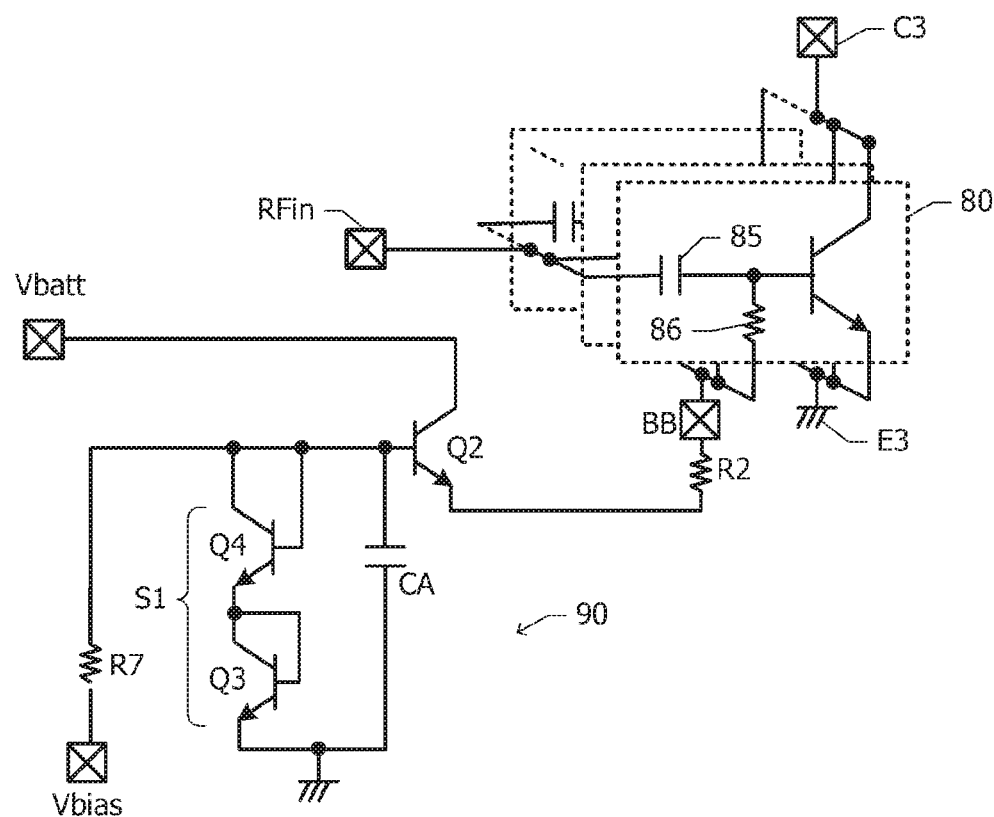
FIG. 41 is an equivalent circuit diagram of a semiconductor device according to a sixteenth example.
Figure 42:
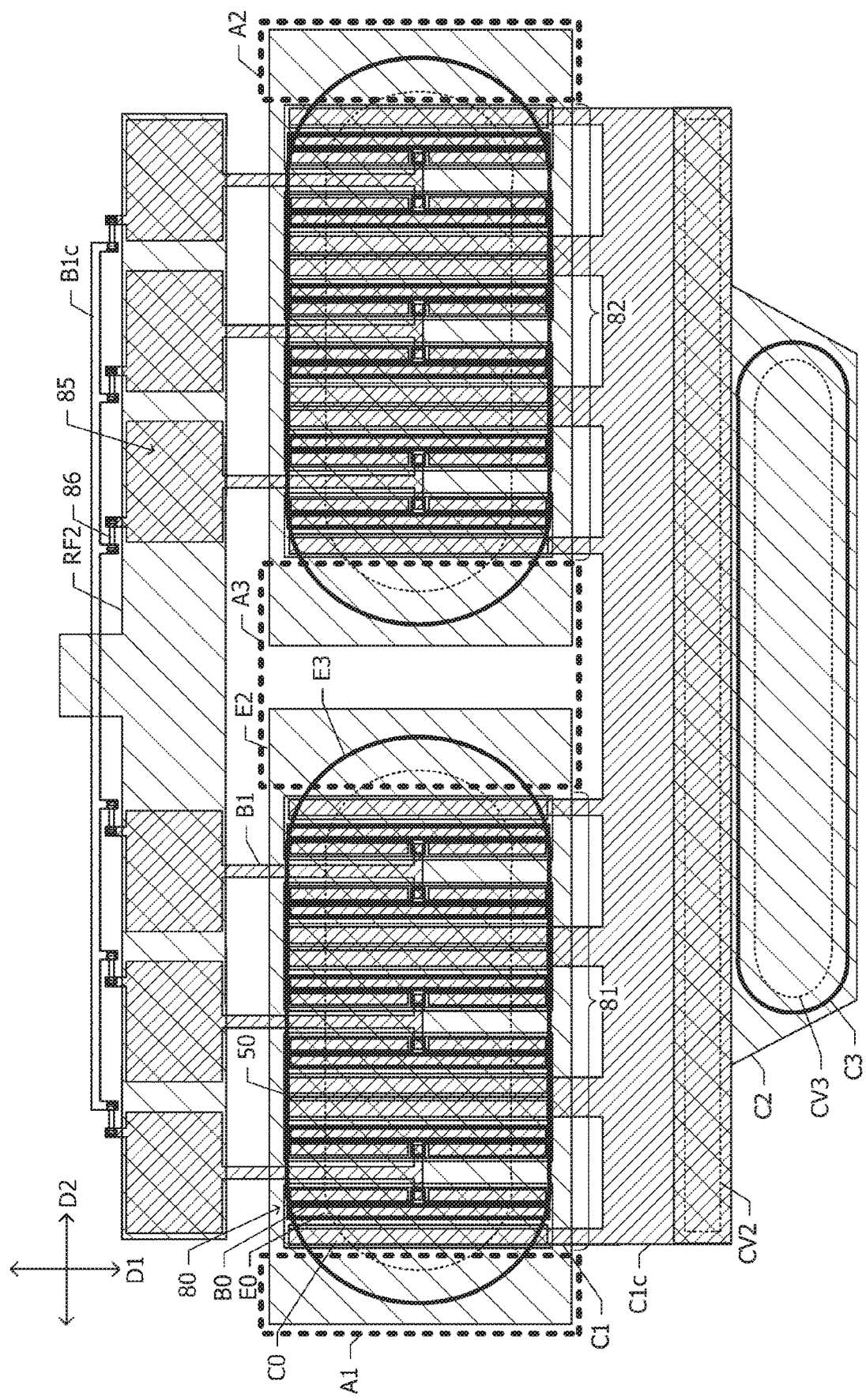
FIG. 42 illustrates a layout of constituent elements of the semiconductor device according to the sixteenth example, with the semiconductor device being viewed in plan.

The following describes a semiconductor device according to a sixteenth example with reference to FIGS. 41 and 42. Configurations common to the semiconductor device according to the eleventh example (see FIGS. 31 and 32) and the semiconductor device according to the sixteenth example will not be further elaborated here.

FIG. 41 is an equivalent circuit diagram of the semiconductor device according to the sixteenth example. The sixteenth example incorporates a bias circuit 90 into the configuration illustrated in the equivalent circuit diagram of the semiconductor device according to the eleventh example (see FIG. 32). The cells 80 are connected in parallel as in the eleventh example. Collectors of bipolar transistors of the cells 80 are connected to the collector bump C3, and emitters of the bipolar transistors are connected to the emitter bump E3. Bases of the bipolar transistors of the cells 80 are connected to the radio-frequency signal input terminal RFin via the input capacitive elements 85. The bases of the bipolar transistors are connected to the base bias terminal BB via the ballast resistance elements 86. The bias circuit 90 applies base bias voltage or current to the base bias terminal BB.

The following describes the configuration of the bias circuit 90. The bias circuit 90 includes a transistor Q2, which acts as an emitter follower transistor that applies base bias voltage or current to the cells 80. The transistor Q2 is, for example, an HBT. An emitter of the transistor Q2 is connected to the base bias terminal BB via a resistance element R2. A collector of the transistor Q2 is connected to a bias voltage terminal Vbatt.

A transistor Q3 and a transistor Q4 are connected in series to constitute a temperature characteristics compensation element S1. The transistors Q3 and Q4 are, for example, HBTs. Each of the transistors Q3 and Q4 is diode-connected to function as a diode. Specifically, the transistors Q3 and Q4 each have a collector and a base that are short-circuited. The base of the transistor Q4 and the base of the transistor Q2 are connected to each other to constitute a current mirror. The temperature characteristics compensation element S1 is close to the cells 80 to the extent of being affected by temperature variations in bipolar transistors of the cells 80.

A bias control terminal Vbias is connected to the ground via a resistance element R7 and the temperature characteristics compensation element S1. The voltage applied to the bias control terminal Vbias is divided by the resistance element R7 and the temperature characteristics compensation element S1 and applied to the base of the transistor Q2. The base of the transistor Q2 is connected to the ground via a bypass capacitive element CA.

The following describes the operation of the bias circuit 90. As the temperature of the transistor Q3 or Q4 varies, the value of the resistance of the temperature characteristics compensation element S1 varies. The voltage applied to the base of the transistor Q2 varies accordingly. Specifically, as the temperature of the temperature characteristics compensation element S1 rises, the temperature characteristics compensation element S1 reduces the voltage applied to the base of the transistor Q2. As the voltage applied to the base of the transistor Q2 is reduced, the current fed to bases of bipolar transistors of the cells 80 is reduced. That is, as the collector current (operating current) increases with rising temperatures of bipolar transistors of the cells 80, the temperature of the temperature characteristics compensation element S1 rises, and the base current fed to the bipolar transistors of the cells 80 is reduced accordingly. The increase in the collector current is suppressed due to the reduction of base current. The temperature characteristics compensation element S1 is thus capable of compensating for the temperature characteristics of the bipolar transistors of the cells 80.

FIG. 42 illustrates a layout of constituent elements of the semiconductor device according to the sixteenth example, with the semiconductor device being viewed in plan. The layout is identical to the layout of the constituent elements of the semiconductor device according to the fourteenth example (see FIG. 37). The spacing between a row of the cells 80 belonging to the first group 81 and a row of the cells 80 belonging to the second group is greater than the spacing between adjacent ones of the cells 80 belonging to the same group. The temperature characteristics compensation element S1 (see FIG. 41) is preferably as close as possible to the cells 80.

The first-layer collector lines C1 are disposed in one of the regions that adjoin the cells 80 in the first direction D1, and the first-layer base lines B1 are disposed in the other region. It is thus difficult to dispose the temperature characteristics compensation element S1 in either of these regions. There is not enough space left between adjacent ones of the cells 80 in the same group to mount the temperature characteristics compensation element S1. The temperature characteristics compensation element S1 is thus disposed in a region A1, A2, or A3. The regions A1 and A2 are close to corresponding ends of the row of the cells 80. The region A3 is located between the row of the cells 80 belonging to the first group 81 and the row of the cells 80 belonging to the second group 82.

The following describes advantageous effects of the sixteenth example. The temperature characteristics compensation element S1 in the sixteenth example is close to the cells 80. Owing to this feature, the temperature of the temperature characteristics compensation element S1 varies in a manner so as to efficiently reflect temperature variations in the heat generation regions of the bipolar transistors of the cells 80. Consequently, the effect of compensating for the temperature characteristics may be enhanced.

The following describes modifications of the sixteenth example with reference to FIGS. 43A to 43D.

Figure 43A:
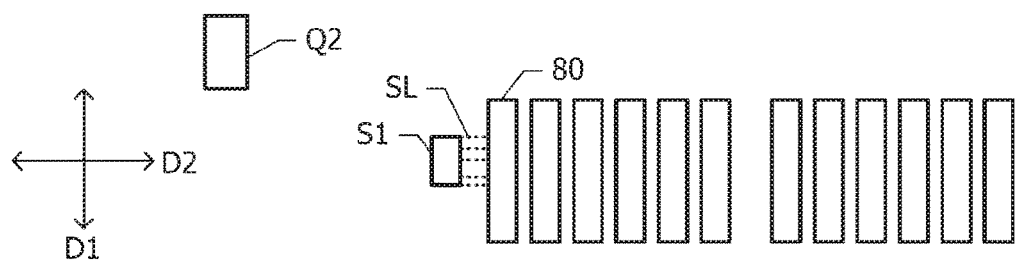
FIG. 43A is a diagram of a semiconductor device according to a modification of the sixteenth example, schematically illustrating planar positional relationship between each cell, and a temperature characteristics compensation element and a transistor that are included in a bias circuit.

FIG. 43A is a diagram of a semiconductor device according to a modification of the sixteenth example, schematically illustrating planar positional relationship between each cell 80, and the temperature characteristics compensation element S1 and the transistor Q2 that are included in the bias circuit 90. The temperature characteristics compensation element S1 and the cell 80 closer than any other cell 80 to the temperature characteristics compensation element S1 are adjacent to each other with no electronic element and no wiring therebetween. For example, straight lines SL, which connect the cell 80 concerned and the temperature characteristics compensation element S1 to each other in the shortest distance when viewed in plan, does not intersect other electronic elements or wiring connected directly to neither the cell 80 nor the temperature characteristics compensation element S1 (hereinafter referred to as indirect connection lines).

In the layout illustrated in FIG. 43A, the temperature characteristics compensation element S1 is disposed within a region over which the cells 80 extend in the first direction DE The straight lines SL that connect the temperature characteristics compensation element S1 and the cell 80 to each other in the shortest distance are parallel to the second direction D2 and are beyond count. None of the countless straight lines SL intersects the indirect connection lines or other electronic elements.

Figure 43B:
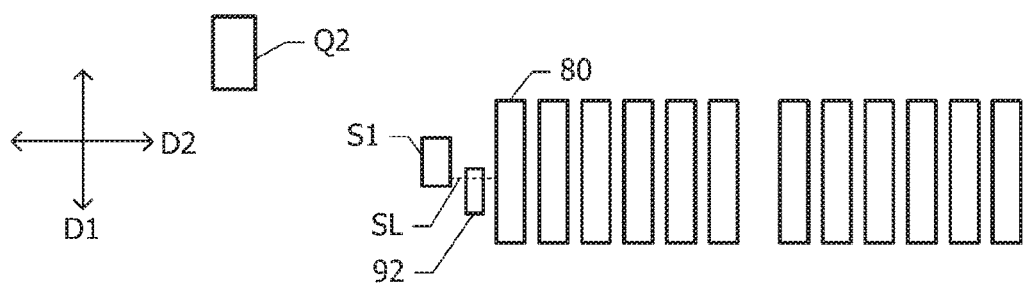
FIG. 43B is a diagram of a semiconductor device according to a comparative example, schematically illustrating planar positional relationship between each cell, and a temperature characteristics compensation element and a transistor that are included in a bias circuit.
Figure 43C:
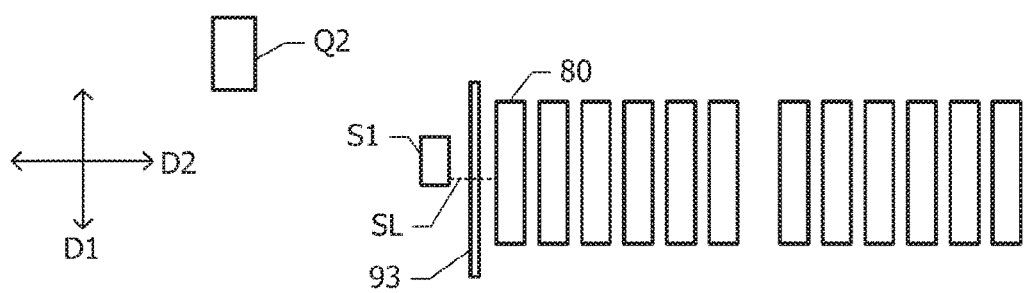
FIG. 43C is a diagram of a semiconductor device according to another comparative example, schematically illustrating planar positional relationship between each cell, and a temperature characteristics compensation element and a transistor that are included in a bias circuit.

FIGS. 43B and 43C are diagrams of semiconductor devices according to comparative examples, each schematically illustrating planar positional relationship between each cell 80, and the temperature characteristics compensation element S1 and the transistor Q2 that are included in the bias circuit 90. The straight line SL in the comparative example illustrated in FIG. 43B intersects an electronic element 92. The straight line SL in the comparative example illustrated in FIG. 43C intersects an indirect connection line 93. That is, the electronic element 92 or the indirect connection line 93 is located between the temperature characteristics compensation element S1 and the cell 80 that is closer than any other cell 80 to the temperature characteristics compensation element S1. Such a layout makes it difficult to bring the temperature characteristics compensation element S1 and the cell 80 close to each other.

The layout illustrated in FIG. 43A, in which neither the electronic element 92 nor the indirect connection line 93 is disposed between the temperature characteristics compensation element S1 and the cell 80 concerned, enables the temperature characteristics compensation element S1 to be adjacent to the cells 80.

Figure 43D:
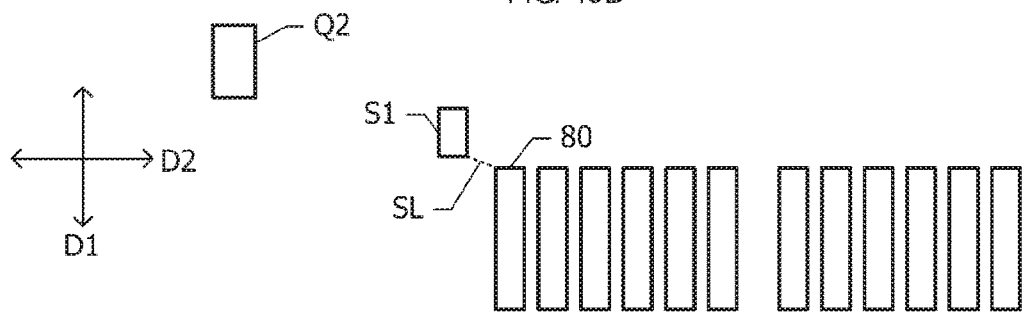
FIG. 43D is a diagram of a semiconductor device according to another modification of the sixteenth example, schematically illustrating planar positional relationship between each cell, and a temperature characteristics compensation element and a transistor that are included in a bias circuit.

FIG. 43D is a diagram of a semiconductor device according to another modification of the sixteenth example, schematically illustrating planar positional relationship between each cell 80, and the temperature characteristics compensation element S1 and the transistor Q2 that are included in the bias circuit 90. The temperature characteristics compensation element S1 in the present modification is disposed outside a region over which the cells 80 are arranged in the second direction D2. The straight line SL that connects the temperature characteristics compensation element S1 and the cell 80 to each other in the shortest distance forms an angle with the second direction D2. There is only one straight line SL. As long as the straight line SL in the present modification does not intersect other electronic elements or indirect connection lines, no electronic element and no indirect connection line are located between the temperature characteristics compensation element S1 and the cell 80 concerned.

The following describes other modifications of the sixteenth example.

The temperature characteristics compensation element S1 in the sixteenth example is adjacent to the cells 80. Alternatively, one of the transistors Q3 and Q4 constituting the temperature characteristics compensation element S1 may be adjacent to the cells 80. For example, either the transistor Q3 or Q4 in the sixteenth example illustrated in FIG. 42 may be disposed in the region A1, A2, or A3. As for the modifications respectively illustrated in FIGS. 43A and 43D, it is preferred that no electronic element and no indirect connection line be located between the transistor Q3 and the cell 80 closer than the other cells 80 to the transistor Q3 or between the transistor Q4 and the cell 80 closer than the other cells 80 to the transistor Q4.

Figure 44A:
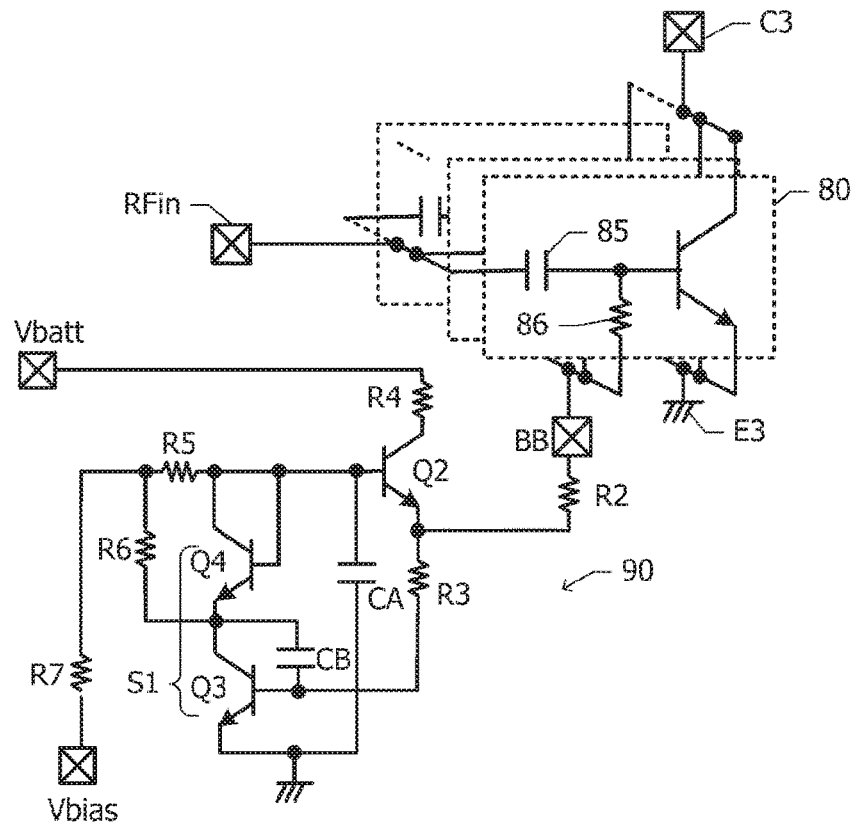
FIG. 44A is an equivalent circuit diagram of a semiconductor device according to still another modification of the sixteen example.
Figure 44B:
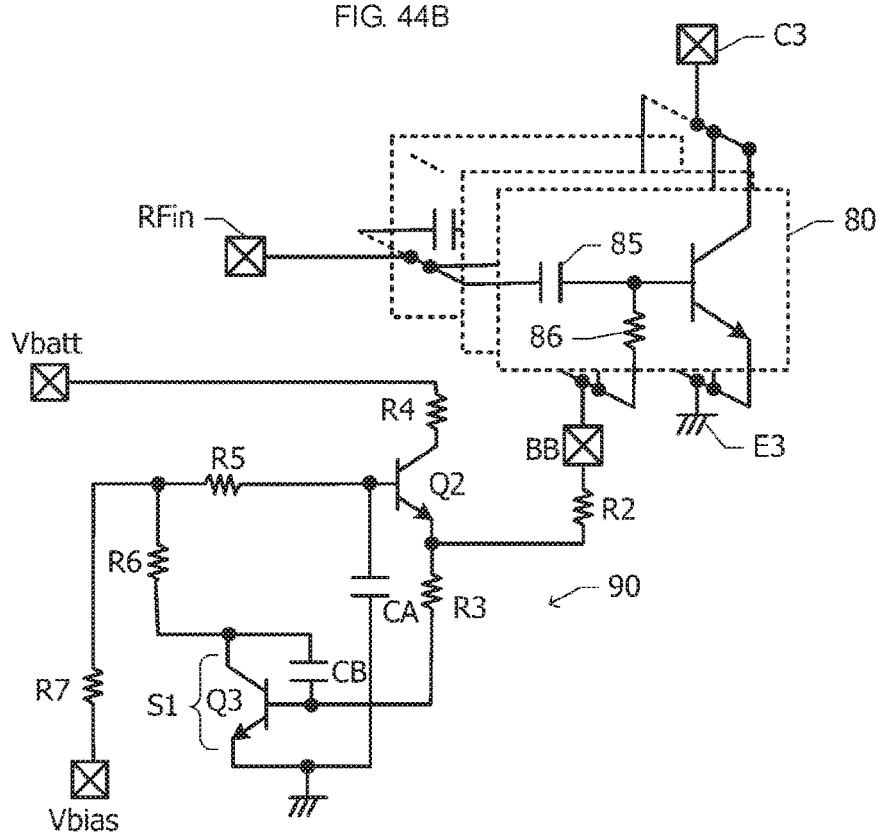
FIG. 44B is an equivalent circuit diagram of a semiconductor device according to still another modification of the sixteenth example.

The following describes other modifications of the sixteenth example with reference to FIGS. 44A and 44B. The difference between the semiconductor device according to the sixteenth example and the semiconductor device according to any of these modifications is in the configuration of the bias circuit 90.

FIGS. 44A and 44B are equivalent circuit diagrams of the semiconductor devices according to these modifications. In the modification illustrated in FIG. 44A, the transistors Q3 and Q4 connected in series function as the temperature characteristics compensation element S1. In the modification illustrated in FIG. 44B, the transistor Q3 functions as the temperature characteristics compensation element S1.

At least one of the transistors Q3 and Q4 in the modification illustrated in FIG. 44A is preferably adjacent to the cells 80 as in the sixteenth example. The transistor Q3 in the modification illustrated in FIG. 44B is preferably adjacent to the cells 80 as in the sixteenth example. As with the sixteenth example, the modifications respectively illustrated in FIGS. 44A and 44B can enhance the effect of compensating for the temperature characteristics.

Seventeenth Example

Figure 45A:
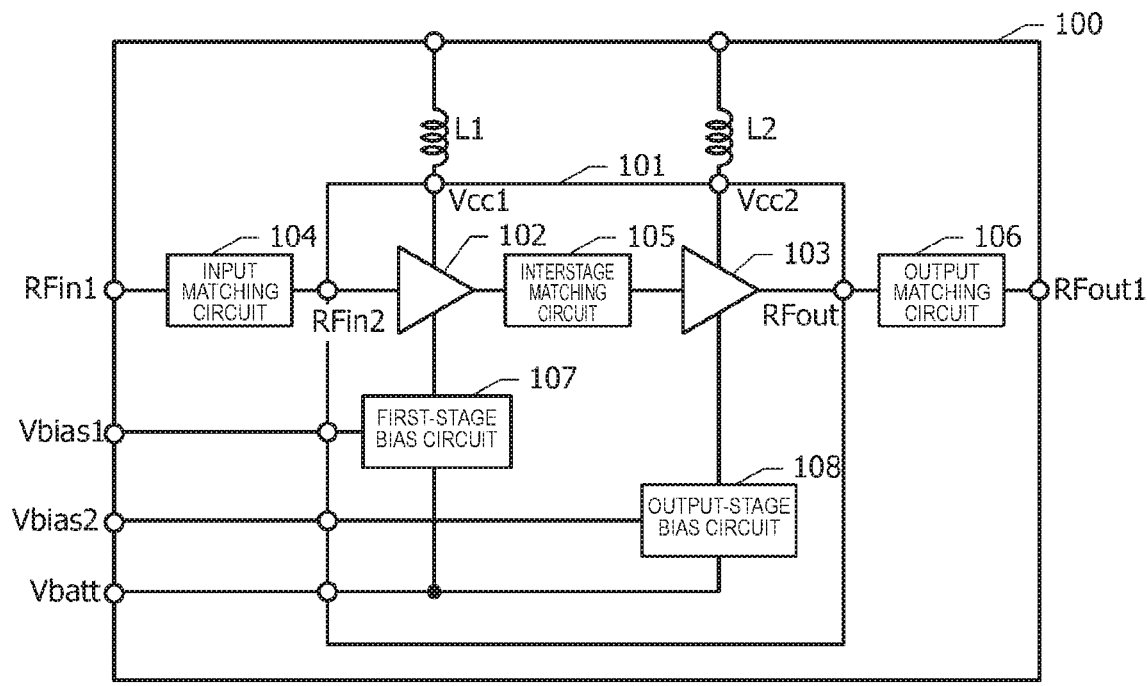
FIG. 45A is a block diagram of an amplifier module according to a seventeenth example.
Figure 45B:
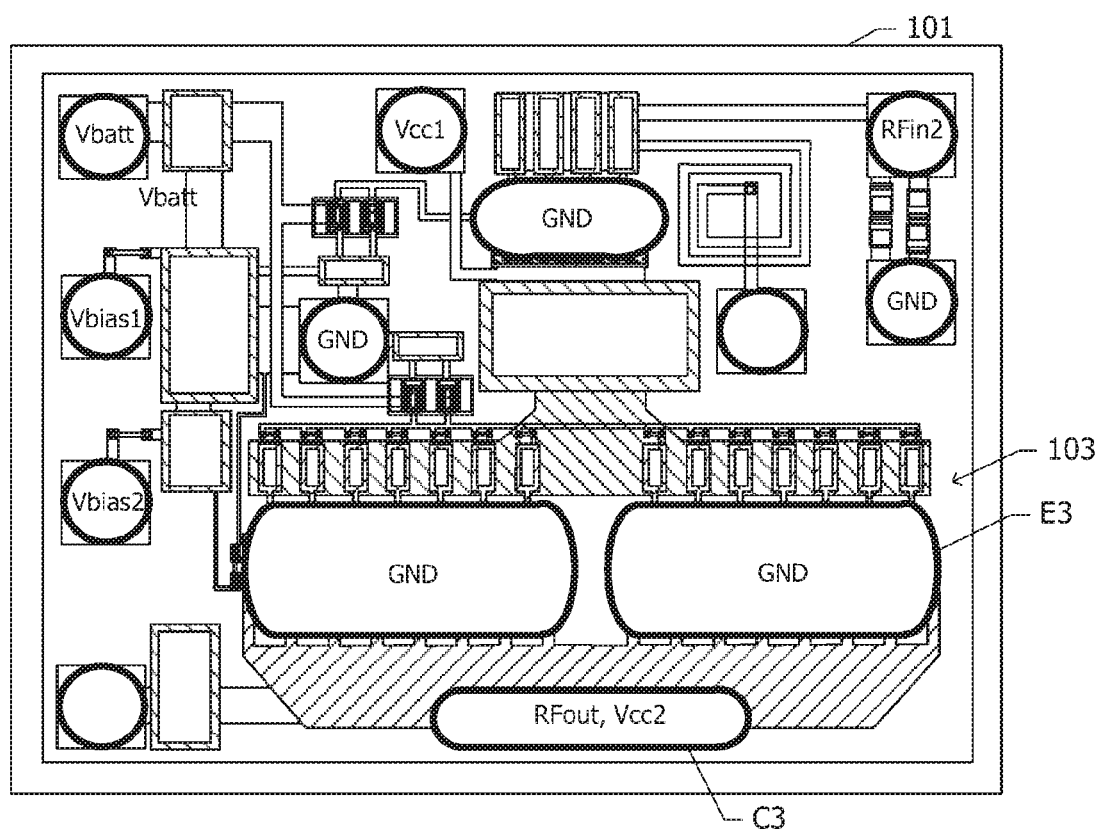
FIG. 45B illustrates a circuitry layout of a semiconductor device mounted on a module substrate of the amplifier module according to the seventeenth example.

The following describes an amplifier module according to a seventeenth example with reference to FIGS. 45A, 45B, and 46.

FIG. 45A is a block diagram of the amplifier module according to the seventeenth example. The amplifier module according to the seventeenth example includes a module substrate (mounting substrate) 100 and a semiconductor device 101, which is mounted on the module substrate 100.

The semiconductor device 101 includes a first-stage amplifier circuit 102, an interstage matching circuit 105, an output-stage amplifier circuit 103, a first-stage bias circuit 107, and an output-stage bias circuit 108. An input matching circuit 104, an output matching circuit 106, an inductor L1, and an inductor L2 are mounted on the module substrate 100. The semiconductor device according to the eleventh example (see FIGS. 31 and 32) is included as the output-stage amplifier circuit 103.

Radio-frequency signals are input to a radio-frequency signal input terminal RFin1 of the module substrate 100, and the radio-frequency signals are then input to a radio-frequency signal input terminal RFin2 of the semiconductor device 101 through the input matching circuit 104. The radio-frequency signals input to the radio-frequency signal input terminal RFin2 are then amplified by the first-stage amplifier circuit 102, and resultant signals flow through the interstage matching circuit 105 and are then input to the radio-frequency signal input terminal RFin (see FIG. 32) of the output-stage amplifier circuit 103. The radio-frequency signals are then amplified by the output-stage amplifier circuit 103 and resultant signals are output through a radio-frequency signal output terminal RFout, which corresponds to the collector bump C3 (see FIG. 32). The radio frequency signals output through the radio-frequency signal output terminal RFout flow through the output matching circuit 106 and are then output through a radio-frequency signal output terminal RFout1 of the module substrate 100.

Voltage for biasing is applied to the first-stage bias circuit 107 and the output-stage bias circuit 108 through the bias voltage terminal Vbatt. The first-stage bias circuit 107 applies bias voltage and current to the first-stage amplifier circuit 102 in accordance with a control signal input through a bias control terminal Vbias1. The output-stage bias circuit 108 applies bias voltage and current to the base bias terminal BB (see FIG. 32) of the output-stage amplifier circuit 103 in accordance with a control signal input through a bias control terminal Vbias2.

Direct-current power supply voltage applied through the inductor L1 is given to a power supply terminal Vcc1 of the first-stage amplifier circuit 102. Direct-current power supply voltage applied through the inductor L2 is given to a power supply terminal Vcc2 of the output-stage amplifier circuit 103. The power supply terminal Vcc2 corresponds to the collector bump C3 (see FIG. 32).

FIG. 45B illustrates a circuitry layout of the semiconductor device 101 mounted on the module substrate 100 (see FIG. 45A) of the amplifier module according to the seventeenth example. A plurality of bumps are disposed on a surface of the semiconductor device 101 in a manner so as to face the module substrate 100. The emitter bumps E3 (see, for example, FIGS. 31 and 32) of the output-stage amplifier circuit 103 are connected to the ground of the module substrate 100. The collector bump C3 (see FIGS. 31 and 32) of the output-stage amplifier circuit 103 corresponds to the power supply terminal Vcc2 and the radio-frequency signal output terminal RFout in FIG. 45A. The plurality of bumps also include the bias voltage terminal Vbatt, the bias control terminals Vbias1 and Vbias2, the power supply terminal Vcc1, the radio-frequency signal input terminal RFin2, and grounds GND.

FIG. 46 is a sectional view of the module substrate 100 and the semiconductor device 101 mounted thereon. The emitter bumps E3 disposed on the semiconductor device 101 are connected to a ground conductor 110 on a first surface of the module substrate 100 via solder 114. In addition to the semiconductor device 101, a plurality of surface-mount elements 113 are mounted on the first surface of the module substrate 100. A plurality of via conductors 111 extend from the ground conductor 110 on the first surface in the thickness direction. The via conductors 111 extend to a ground conductor 112 on a second surface opposite to the first surface. The emitter bumps E3 partially overlap the via conductors 111 when viewed in plan. The ground conductor 112 on the second surface is connected to ground of, for example, a motherboard. The ground of the motherboard or the like also functions as a heat sink.

The following describes advantageous effects of the seventeenth example.

The emitter bumps E3, the solder 114, the ground conductor 110, the via conductors 111, and the ground conductor 112 are heat transfer paths through which heat generated in the cells 80 (see FIGS. 31 and 32) included in the output-stage amplifier circuit 103 is conducted to the ground of the motherboard or the like. The emitter bumps E3 overlap the via conductors 111 when viewed in plan, and the thermal resistance in the heat transfer paths is reduced accordingly. Consequently, rises in the temperature of the cells 80 (see FIGS. 31 and 32) may be suppressed.

The amplifier circuit of the semiconductor device according to the eleventh example is included as the output-stage amplifier circuit 103, and effects identical to the advantageous effects of the eleventh example may thus be produced.

The following describes modifications of the seventeenth example. In the seventeenth example, the semiconductor device (see FIGS. 31 and 32) according to the eleventh example is included as the output-stage amplifier circuit 103. Alternatively, the semiconductor device according to any one of the twelfth to sixteenth examples or any one of the modifications thereof may be included as the output-stage amplifier circuit 103.

These examples are merely illustrative. Needless to say, partial replacements or combinations of configurations illustrated in different examples are possible. Not every example refers to actions and effects caused by similar configurations. Furthermore, the present disclosure is not intended to be limited to the above-described examples. For example, it will be obvious to those skilled in the art that various changes, improvements, combinations, and the like may be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
    a sub-collector layer that is provided in a surface layer portion of a substrate and is electrically conductive, the sub-collector layer being surrounded by an insulating region when viewed in plan;
    a bipolar transistor that is located within the sub-collector layer when viewed in plan, the bipolar transistor including a collector layer, a base layer, and an emitter layer that are arranged in a stated order in a thickness direction, the collector layer being connected to the sub-collector layer;
    an emitter electrode that is long in a first direction when viewed in plan, the emitter electrode overlapping the emitter layer and being electrically connected to the emitter layer;
    a base electrode that is long in the first direction when viewed in plan, the base electrode and the emitter electrode being discretely located away from each other in a second direction orthogonal to the first direction, the base electrode being electrically connected to the base layer;
    a collector electrode that is located on one side in the second direction with respect to the emitter electrode and is not located on the other side when viewed in plan, the collector electrode being electrically connected to the collector layer via the sub-collector layer; and
    a base line connected to the base electrode in a manner so as to adjoin a portion other than longitudinal ends of the base electrode.

2. The semiconductor device according to claim 1, wherein
    a distance in the first direction between a center of the base electrode in the first direction and a point of connection between the base electrode and the base line is less than or equal to ¼ times a length of the base electrode.

3. The semiconductor device according to claim 1, wherein
    the base line and the base electrode are connected to each other in at least two different positions in the first direction.

4. The semiconductor device according to claim 1, further comprising:
    a plurality of cells arranged side by side in the second direction, each of the cells including corresponding one of a plurality of the sub-collector layers, corresponding one of a plurality of the bipolar transistors, corresponding one of a plurality of the emitter electrodes, corresponding one of a plurality of the base electrodes, and corresponding one of a plurality of the collector electrodes; and
    an emitter bump that overlaps the emitter electrodes of the cells when viewed in plan, the emitter bump being electrically connected to the emitter electrodes of the cells.

5. The semiconductor device according to claim 4, further comprising:
a plurality of collector lines that are respectively connected to the collector electrodes of the cells and extend out from the collector electrodes in the first direction, wherein
the collector electrode, the emitter electrode, and the base electrode of one of two adjacent ones of the cells are arranged in the second direction in inverse order to the collector electrode, the emitter electrode, and the base electrode of the other cell, and
with the collector electrodes of two of the cells being adjacent to each other in the second direction, the two cells share a collector line that is one of the collector lines and connected to the collector electrodes of the two cells.

6. The semiconductor device according to claim 4, wherein
the base line includes first portions and a second portion, each of the first portions extending out in the second direction from a point of connection between the base line and corresponding one of the base electrodes, the second portion extending in the first direction from tips of the first portions, and
with two of the cells being adjacent to each other in the second direction in such a manner that corresponding ones of the collector electrodes are located on outer sides in the second direction with respect to corresponding ones of the base electrodes, the first portions of the base line respectively extend out from the corresponding ones of the base electrodes toward one side and another side in a manner so as to come close to each other, and the second portion of the base line is shared by the two cells.

7. The semiconductor device according to claim 1, wherein
the substrate is a (100)GaAs substrate,
the first direction is a [01-1] direction of the substrate,
the collector layer is a collector mesa disposed on the substrate and being mesa-shaped, and
when viewed in plan, the base line intersects an edge of the collector mesa parallel to the first direction and extends beyond the edge of the collector mesa.

8. The semiconductor device according to claim 1, wherein
the substrate is a (100)GaAs substrate,
the first direction is a [011] direction of the substrate,
the collector layer is included in a collector mesa disposed on the substrate and being mesa-shaped, and
when viewed in plan, the base line extends in the second direction from a point of connection between the base line and the base electrode, intersects an edge of the collector mesa parallel to the second direction, and extends beyond the edge of the collector mesa.

9. The semiconductor device according to claim 1, further comprising:
a ground line that is electrically connected to the emitter electrode and does not overlap the bipolar transistor when viewed in plan;
a via hole that is located within the ground line when viewed in plan, the via hole extending from the ground line to a back surface of the substrate;
a ground conductor disposed on a surface of the substrate opposite to another surface on which the bipolar transistor is disposed, the ground conductor being electrically connected to the ground line through the via hole; and
a collector common line electrically connected to the collector electrode, part of the collector common line serving as a common terminal for external connection.

10. The semiconductor device according to claim 1, further comprising:
a bias circuit disposed on the substrate and configured to apply base bias to the bipolar transistor, wherein
the bias circuit includes
an emitter follower transistor configured to apply base bias voltage or current to the bipolar transistor, and
a temperature characteristics compensation element configured to change magnitude of voltage applied to a base of the emitter follower transistor,
as a temperature of the temperature characteristics compensation element rises, the temperature characteristics compensation element reduces the voltage applied to the base of the emitter follower transistor, and
when the temperature characteristics compensation element and the bipolar transistor are viewed in plan, a straight line that connects the temperature characteristics compensation element and the bipolar transistor to each other in the shortest distance does not intersect other electronic elements or wiring connected directly to neither the temperature characteristics compensation element nor the bipolar transistor.

11. The semiconductor device according to claim 2, wherein
the base line and the base electrode are connected to each other in at least two different positions in the first direction.

12. The semiconductor device according to claim 2, further comprising:
a plurality of cells arranged side by side in the second direction, each of the cells including corresponding one of a plurality of the sub-collector layers, corresponding one of a plurality of the bipolar transistors, corresponding one of a plurality of the emitter electrodes, corresponding one of a plurality of the base electrodes, and corresponding one of a plurality of the collector electrodes; and
an emitter bump that overlaps the emitter electrodes of the cells when viewed in plan, the emitter bump being electrically connected to the emitter electrodes of the cells.

13. The semiconductor device according to claim 3, further comprising:
a plurality of cells arranged side by side in the second direction, each of the cells including corresponding one of a plurality of the sub-collector layers, corresponding one of a plurality of the bipolar transistors, corresponding one of a plurality of the emitter electrodes, corresponding one of a plurality of the base electrodes, and corresponding one of a plurality of the collector electrodes; and
an emitter bump that overlaps the emitter electrodes of the cells when viewed in plan, the emitter bump being electrically connected to the emitter electrodes of the cells.

14. The semiconductor device according to claim 5, wherein
the base line includes first portions and a second portion, each of the first portions extending out in the second direction from a point of connection between the base line and corresponding one of the base electrodes, the second portion extending in the first direction from tips of the first portions, and with two of the cells being adjacent to each other in the second direction in such a manner that corresponding ones of the collector electrodes are located on outer sides in the second direction with respect to corresponding ones of the base electrodes, the first portions of the base line respectively extend out from the corresponding ones of the base electrodes toward one side and another side in a manner so as to come close to each other, and the second portion of the base line is shared by the two cells.

15. The semiconductor device according to claim 2, wherein
the substrate is a (100)GaAs substrate,
the first direction is a [01-1] direction of the substrate,
the collector layer is a collector mesa disposed on the substrate and being mesa-shaped, and
when viewed in plan, the base line intersects an edge of the collector mesa parallel to the first direction and extends beyond the edge of the collector mesa.

16. The semiconductor device according to claim 3, wherein
the substrate is a (100)GaAs substrate,
the first direction is a [01-1] direction of the substrate,
the collector layer is a collector mesa disposed on the substrate and being mesa-shaped, and
when viewed in plan, the base line intersects an edge of the collector mesa parallel to the first direction and extends beyond the edge of the collector mesa.

17. The semiconductor device according to claim 2, wherein
the substrate is a (100)GaAs substrate,
the first direction is a [011] direction of the substrate,
the collector layer is included in a collector mesa disposed on the substrate and being mesa-shaped, and
when viewed in plan, the base line extends in the second direction from a point of connection between the base line and the base electrode, intersects an edge of the collector mesa parallel to the second direction, and extends beyond the edge of the collector mesa.

18. The semiconductor device according to claim 3, wherein
the substrate is a (100)GaAs substrate,
the first direction is a [011] direction of the substrate,
the collector layer is included in a collector mesa disposed on the substrate and being mesa-shaped, and
when viewed in plan, the base line extends in the second direction from a point of connection between the base line and the base electrode, intersects an edge of the collector mesa parallel to the second direction, and extends beyond the edge of the collector mesa.

19. The semiconductor device according to claim 2, further comprising:
a ground line that is electrically connected to the emitter electrode and does not overlap the bipolar transistor when viewed in plan;
a via hole that is located within the ground line when viewed in plan, the via hole extending from the ground line to a back surface of the substrate;
a ground conductor disposed on a surface of the substrate opposite to another surface on which the bipolar transistor is disposed, the ground conductor being electrically connected to the ground line through the via hole; and
a collector common line electrically connected to the collector electrode, part of the collector common line serving as a common terminal for external connection.

20. The semiconductor device according to claim 2, further comprising:
a bias circuit disposed on the substrate and configured to apply base bias to the bipolar transistor, wherein
the bias circuit includes
an emitter follower transistor configured to apply base bias voltage or current to the bipolar transistor, and
a temperature characteristics compensation element configured to change magnitude of voltage applied to a base of the emitter follower transistor,
as a temperature of the temperature characteristics compensation element rises, the temperature characteristics compensation element reduces the voltage applied to the base of the emitter follower transistor, and
when the temperature characteristics compensation element and the bipolar transistor are viewed in plan, a straight line that connects the temperature characteristics compensation element and the bipolar transistor to each other in the shortest distance does not intersect other electronic elements or wiring connected directly to neither the temperature characteristics compensation element nor the bipolar transistor.

* * * * *